(12) United States Patent
Yonemoto

(10) Patent No.: US 11,445,134 B2
(45) Date of Patent: Sep. 13, 2022

(54) SOLID-STATE IMAGING ELEMENT AND IMAGING DEVICE

(71) Applicant: SONY SEMICONDUCTOR SOLUTIONS CORPORATION, Kanagawa (JP)

(72) Inventor: Kazuya Yonemoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/042,087

(22) PCT Filed: Jan. 10, 2019

(86) PCT No.: PCT/JP2019/000551
§ 371 (c)(1),
(2) Date: Sep. 25, 2020

(87) PCT Pub. No.: WO2019/193800
PCT Pub. Date: Oct. 10, 2019

(65) Prior Publication Data
US 2021/0243393 A1    Aug. 5, 2021

(30) Foreign Application Priority Data
Apr. 4, 2018    (JP) .............................. JP2018-072657

(51) Int. Cl.
*H04N 5/355* (2011.01)
*H04N 5/361* (2011.01)
(Continued)

(52) U.S. Cl.
CPC ........... *H04N 5/3559* (2013.01); *H04N 5/361* (2013.01); *H04N 5/378* (2013.01); *H04N 5/37452* (2013.01)

(58) Field of Classification Search
CPC .. H04N 5/3559; H04N 5/361; H04N 5/37452; H04N 5/378; H01L 27/146
(Continued)

(56) References Cited

U.S. PATENT DOCUMENTS

2013/0256510 A1* 10/2013 Lyu .................... H04N 5/37457
250/206
2015/0312491 A1* 10/2015 Egawa ............... H04N 5/35563
348/223.1
(Continued)

FOREIGN PATENT DOCUMENTS

CN    107924931 A    4/2018
CN    108605107 A    9/2018
(Continued)

OTHER PUBLICATIONS

International Search Report and Written Opinion of PCT Application No. PCT/JP2019/000551, dated Mar. 12, 2019, 08 pages of ISRWO.

*Primary Examiner* — Lin Ye
*Assistant Examiner* — Chan T Nguyen
(74) *Attorney, Agent, or Firm* — Chip Law Group

(57) ABSTRACT

Provided is a high-sensitivity-side transfer transistor that transfers a charge from a high-sensitivity photodiode having a sensitivity higher than a predetermined sensitivity to a first charge storage unit. A low-sensitivity-side transfer transistor that transfers a charge from a low-sensitivity photodiode having a sensitivity lower than the predetermined sensitivity to a second charge storage unit. An amplification transistor that amplifies a voltage of the first charge storage unit. A first conversion efficiency control transistor that controls conversion efficiency of converting the charge to the voltage by opening and closing a pathway between the first and second charge storage units. A second conversion efficiency control transistor that controls the conversion efficiency by opening
(Continued)

and closing a pathway between the second charge storage unit and a third charge storage unit.

15 Claims, 39 Drawing Sheets

(51) Int. Cl.
*H04N 5/3745* (2011.01)
*H04N 5/378* (2011.01)

(58) Field of Classification Search
USPC .................................................... 348/216.1
See application file for complete search history.

(56) References Cited

U.S. PATENT DOCUMENTS

| | | | |
|---|---|---|---|
| 2016/0027824 A1* | 1/2016 | Kobayashi | ........ H01L 27/14603 |
| | | | 257/292 |
| 2018/0124335 A1 | 5/2018 | Machida et al. | |
| 2018/0249099 A1* | 8/2018 | Kobayashi | ........... H04N 5/3745 |

FOREIGN PATENT DOCUMENTS

| | | |
|---|---|---|
| JP | 2017-004985 A | 1/2017 |
| WO | 2015/068315 A1 | 5/2015 |
| WO | 2017/043343 A1 | 3/2017 |
| WO | 2017/141727 A1 | 8/2017 |
| WO | 2017/169216 A1 | 10/2017 |

* cited by examiner

FIG. 15

| INPUT OF CORRECTION PROCESSING UNIT | OUTPUT OF CORRECTION PROCESSING UNIT |
|---|---|
| Vsig1 | S1 = Vsig1 |
| Vsig2 | S2 = Vsig2 |
| Vsig3 | S3 = Vsig3 |
| Vsig4 | S4 = Vsig4 + Vsig3($CE_L / CE_M$) |

FIG. 17

| Vsig | PLACE TO STORE SIGNAL CHARGE | SENSITIVITY RATIO OF PHOTODIODE (312/311) | CONVERSION EFFICIENCY OF CONVERTING CHARGE TO VOLTAGE CE ($\mu V/e$) | SIGNAL CHARGE AMOUNT (NUMBER OF ELECTRONS) [e] |
|---|---|---|---|---|
| Vsig1 | PHOTODIODE 311 (HIGH-SENSITIVITY) | 1 | 150 (HIGH CONVERSION EFFICIENCY) | 0~5,000 |
| Vsig2 | PHOTODIODE 311 (HIGH-SENSITIVITY) | 1 | 30 (MODERATE CONVERSION EFFICIENCY) | 5,000~20,000 |
| Vsig3 | PHOTODIODE 312 (LOW-SENSITIVITY) | 0.1 | 30 (MODERATE CONVERSION EFFICIENCY) | 2,000~7,000 |
| Vsig4 | MC, TRANSISTOR 327, PHOTODIODE 312 | 0.1 | 5 (LOW CONVERSION EFFICIENCY) | 7,000~20,000 |

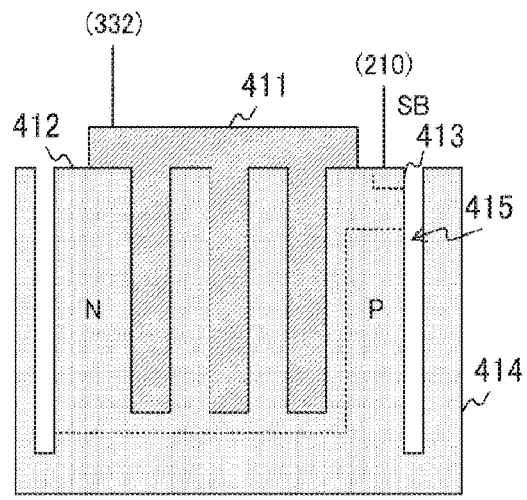
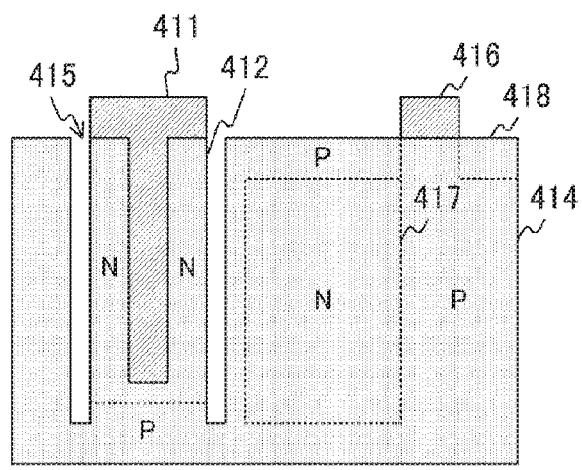
FIG. 18A                FIG. 18B
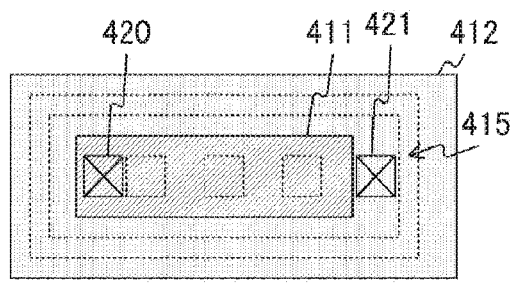
FIG. 18C

*FIG. 36*

| INPUT OF CORRECTION PROCESSING UNIT | OUTPUT OF CORRECTION PROCESSING UNIT |
| --- | --- |
| Vsig1 | S1=Vsig1 |
| Vsig2 | S2=Vsig2 |
| Vsig3 | S3=Vsig3 |
| Vsig4 | S4=Vsig4+Vsig3 |

FIG. 37

| Vsig | PLACE TO STORE SIGNAL CHARGE | SENSITIVITY RATIO OF PHOTODIODE (312/311) | CONVERSION EFFICIENCY OF CONVERTING CHARGE TO VOLTAGE CE (μV/e) | SIGNAL CHARGE AMOUNT (NUMBER OF ELECTRONS) [e] |
|---|---|---|---|---|
| Vsig1 | PHOTODIODE 311 (HIGH-SENSITIVITY) | 1 | 150 (HIGH CONVERSION EFFICIENCY) | 0~5,000 |
| Vsig2 | PHOTODIODE 311 (HIGH-SENSITIVITY) | 1 | 30 (MODERATE CONVERSION EFFICIENCY) | 5,000~20,000 |
| Vsig3 | PHOTODIODE 312 (LOW-SENSITIVITY) | 0.1 | 5 (LOW CONVERSION EFFICIENCY) | 2,000~7,000 |
| Vsig4 | MC, PHOTODIODE 312 | 0.1 | 5 (LOW CONVERSION EFFICIENCY) | 7,000~20,000 |

SOLID-STATE IMAGING ELEMENT AND IMAGING DEVICE

CROSS REFERENCE TO RELATED APPLICATIONS

This application is a U.S. National Phase of International Patent Application No. PCT/JP2019/000551 filed on Jan. 10, 2019, which claims priority benefit of Japanese Patent Application No. JP 2018-072657 filed in the Japan Patent Office on Apr. 4, 2018. Each of the above-referenced applications is hereby incorporated herein by reference in its entirety.

TECHNICAL FIELD

The present technology relates to a solid-state imaging element and an imaging device. More particularly, the present technology relates to a solid-state imaging element and an imaging device that capture image data with expanded dynamic range.

BACKGROUND ART

In the past, solid-state imaging elements provided with two photodiodes having different sensitivities for each pixel have been used to capture images with high dynamic range. For example, a solid-state imaging element has been proposed in which two photodiodes having different sensitivities, two transfer transistors, two switching transistors, an amplification transistor, a reset transistor, and a select transistor are disposed for every pixel (for example, see Patent Document 1).

In the solid-state imaging element, a floating diffusion that stores charge is divided into three regions. Of these three regions, two are connected to respectively different transfer transistors, and these transfer transistors transfer a charge from respectively different photodiodes. Additionally, by separately having the two switching transistors open and close two pathways between the three regions, the conversion efficiency of converting charge to voltage can be changed in three stages. In other words, if only one of the two switching transistors is switched on, charge is stored in two of the three regions, and the conversion efficiency is moderate. If both of the two switching transistors are switched on, charge is stored in all three of the regions, and the conversion efficiency is minimized. If both of the two switching transistors are switched off, charge is stored in only one of the three regions, and the conversion efficiency is maximized.

CITATION LIST

Patent Document

Patent Document 1: WO 2017/169216 A

SUMMARY OF THE INVENTION

Problems to be Solved by the Invention

In the related technology described above, a plurality of pixel signals is generated by the three-stage conversion efficiency, and by combining these pixel signals, the dynamic range of the image data can be expanded. However, in the solid-state imaging element described above, when transferring charge from the low-sensitivity photodiode, it is necessary to switch on both two of the switching transistors because of the connection configuration, and there is a problem in that the conversion efficiency at this time is locked to a minimum value.

The present technology has been devised in light of such circumstances, and an object thereof is to improve the conversion efficiency of converting charge to voltage in a solid-state imaging element that stores charge in a charge storage unit.

Solutions to Problems

The present technology is provided to solve the above problems, and a first aspect of the present technology is a solid-state imaging element including a high-sensitivity-side transfer transistor configured to transfer a charge from a high-sensitivity photodiode having a sensitivity higher than a predetermined sensitivity to a first charge storage unit, a low-sensitivity-side transfer transistor configured to transfer a charge from a low-sensitivity photodiode having a sensitivity lower than the predetermined sensitivity to a second charge storage unit, an amplification transistor configured to amplify a voltage of the first charge storage unit, a first conversion efficiency control transistor configured to control a conversion efficiency of converting the charge to the voltage by opening and closing a pathway between the first and second charge storage units, and a second conversion efficiency control transistor configured to control the conversion efficiency by opening and closing a pathway between the second charge storage unit and a third charge storage unit. This arrangement achieves an action whereby the conversion efficiency is controlled by the first and second conversion efficiency control transistors.

Further, in the first aspect, a select transistor configured to output a signal of the amplified voltage, and a driving circuit configured to drive each of the high-sensitivity-side transfer transistor, the low-sensitivity-side transfer transistor, the first and second conversion efficiency control transistors, and the select transistor may further be included. This arrangement achieves an action whereby the select transistor and the like are driven by the driving control circuit.

Further, in the first aspect, the driving circuit may cause the high-sensitivity-side transfer transistor to transfer the charge inside a period in which both the first and second conversion efficiency control transistors are switched off and also cause the select transistor to output a signal of the voltage as a first voltage signal. This arrangement achieves an action whereby the first voltage signal converted at the highest conversion efficiency is output.

Further, in the first aspect, the driving circuit may cause the high-sensitivity-side transfer transistor to transfer the charge inside a period in which the first conversion efficiency control transistor is switched on and the second conversion efficiency control transistor is switched off and also cause the select transistor to output a signal of the voltage as a second voltage signal. This arrangement achieves an action whereby the second voltage signal converted at moderate conversion efficiency is output.

Further, in the first aspect, the driving circuit may cause the low-sensitivity-side transfer transistor to transfer the charge inside a period in which the first conversion efficiency control transistor is switched on and the second conversion efficiency control transistor is switched off and also cause the select transistor to output a signal of the voltage as a third voltage signal. This arrangement achieves an action whereby the third voltage signal converted at moderate conversion efficiency is output.

Further, in the first aspect, the driving circuit may cause the select transistor to output a signal of the voltage according to a charge overflowing from the high-sensitivity photodiode inside a period in which both the first and second conversion efficiency control transistors are switched on as a fourth voltage signal. This arrangement achieves an action whereby the fourth voltage signal converted at the lowest conversion efficiency is output.

Further, in the first aspect, the driving circuit may cause the fourth voltage signal to be output before causing the third voltage signal to be output. This arrangement achieves an action whereby the fourth voltage signal is output after the fourth voltage signal.

Further, in the first aspect, the driving circuit may supply, to the low-sensitivity-side transfer transistor, a readout pulse of middle potential between a predetermined potential and a high potential higher than the predetermined potential before causing the third and fourth voltage signals to be output. This arrangement achieves an action whereby charge is transferred by a readout pulse of medium potential.

Further, in the first aspect, a signal amount correction processing unit configured to execute a process of combining the third voltage signal and the fourth voltage signal as a signal amount correction process may further be included. This arrangement achieves an action whereby a pixel signal is generated through the combination of the third and fourth voltage signals.

Further, in the first aspect, a determination unit configured to determine whether or not an amount of light is less than a predetermined value on the basis of the first, second, and third voltage signals, an arithmetic mean processing unit configured to compute an arithmetic mean value of each of the fourth voltage signals output when the amount of light is less than the predetermined value, and a dark current correction processing unit configured to subtract a dark current according to the arithmetic mean value from the fourth voltage signal, and supply the subtracted result to the signal amount correction processing unit may further be included. This arrangement achieves an action where the dark current is corrected.

Further, in the first aspect, the third charge storage unit may be a capacitance of a metal-oxide-semiconductor (MOS) transistor having a gate connected to the second conversion efficiency control transistor and a source into which a predetermined source bias pulse is input, and the driving circuit may supply the source bias pulse higher than a predetermined potential outside a predetermined exposure period, and may supply the source bias pulse lower than the predetermined potential outside the predetermined exposure period. This arrangement achieves an action whereby the capacitance of the MOS capacitor is changed.

Further, in the first aspect, the gate of the MOS transistor may be embedded in a first trench formed in a predetermined substrate. This arrangement achieves an action whereby an increase in the area of the MOS transistor is suppressed.

Further, in the first aspect, in the predetermined substrate, the MOS transistor and at least one of the high-sensitivity photodiode or the low-sensitivity photodiode may be isolated from each other by a second trench. This arrangement achieves an action whereby the width of the dividing region is suppressed.

Further, in the first aspect, the high-sensitivity-side transfer transistor, the low-sensitivity-side transfer transistor, and the first and second conversion efficiency control transistors may be each respectively disposed in each of a plurality of pixel circuits arrayed in a two-dimensional matrix, and one of a pair of pixel circuits adjacent in a predetermined direction among the plurality of pixel circuits may be connected to a first signal line, while the other of the pair may be connected to a second signal line. This arrangement achieves an action whereby the signals from each of the pair of adjacent pixel circuits are output through the first and second signal lines.

Further, in the first aspect, a first analog-to-digital converter configured to convert a first analog signal to a digital signal, a second analog-to-digital converter configured to convert a second analog signal to a digital signal, a first switch configured to treat a signal from one of the first and second signal lines as the first analog signal and output the first analog signal to the first analog-to-digital converter, and a second switch configured to treat a signal from the other of the first and second signal lines as the second analog signal and output the second analog signal to the second analog-to-digital converter may further be included. This arrangement achieves an action whereby two rows are AD-converted at the same time.

Further, a second aspect of the present technology is an imaging device including a high-sensitivity-side transfer transistor configured to transfer a charge from a high-sensitivity photodiode having a sensitivity higher than a predetermined sensitivity to a first charge storage unit, a low-sensitivity-side transfer transistor configured to transfer a charge from a low-sensitivity photodiode having a sensitivity lower than the predetermined sensitivity to a second charge storage unit, an amplification transistor configured to amplify a voltage of the first charge storage unit, a first conversion efficiency control transistor configured to control a conversion efficiency of converting the charge to the voltage by opening and closing a pathway between the first and second charge storage units, a second conversion efficiency control transistor configured to control the conversion efficiency by opening and closing a pathway between the second charge storage unit and a third charge storage unit, and a signal processing unit configured to perform predetermined signal processing on a signal of the amplified voltage. This arrangement achieves an action whereby the conversion efficiency is controlled, and the signal processing is performed, by the first and second conversion efficiency control transistors.

Also, a third aspect of the present technology is a solid-state imaging element provided with a high-sensitivity-side transfer transistor that transfers a charge from a high-sensitivity photodiode having a sensitivity higher than a predetermined sensitivity to a first charge storage unit, a low-sensitivity-side transfer transistor that transfers a charge from a low-sensitivity photodiode having a sensitivity lower than the predetermined sensitivity to a second charge storage unit, an amplification transistor that amplifies the voltage of the first charge storage unit, and first and second conversion efficiency control transistors connected in series between the first charge storage unit and the second charge storage unit. This arrangement achieves an action whereby the conversion efficiency is controlled by the first and second conversion efficiency control transistors.

Further, in the third aspect, a select transistor configured to output a signal of the amplified voltage, and a driving circuit configured to drive each of the high-sensitivity-side transfer transistor, the low-sensitivity-side transfer transistor, the first and second conversion efficiency control transistors, and the select transistor may further be included. This arrangement achieves an action whereby the select transistor and the like are driven by the driving control circuit.

Further, in the third aspect, the driving circuit may cause the high-sensitivity-side transfer transistor to transfer the charge inside a period in which both the first and second conversion efficiency control transistors are switched off and also cause the select transistor to output a signal of the voltage as a first voltage signal. This arrangement achieves an action whereby the first voltage signal converted at the highest conversion efficiency is output.

Further, in the third aspect, the driving circuit may cause the high-sensitivity-side transfer transistor to transfer the charge inside a period in which the first conversion efficiency control transistor is switched on and the second conversion efficiency control transistor is switched off and also cause the select transistor to output a signal of the voltage as a second voltage signal. This arrangement achieves an action whereby the second voltage signal converted at moderate conversion efficiency is output.

Further, in the third aspect, the driving circuit may cause the low-sensitivity-side transfer transistor to transfer the charge inside a period in which the first conversion efficiency control transistor is switched on and the second conversion efficiency control transistor is switched off and also cause the select transistor to output a signal of the voltage as a third voltage signal. This arrangement achieves an action whereby the third voltage signal converted at lowest conversion efficiency is output.

Further, in the third aspect, the driving circuit may cause the select transistor to output a signal of the voltage according to a charge overflowing from the high-sensitivity photodiode inside a period in which both the first and second conversion efficiency control transistors are switched on as a fourth voltage signal. This arrangement achieves an action whereby the fourth voltage signal converted at the lowest conversion efficiency is output.

Further, in the third aspect, the driving circuit may cause the fourth voltage signal to be output before causing the third voltage signal to be output. This arrangement achieves an action whereby the third voltage signal is output after the fourth voltage signal.

Further, in the third aspect, the driving circuit may supply, to the low-sensitivity-side transfer transistor, a readout pulse of middle potential between a predetermined potential and a high potential higher than the predetermined potential before causing the third and fourth voltage signals to be output. This arrangement achieves an action whereby charge is transferred by a readout pulse of medium potential.

Further, in the third aspect, a signal amount correction processing unit configured to execute a process of combining the third voltage signal and the fourth voltage signal as a signal amount correction process may further be included. This arrangement achieves an action whereby a pixel signal is generated through the combination of the third and fourth voltage signals.

Further, in the third aspect, a determination unit configured to determine whether or not an amount of light is less than a predetermined value on the basis of the first, second, and third voltage signals, an arithmetic mean processing unit configured to compute an arithmetic mean value of each of the fourth voltage signals output when the amount of light is less than the predetermined value, and a dark current correction processing unit configured to subtract a dark current according to the arithmetic mean value from the fourth voltage signal, and supply the subtracted result to the signal amount correction processing unit may further be included. This arrangement achieves an action where the dark current is corrected.

Further, in the third aspect, the gate of the first conversion efficiency control transistor may be formed in proximity to the gate of the second conversion efficiency control transistor, without a drain diffusion region interposed in between. This arrangement achieves an action whereby the area of the photodiode is expanded.

Further, in the third aspect, the third charge storage unit may be a capacitance of a metal-oxide-semiconductor (MOS) transistor having a gate connected to the second charge storage unit and a source into which a predetermined source bias pulse is input, and the driving circuit may supply the source bias pulse higher than a predetermined potential outside a predetermined exposure period, and supply the source bias pulse lower than the predetermined potential outside the predetermined exposure period. This arrangement achieves an action whereby the capacitance of the MOS capacitor is changed.

Further, in the third aspect, the gate of the MOS transistor may be embedded in a first trench formed in a predetermined substrate. This arrangement achieves an action whereby an increase in the area of the MOS transistor is suppressed.

Further, in the third aspect, in the predetermined substrate, the MOS transistor and at least one of the high-sensitivity photodiode or the low-sensitivity photodiode may be isolated from each other by a second trench. This arrangement achieves an action whereby the width of the dividing region is suppressed.

Further, in the third aspect, the high-sensitivity-side transfer transistor, the low-sensitivity-side transfer transistor, and the first and second conversion efficiency control transistors may be each respectively disposed in each of a plurality of pixel circuits arrayed in a two-dimensional matrix, and one of a pair of pixel circuits adjacent in a predetermined direction among the plurality of pixel circuits may be connected to a first signal line, while the other of the pair may be connected to a second signal line. This arrangement achieves an action whereby the signals from each of the pair of adjacent pixel circuits are output through the first and second signal lines.

Further, in the third aspect, a first analog-to-digital converter configured to convert a first analog signal to a digital signal, a second analog-to-digital converter configured to convert a second analog signal to a digital signal, a first switch configured to treat a signal from one of the first and second signal lines as the first analog signal and output the first analog signal to the first analog-to-digital converter, and a second switch configured to treat a signal from the other of the first and second signal lines as the second analog signal and output the second analog signal to the second analog-to-digital converter may further be included. This arrangement achieves an action whereby two rows are AD-converted at the same time.

Also, the third aspect of the present technology is an imaging device provided with a high-sensitivity-side transfer transistor that transfers a charge from a high-sensitivity photodiode having a sensitivity higher than a predetermined sensitivity to a first charge storage unit, a low-sensitivity-side transfer transistor that transfers a charge from a low-sensitivity photodiode having a sensitivity lower than the predetermined sensitivity to a second charge storage unit, an amplification transistor that amplifies the voltage of the first charge storage unit, first and second conversion efficiency control transistors connected in series between the first charge storage unit and the second charge storage unit, and a signal processing unit that performs predetermined signal processing on a signal of the amplified voltage. This arrangement achieves an action whereby the conversion efficiency is controlled by the first and second conversion efficiency control transistors, and signal processing is performed.

Effects of the Invention

According to the present technology, an excellent effect of being able to improve the conversion efficiency of converting charge to voltage in a solid-state imaging element that stores charge in a charge storage unit may be exhibited. Note that, the effect described here is not necessarily limited, and can be any effect described in the present disclosure.

BRIEF DESCRIPTION OF DRAWINGS

FIG. 15 is a table illustrating an example of the relationship between the input and output signals of a correction processing unit according to the first embodiment of the present technology.

FIG. 17 is a table illustrating an example of the characteristics of each voltage signal according to the first embodiment of the present technology.

FIGS. 18A, 18B, and 18C are examples of a cross section and a top view of a charge storage unit according to the first embodiment of the present technology.

FIG. 36 is a table illustrating an example of the relationship between the input and output signals of a correction processing unit according to the second embodiment of the present technology.

FIG. 37 is a table illustrating an example of the characteristics of each voltage signal according to the second embodiment of the present technology.

MODE FOR CARRYING OUT THE INVENTION

The following is a description of a mode for carrying out the present technology (the mode will be hereinafter referred to as the embodiment). The description will be made in the following order.

1. First embodiment (example of disposing conversion efficiency control transistor between charge storage units)
2. Second embodiment (example of connecting two conversion efficiency control transistors in series between charge storage units)
3. Applications to moving body 1. First Embodiment

[Exemplary Configuration of Imaging Device]

Figure 1:
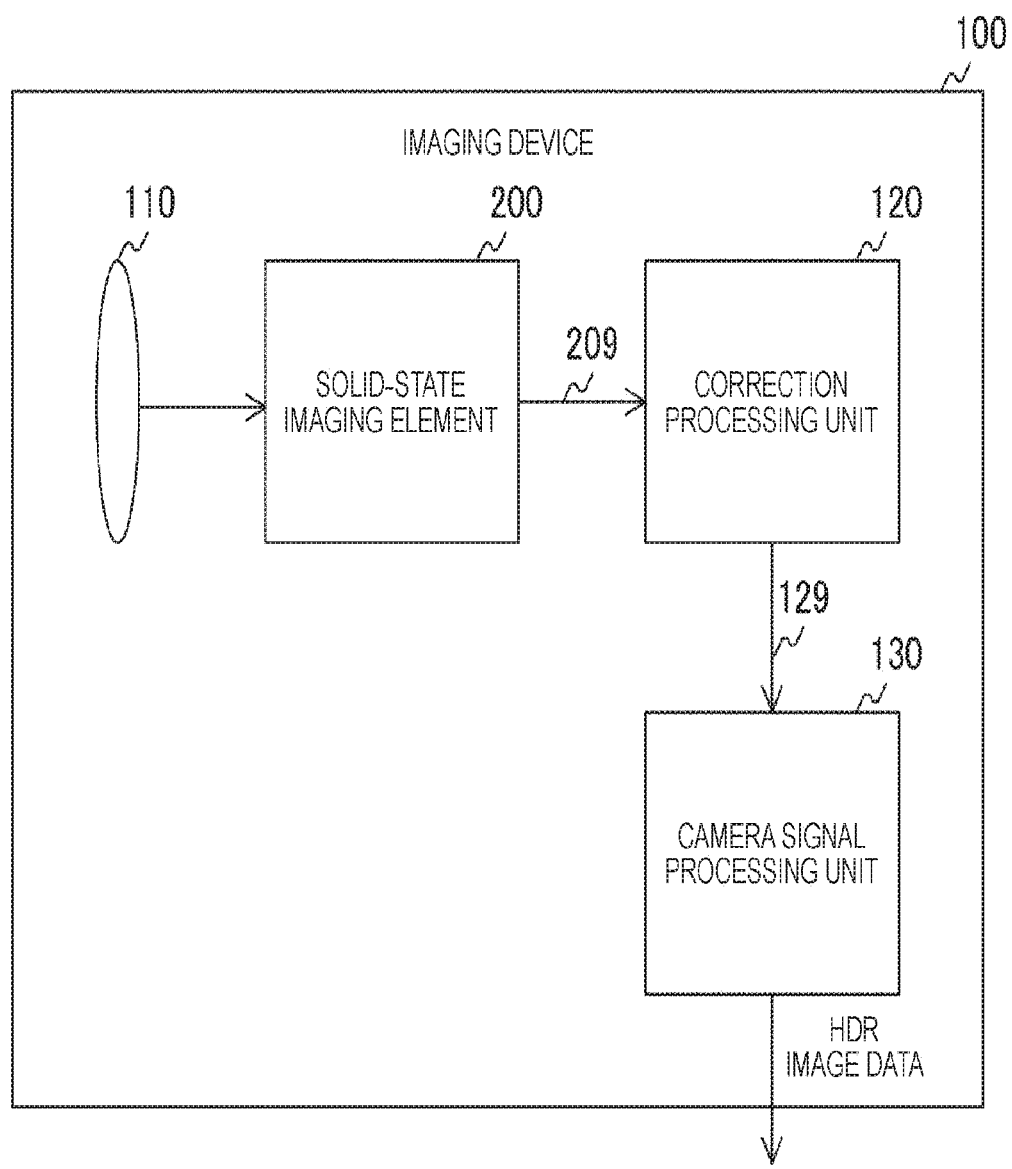
FIG. 1 is a block diagram illustrating an exemplary configuration of an imaging device according to a first embodiment of the present technology.

FIG. 1 is a block diagram illustrating one exemplary configuration of an imaging device 100 according to a first embodiment of the present technology. An imaging device 100 captures image data, and is provided with a camera lens 110, a solid-state imaging element 200, a correction processing unit 120, and a camera signal processing unit 130. The imaging device 100 is anticipated to be a device such as a digital camera, a smartphone, or a vehicle-mounted camera.

The camera lens 110 condenses and guides incident light from a subject to the solid-state imaging element 200. The solid-state imaging element 200 captures image data. The solid-state imaging element 200 supplies captured image data to the correction processing unit 120 through a signal line 209.

The correction processing unit 120 performs predetermined correction processing, such as the correction of dark current, on the image data. The correction processing unit 120 supplies the corrected image data to the camera signal processing unit 130 through a signal line 129.

The camera signal processing unit 130 executes predetermined signal processing, including high-dynamic-range (HDR) combination processing, on the image data. Here, HDR combination processing is a process of combining a plurality of pixel signals to expand the dynamic range compared to before combination. The camera signal processing unit 130 outputs the processed image data as HDR image data.

Note that although the correction processing unit 120 and the camera signal processing unit 130 are disposed outside the solid-state imaging element 200, some or all of the processing executed by these units can also be executed inside the solid-state imaging element 200.

[Exemplary Configuration of Solid-State Imaging Element]

Figure 2:
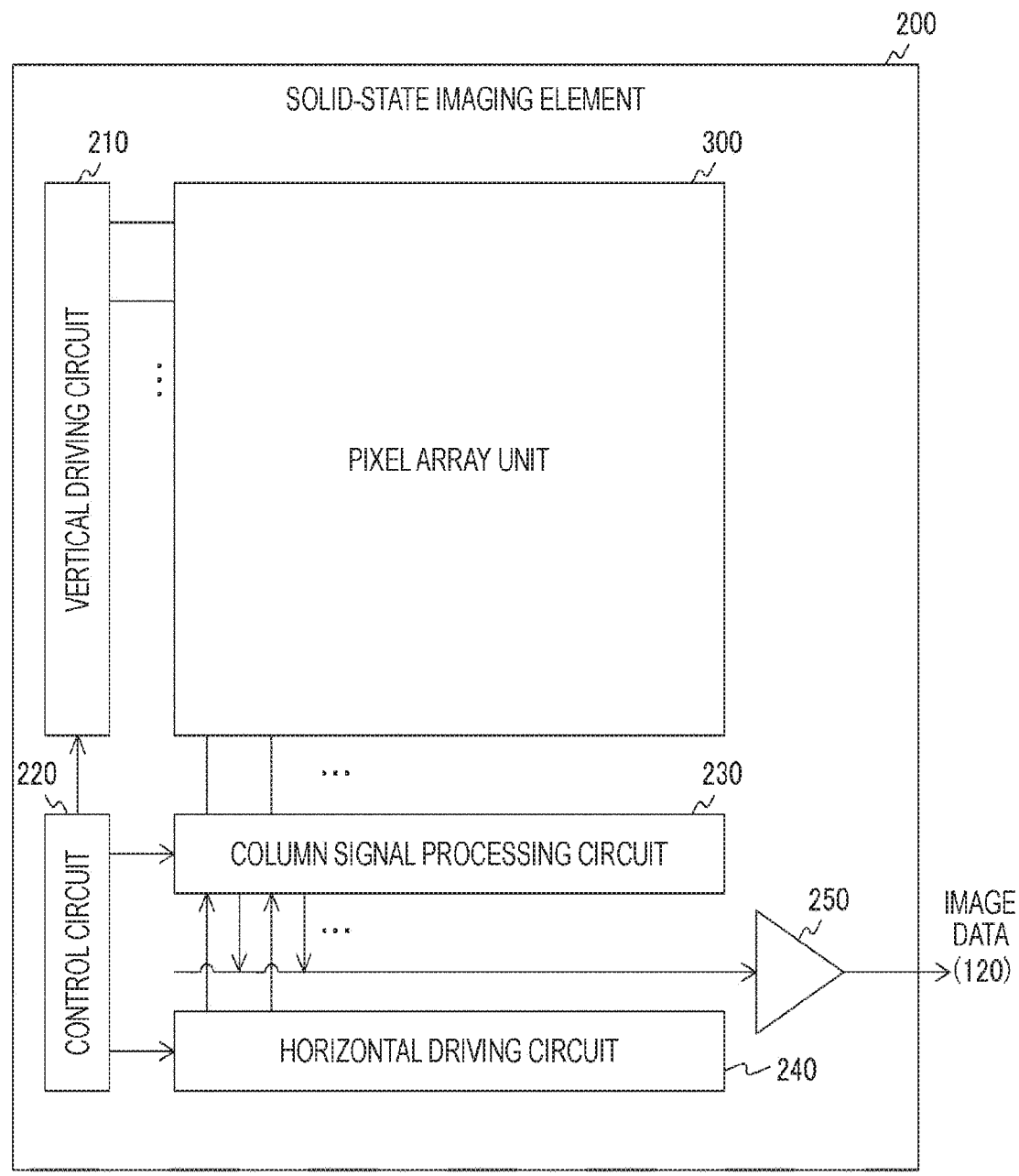
FIG. 2 is a block diagram illustrating an exemplary configuration of a solid-state imaging element according to the first embodiment of the present technology.

FIG. 2 is a block diagram illustrating one exemplary configuration of a solid-state imaging element 200 according to the first embodiment of the present technology. The solid-state imaging element 200 is provided with a vertical driving circuit 210, a pixel array unit 300, a control circuit 220, a column signal processing circuit 230, a horizontal driving circuit 240, and an output unit 250.

In the pixel array unit 300, a plurality of pixel circuits is disposed in a two-dimensional matrix. Hereinafter, a set of the pixel circuits arrayed in the horizontal direction will be referred to as a "row", while a set of the pixel circuits arrayed in the vertical direction will be referred to as a "column".

The control circuit 220 controls the operating timings of each of the vertical driving circuit 210, the column signal processing circuit 230, and the horizontal driving circuit 240.

The vertical driving circuit 210 sequentially selects and drives the rows, and causes each of the pixel circuits in a row to output a voltage signal. The column signal processing circuit 230 executes predetermined signal processing, such as analog-to-digital (AD) conversion processing and correlated double sampling (CDS) processing, on the voltage signals by column. The column signal processing circuit 230 supplies the processed signals to the output unit 250 under control by the horizontal driving circuit 240. Note that the vertical driving circuit 210 is an example of a driving circuit described in the claims, while the column signal processing circuit 230 is an example of a signal processing unit described in the claims.

The horizontal driving circuit 240 sequentially selects columns, and causes the columns to output voltage signals to the column signal processing circuit 230. The output unit 250 outputs image data containing the voltage signals to the correction processing unit 120.

Figure 3:
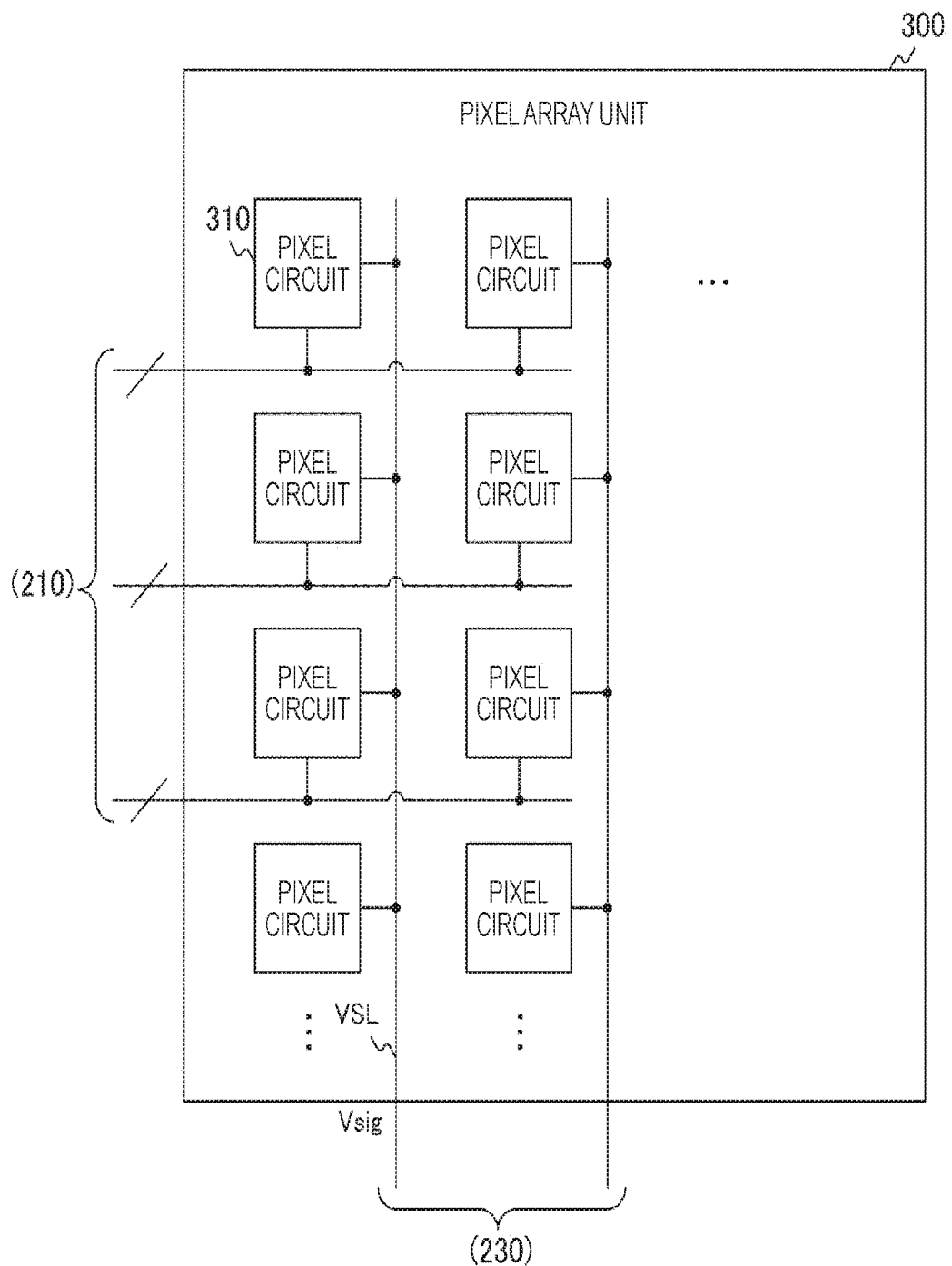
FIG. 3 is an example of a plan view of a pixel array unit according to the first embodiment of the present technology.

FIG. 3 is an example of a plan view of a pixel array unit 300 according to the first embodiment of the present technology. In the pixel array unit 300, a plurality of pixel circuits 310 is arrayed in a two-dimensional matrix. Each of the pixel circuits 310 is connected to the vertical driving circuit 210 through a predetermined number of horizontal signal lines disposed in the horizontal direction, and is connected to the column signal processing circuit 230 through a vertical signal line VSL disposed in the vertical direction.

[Pixel Circuit]

Figure 4:
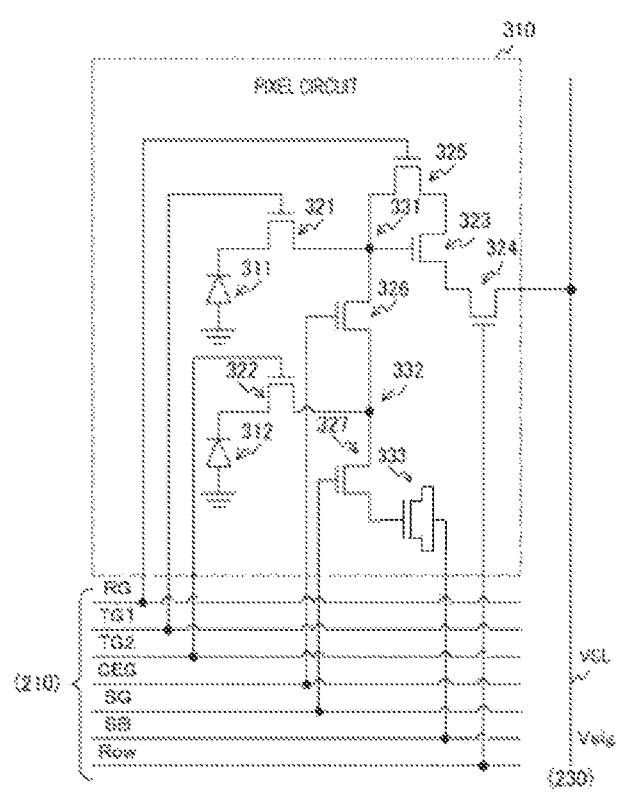
FIG. 4 is a circuit diagram illustrating an exemplary configuration of a pixel circuit according to the first embodiment of the present technology.

FIG. 4 is a circuit diagram illustrating an exemplary configuration of a pixel circuit 310 according to the first embodiment of the present technology. Each pixel circuit 310 is provided with a high-sensitivity photodiode 311, a low-sensitivity photodiode 312, a high-sensitivity-side transfer transistor 321, a low-sensitivity-side transfer transistor 322, an amplification transistor 323, a select transistor 324, and a reset transistor 325. Each pixel circuit 310 is also provided with conversion efficiency control transistors 326 and 327, and charge storage units 331, 332, and 333.

The high-sensitivity photodiode 311 is a photodiode having a sensitivity higher than a predetermined sensitivity, while the low-sensitivity photodiode 312 is a photodiode having a sensitivity lower than the predetermined sensitivity. Here, the "sensitivity" of a photodiode means how high the photoelectric conversion efficiency of converting light into charge is.

The high-sensitivity-side transfer transistor 321 transfers a charge from the high-sensitivity photodiode 311 to the charge storage unit 331 in accordance with a readout pulse TG1 from the vertical driving circuit 210.

The low-sensitivity-side transfer transistor 322 transfers a charge from the low-sensitivity photodiode 312 to the charge storage unit 332 in accordance with a readout pulse TG2 from the vertical driving circuit 210.

The amplification transistor 323 amplifies the voltage of the charge storage unit 331. The select transistor 324 outputs the signal of amplified voltage to the column signal processing circuit 230 as a voltage signal Vsig, in accordance with a row select pulse Row from the vertical driving circuit 210.

The reset transistor 325 draws out the charge in the charge storage unit 331 in accordance with a reset gate pulse RG from the vertical driving circuit 210, and initializes the voltage to an initial value.

The conversion efficiency control transistor 326 opens and closes a pathway between the charge storage unit 331 and the charge storage unit 332 in accordance with a conversion efficiency switching pulse CEG from the vertical driving circuit 210. The conversion efficiency control transistor 327 opens and closes a pathway between the charge storage unit 332 and the charge storage unit 333 in accordance with a storage gate pulse SG from the vertical driving circuit 210. Note that the conversion efficiency control transistor 326 is an example of a first conversion efficiency control transistor described in the claims, while the conversion efficiency control transistor 327 is an example of a second conversion efficiency control transistor described in the claims.

Through the opening and closing of pathways under control by the conversion efficiency control transistors 326 and 327, the total capacitance of the charge storage unit 331 and the like varies, and the conversion efficiency of converting charge to voltage is changed. Assuming that the amount of charge is a fixed value, as the capacitance increases, the voltage produced is lowered, and the conversion efficiency drops.

For example, in the case of switching off both of the conversion efficiency control transistors 326 and 327, the transferred charge is stored only in the charge storage unit 331. In this case, the capacitance is a minimum, and therefore the conversion efficiency is raised the most. Also, in the case of switching on the conversion efficiency control transistors 326 and 327, the transferred charge is stored in the charge storage units 331, 332, and 333. In this state, the combined capacitance is a maximum, and therefore the conversion efficiency is lowered the most. Also, in the case where the conversion efficiency control transistor 327 is switched off while keeping the conversion efficiency control transistor 326 switched on, the transferred charge is stored in the charge storage units 331 and 332. In this state, the combined capacitance is intermediate between the maximum and minimum, and therefore the conversion efficiency is moderate. In this way, by switching on and off each of the conversion efficiency control transistors 326 and 327, the vertical driving circuit 210 is capable of controlling the conversion efficiency in three stages.

The charge storage units 331, 332, and 333 store charge, and generates voltage according to the amount of charge. As the charge storage unit 331, a floating diffusion is used, for example. As the charge storage unit 332, a drain diffusion region formed on the drain side of the conversion efficiency control transistor 327 is used, for example. Hereinafter, a drain diffusion region used as storage for storing charge in this way is referred to as a storage drain (SD). As the charge storage unit 333, the capacitance of a metal-oxide-semiconductor (MOS) transistor, also referred to as a MOS capacitor (MC), is used, for example. A source bias pulse SB from the vertical driving circuit 210 is input into the source of the MOS transistor.

The voltage signals Vsig output from the pixel circuits 310 include four voltage signals Vsig1, Vsig2, Vsig3, and Vsig4. Also, each of the voltage signals Vsig1, Vsig2, Vsig3, and Vsig4 includes a P phase, which is a reference signal level when the charge storage units are initialized, and a D phase, which is a level when charge is transferred. Hereinafter, the P phase and the D phase of the voltage signal VsigN (where N is an integer from 1 to 4) are referred to as VsigNp and VsigNd.

Here, the voltage signal Vsig1 is a signal obtained by converting the charge from the high-sensitivity photodiode 311 to voltage at the highest conversion efficiency. The voltage signal Vsig2 is a signal obtained by converting the charge from the high-sensitivity photodiode 311 to voltage at the intermediate conversion efficiency. Also, the voltage signal Vsig3 is a signal obtained by converting the charge from the low-sensitivity photodiode 312 to voltage at the intermediate conversion efficiency. The voltage signal Vsig4 is a signal obtained by converting the charge overflowing from the low-sensitivity photodiode 312 to voltage at the lowest conversion efficiency.

[Exemplary Operations of Solid-State Imaging Element]

Figure 5:
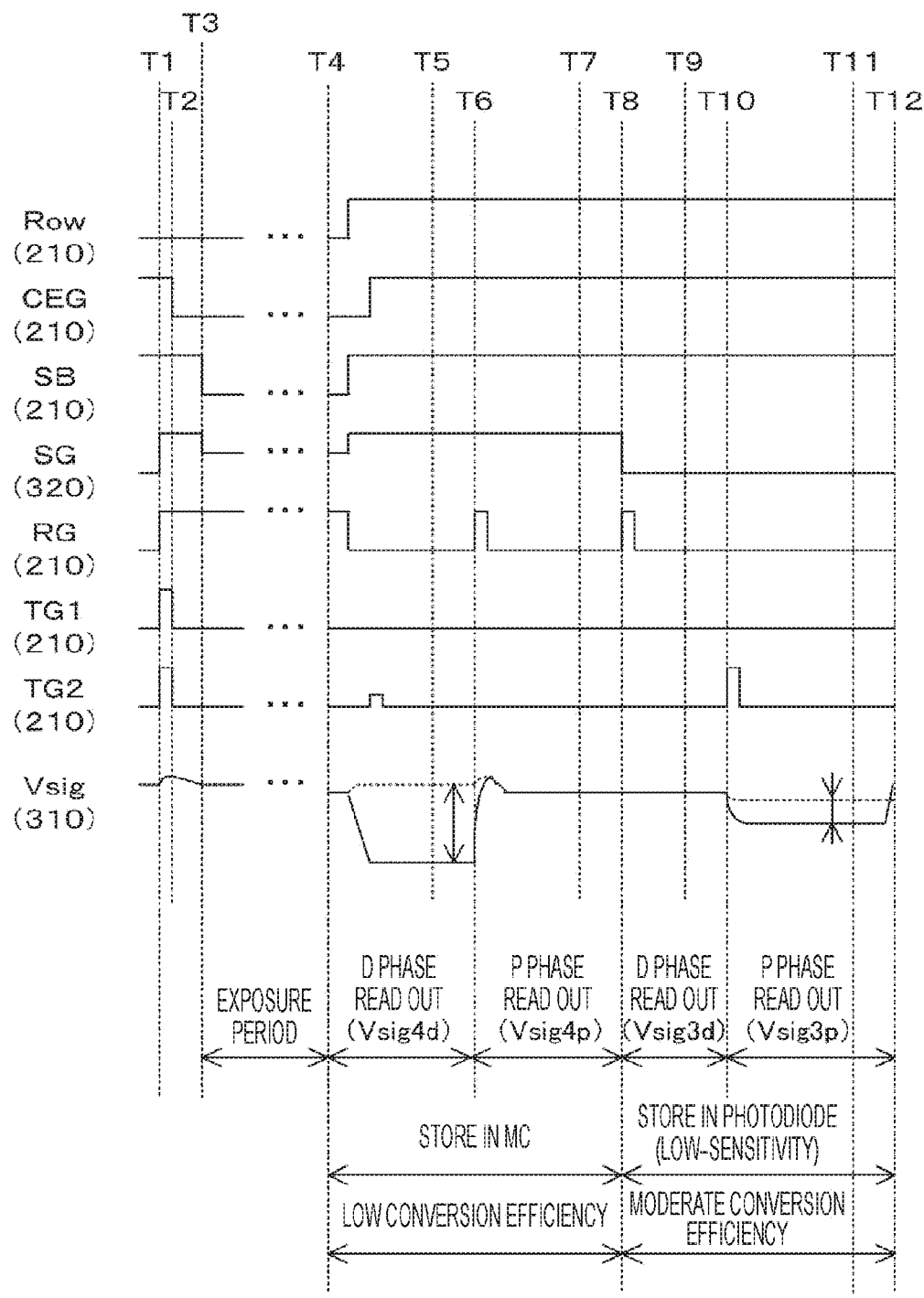
FIG. 5 is an example of a timing chart illustrating an operation of reading out a signal from a low-sensitivity photodiode according to the first embodiment of the present technology.

FIG. 5 is an example of a timing chart illustrating an operation of reading out a signal from a low-sensitivity photodiode 312 according to the first embodiment of the present technology. At a timing T1, the vertical driving circuit 210 sets the conversion efficiency switching pulse CEG, the source bias pulse SB, the storage gate pulse SG, the reset gate pulse RG, the readout pulse TG1, and the readout pulse TG2 to a high level that is higher than a predetermined low level. Meanwhile, the row select pulse Row is kept at the low level. With this arrangement, charge is drawn out from the pixel circuits 310, and the pixel circuits 310 are set to an initial state.

Thereafter, at a timing T2, the vertical driving circuit 210 sets the conversion efficiency switching pulse CEG, the readout pulse TG1, and the readout pulse TG2 to the low level. Next, at an exposure start timing T3, the vertical driving circuit 210 sets the source bias pulse SB to the low level, and sets the storage gate pulse SG to a middle level between the high level and the low level. With this arrangement, exposure accumulation is started.

Additionally, immediately after an exposure end timing T4, the vertical driving circuit 210 sets the row select pulse Row, the source bias pulse SB, and the storage gate pulse SG to the high level, and sets the reset gate pulse RG to the low level. From the timing T4 to a timing T6, the vertical driving circuit 210 supplies the readout pulse TG2 at a middle level slightly higher than the low level for the duration of a predetermined pulse period, and meanwhile sets the conversion efficiency switching pulse CEG to the high level. From the timing T4 to a timing T8, charge overflowing from the low-sensitivity photodiode 312 is stored in the MC and the like, and charge is converted to voltage at the lowest conversion efficiency. Also, from the timing T4 to the timing T6, the solid-state imaging element 200 reads out the voltage signal Vsig as the D phase voltage signal Vsig4*d*.

Next, at the timing T6, the vertical driving circuit 210 supplies the high-level reset gate pulse RG for the duration of the pulse period. With this arrangement, the charge storage units 331 to 333 are initialized. Additionally, from the timing T6 to the timing T8, the solid-state imaging element 200 reads out the voltage signal Vsig as the P phase voltage signal Vsig4p. The column signal processing circuit 230 performs analog-to-digital (AD) conversion of the voltage signals Vsig4p and Vsig4d and performs a CDS process of computing the difference between the voltage signals, thereby acquiring the net voltage signal Vsig4 from which fixed-pattern noise and the like have been removed.

At the timing T8, the vertical driving circuit 210 sets the storage gate pulse SG to the low level and supplies the high-level reset gate pulse RG for the duration of the pulse period. With this arrangement, the charge storage units 331 and 332 are initialized. From the timing T8 to a timing T12, charge is stored in the low-sensitivity photodiode 312, and charge is converted to voltage at the moderate conversion efficiency. Also, from the timing T8 to a timing T10, the solid-state imaging element 200 reads out the voltage signal Vsig as the D phase voltage signal Vsig3d.

At the timing T10, the vertical driving circuit 210 supplies the high-level readout pulse TG2 for the duration of the pulse period. With this arrangement, charge is transferred from the low-sensitivity photodiode 312. From the timing T10 to the timing T12, the solid-state imaging element 200 reads out the voltage signal Vsig as the P phase voltage signal Vsig3p. The column signal processing circuit 230 acquires the voltage signal Vsig3 from the voltage signals Vsig3p and Vsig3d.

Figure 6:
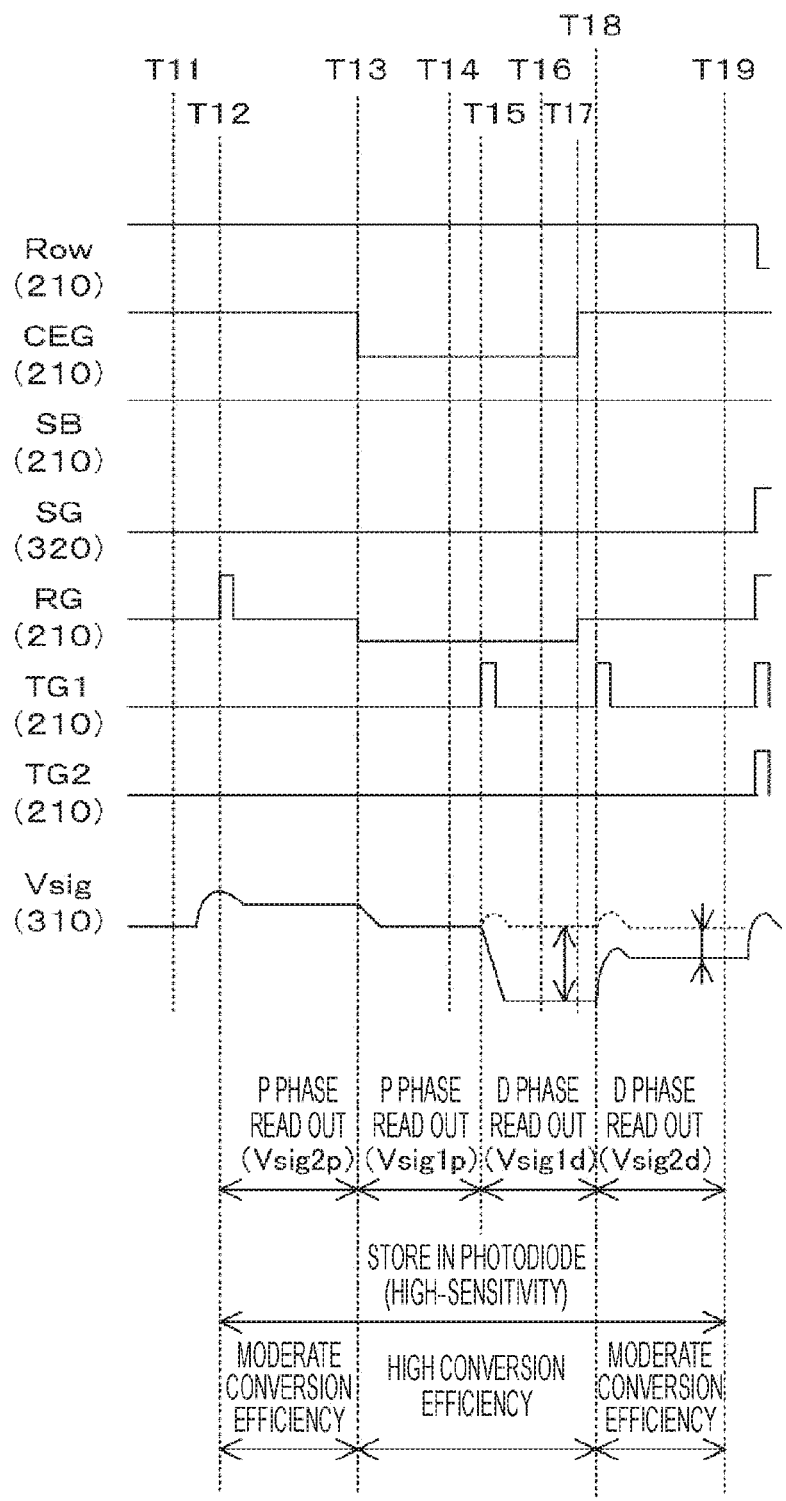
FIG. 6 is an example of a timing chart illustrating an operation of reading out a signal from a high-sensitivity photodiode according to the first embodiment of the present technology.

FIG. 6 is an example of a timing chart illustrating an operation of reading out a signal from a high-sensitivity photodiode 311 according to the first embodiment of the present technology.

At the timing T12, the vertical driving circuit 210 supplies the high-level reset gate pulse RG for the duration of the pulse period. With this arrangement, the charge storage units 331 and 332 are initialized. From the timing T12 to a timing T13, charge is stored in the high-sensitivity photodiode 311, and charge is converted to voltage at the moderate conversion efficiency. Then, from the timing T12 to a timing T13, the solid-state imaging element 200 reads out the voltage signal Vsig as the P phase voltage signal Vsig2p.

Next, at the timing T13, the vertical driving circuit 210 sets the conversion efficiency switching pulse CEG to the low level, and sets the reset gate pulse RG to a low level that is even lower than immediately before. From the timing T13 to a timing T18, charge is stored in the high-sensitivity photodiode 311, and charge is converted to voltage at the highest conversion efficiency. Also, from the timing T13 to a timing T15, the solid-state imaging element 200 reads out the voltage signal Vsig as the P phase voltage signal Vsig1p.

At the timing T15, the vertical driving circuit 210 supplies the high-level readout pulse TG1 for the duration of the pulse period. With this arrangement, charge is transferred from the high-sensitivity photodiode 311. In the duration from the timing T15 to the timing T18, the solid-state imaging element 200 reads out the voltage signal Vsig as the D phase voltage signal Vsig1d. The column signal processing circuit 230 acquires the voltage signal Vsig1 from the voltage signals Vsig1p and Vsig1d.

At a timing T17, the vertical driving circuit 210 sets the conversion efficiency switching pulse CEG to the high level, and supplies the high-level readout pulse TG1 for the duration of the pulse period from the immediate following timing T18. With this arrangement, charge is transferred from the high-sensitivity photodiode 311. Also, from the timing T18 to a timing T19, charge is stored in the high-sensitivity photodiode 311, and charge is converted to voltage at the moderate conversion efficiency. Also, at this time, the solid-state imaging element 200 reads out the voltage signal Vsig as the D phase voltage signal Vsig2d. The column signal processing circuit 230 acquires the voltage signal Vsig2 from the voltage signals Vsig2p and Vsig2d.

Through the control illustrated as an example in FIGS. 5 and 6, the voltage signals of one row are read out. Thereafter, the second and subsequent rows are sequentially read out by similar control.

Figure 7A:
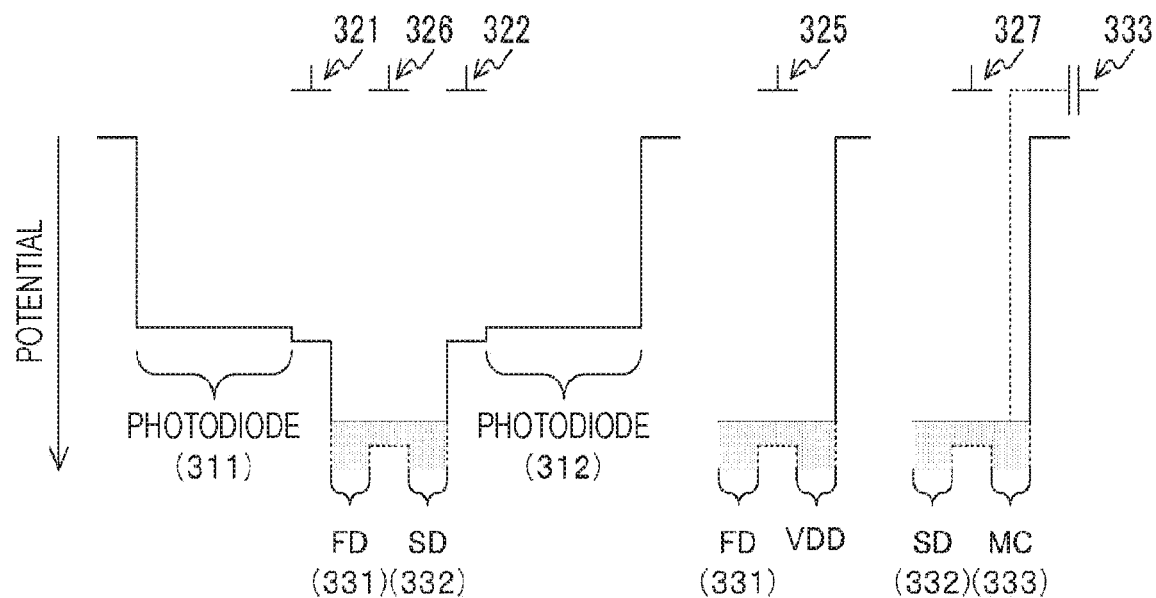
FIGS. 7A and 7B are examples of a potential diagram during initialization according to the first embodiment of the present technology.
Figure 7B:
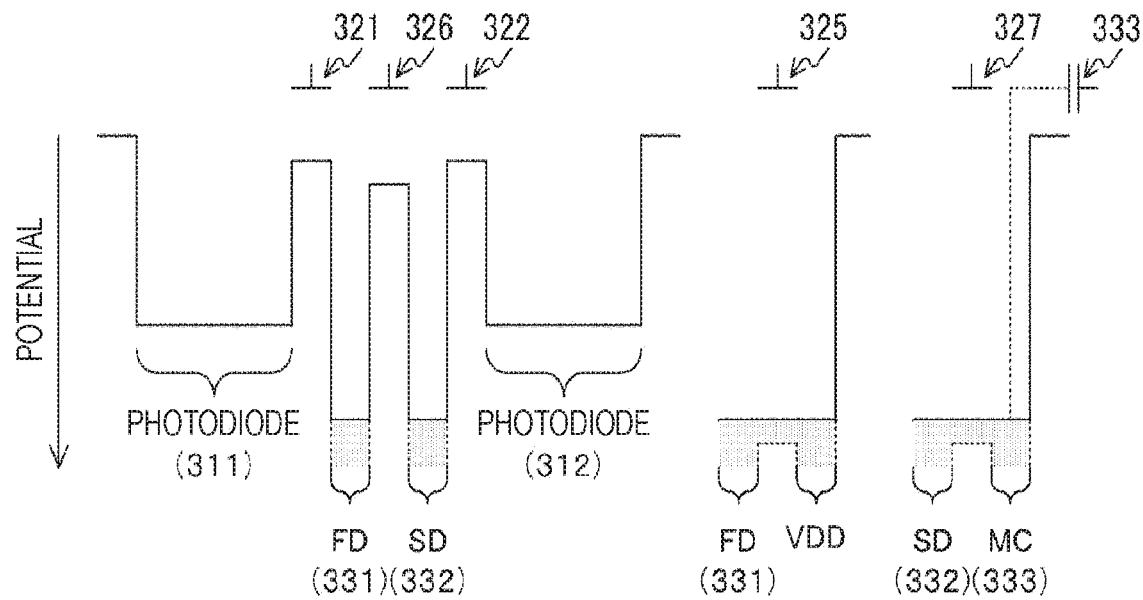

FIGS. 7A and 7B are examples of a potential diagram during initialization according to the first embodiment of the present technology. FIG. 7A is an example of a potential diagram at the timing T1, while FIG. 7B is an example of a potential diagram at the timing T2. In the diagram, the potentials of each of the charge storage unit 331 such as a floating diffusion (FD) and the charge storage unit 332 such as an SD are denoted. Additionally, the potentials of each of the charge storage unit 333 such as an MC, the high-sensitivity photodiode 311, and the low-sensitivity photodiode 312 are also denoted. Also, the potential between the high-sensitivity photodiode 311 and the charge storage unit 331 is the gate potential of the high-sensitivity-side transfer transistor 321, while the potential between the charge storage units 331 and 332 is the gate potential of the conversion efficiency control transistor 326. The potential between the low-sensitivity photodiode 312 and the charge storage unit 332 is the gate potential of the low-sensitivity-side transfer transistor 322, while the potential between the charge storage unit 331 and a power supply voltage VDD is the gate potential of the reset transistor 325. The potential between the charge storage units 332 and 333 is the gate potential of the conversion efficiency control transistor 327.

At the timing T1, each of the charge storage units 331 to 333 is initialized to the same potential as the power supply voltage VDD. Additionally, at the timing T2, the vertical driving circuit 210 supplies the readout pulses TG1 and TG2 at the low level to the high-sensitivity-side transfer transistor 321 and the low-sensitivity-side transfer transistor 322. Also, the vertical driving circuit 210 supplies the conversion efficiency switching pulse CEG at the low-level to the conversion efficiency control transistor 326.

Figure 8A:
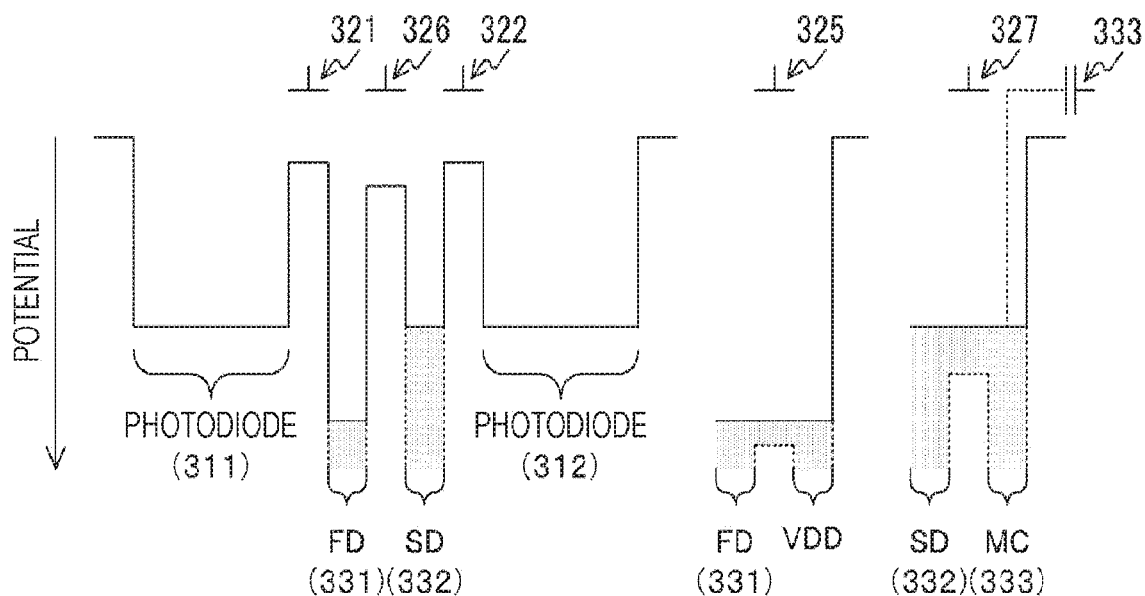
FIGS. 8A and 8B are examples of a potential diagram at the start of exposure and the end of exposure according to the first embodiment of the present technology.
Figure 8B:
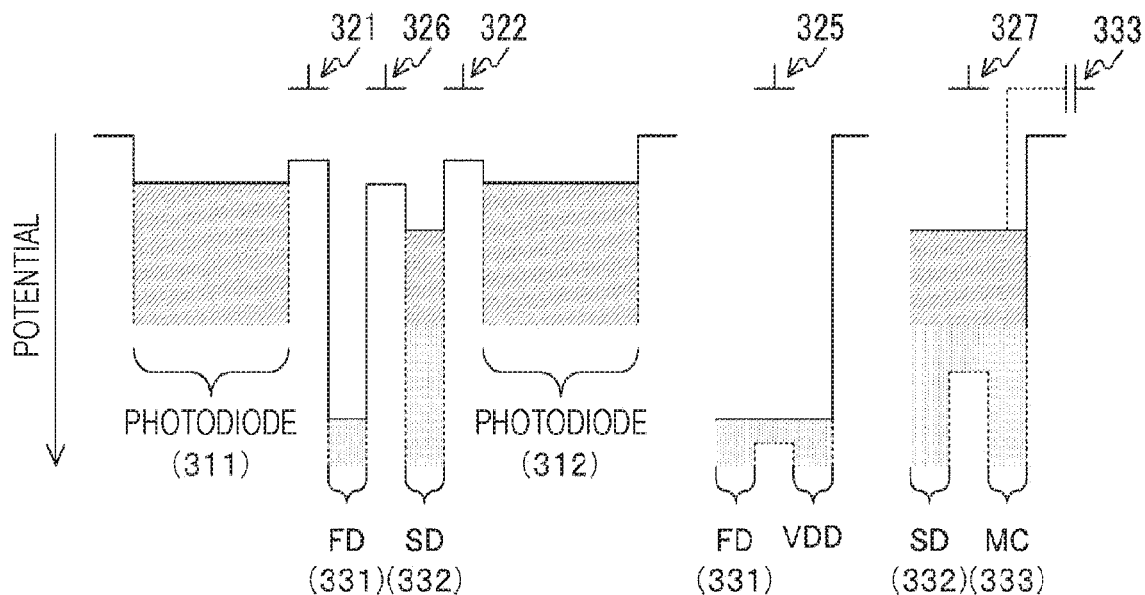

FIGS. 8A and 8B are examples of a potential diagram at the start of exposure and the end of exposure according to the first embodiment of the present technology. FIG. 8A is a potential diagram at the exposure start timing T3, while FIG. 8B is a potential diagram at the exposure end timing T4. In the diagram, the shaded portions indicate the stored signal charge. The similar applies to the potential diagrams in later figures.

At the timing T3, the vertical driving circuit 210 sets the source bias pulse SB to the MC to the low level to relax the high electric field in the drain diffusion produced near the FD and SD and also in MOS transistor channel part of the charge storage unit 333. Note that at the timing T3, the vertical driving circuit 210 can also control the conversion efficiency switching pulse CEG to a middle level to further relax the high electric field in the channel part of the conversion efficiency control transistor 327.

At the timing T4, signal charge is stored in the high-sensitivity photodiode 311 and the low-sensitivity photodiode 312. Also, in accordance with the intensity of the incident light, signal charge overflowing from the low-sensitivity photodiode 312 is stored in the charge storage units 332 (SD) and 333 (MC) and in the conversion efficiency control transistor 327.

Figure 9A:
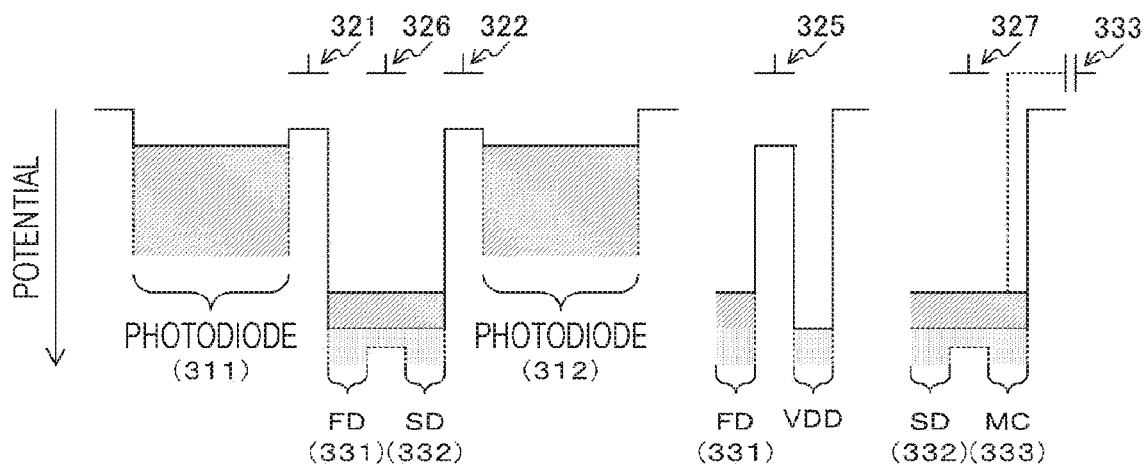
FIGS. 9A, 9B, and 9C are examples of a potential diagram when reading out charge overflowing from the low-sensitivity photodiode according to the first embodiment of the present technology.
Figure 9B:
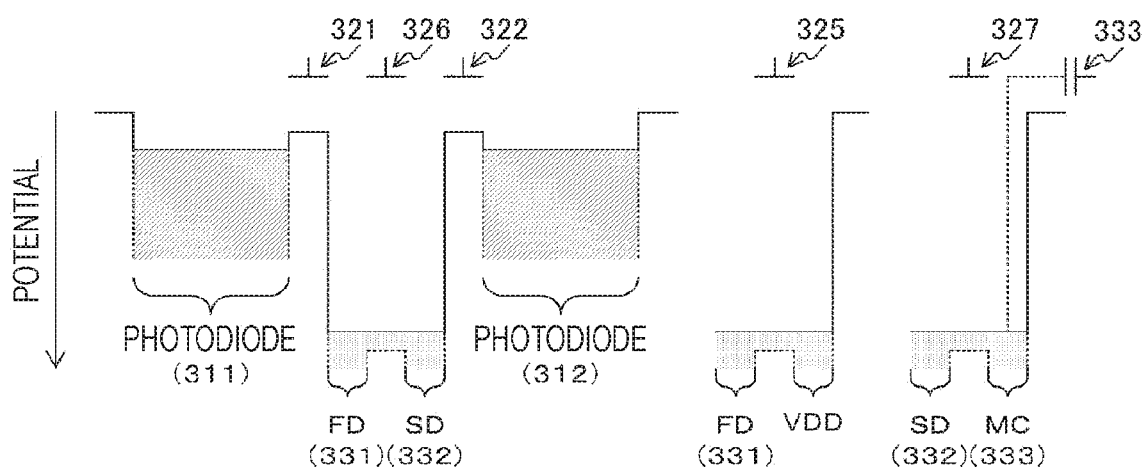
Figure 9C:
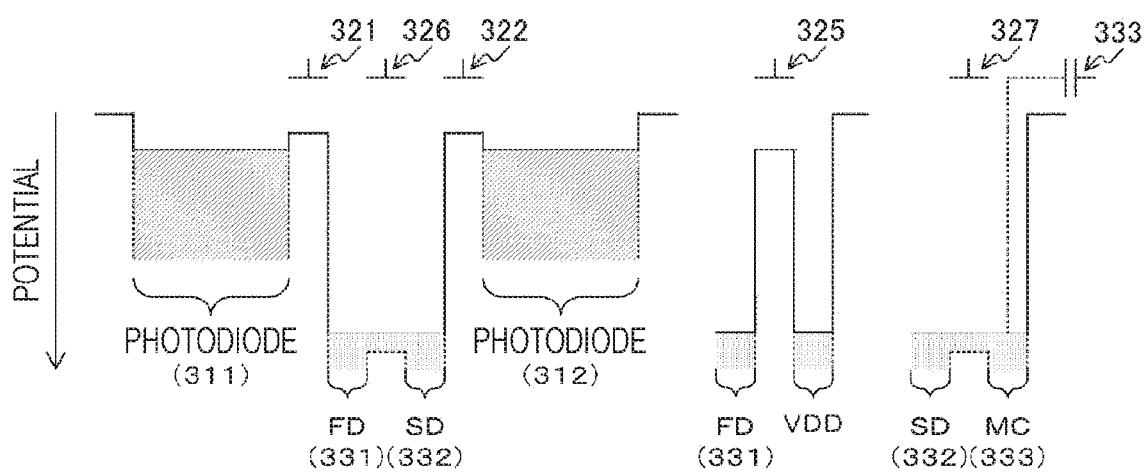

FIGS. 9A, 9B, and 9C are examples of a potential diagram when reading out charge overflowing from the low-sensitivity photodiode according to the first embodiment of the present technology. FIG. 9A is an example of a potential diagram at the timing T5 at which the D phase readout is performed. FIG. 9B is an example of a potential diagram at the timing T6 at which the charge storage units 331 to 333 are initialized, and FIG. 9C is an example of a potential diagram at the timing T7 at which the P phase readout is performed.

At the timing T5, the vertical driving circuit 210 sets the source bias pulse SB to the charge storage unit 333 to the high level, and switches off the reset transistor 325. Also, at the timing T5, if the storage gate pulse SG is at the middle level, the vertical driving circuit 210 returns the level to the high level. With this arrangement, the potential change of the charge storage unit 331 according to the signal charge overflowing from the low-sensitivity photodiode 312 is amplified by the charge storage unit 333, and appears as a change in the voltage on the vertical signal line VSL through the select transistor 324 that is switched on. The signal from the vertical signal line VSL at this time is read out as the D phase voltage signal Vsig4d.

Note that immediately before the timing T5, it is desirable for the vertical driving circuit 210 to slightly raise the voltage of the readout pulse TG2 for the duration of the pulse period.

Next, at the timing T6, when the vertical driving circuit 210 sets the reset gate pulse RG to the reset transistor 325 to the high level, the overflowing signal charge is discharged by the power supply voltage VDD, and the potential of the charge storage unit 331 (FD) becomes a reference potential.

Additionally, at the timing T7, the vertical driving circuit 210 returns the reset gate pulse RG to the reset transistor 325 to the low level. With this arrangement, the P phase voltage signal Vsig4p appears on the vertical signal line VSL while the charge storage unit 331 (FD) is at the reference potential. At this point in time, because the D phase Vsig4d and the P phase Vsig4p of the voltage signal Vsig4 have been obtained, the column signal processing circuit 230 samples the two and computes the difference to acquire the voltage signal Vsig4 due to the overflowing charge.

Figure 10A:
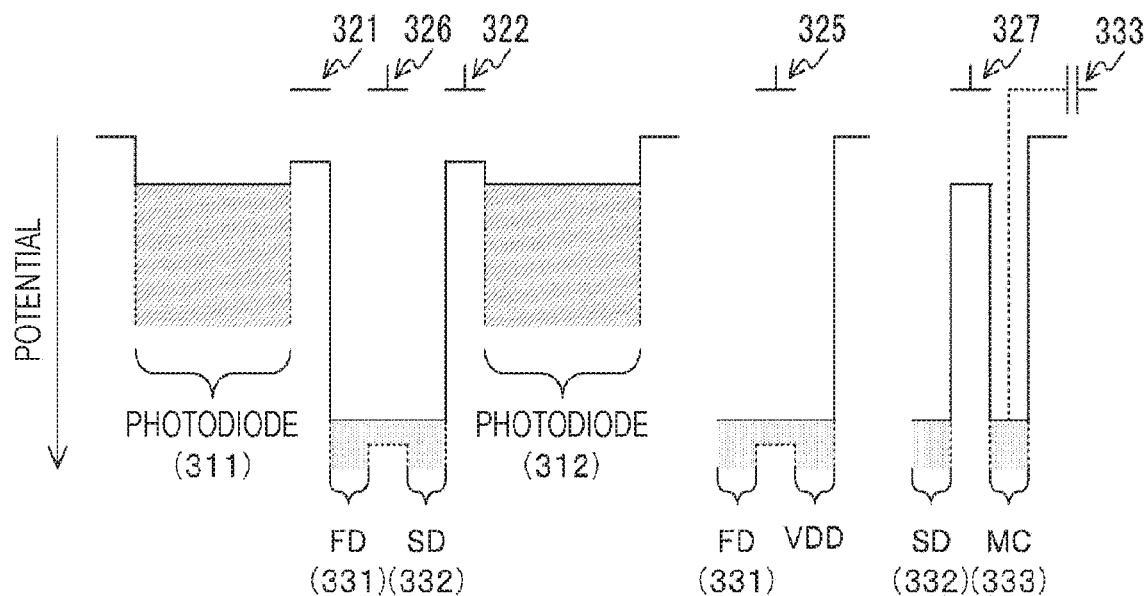
FIGS. 10A and 10B are examples of a potential diagram when reading out a P phase from the low-sensitivity photodiode according to the first embodiment of the present technology.
Figure 10B:
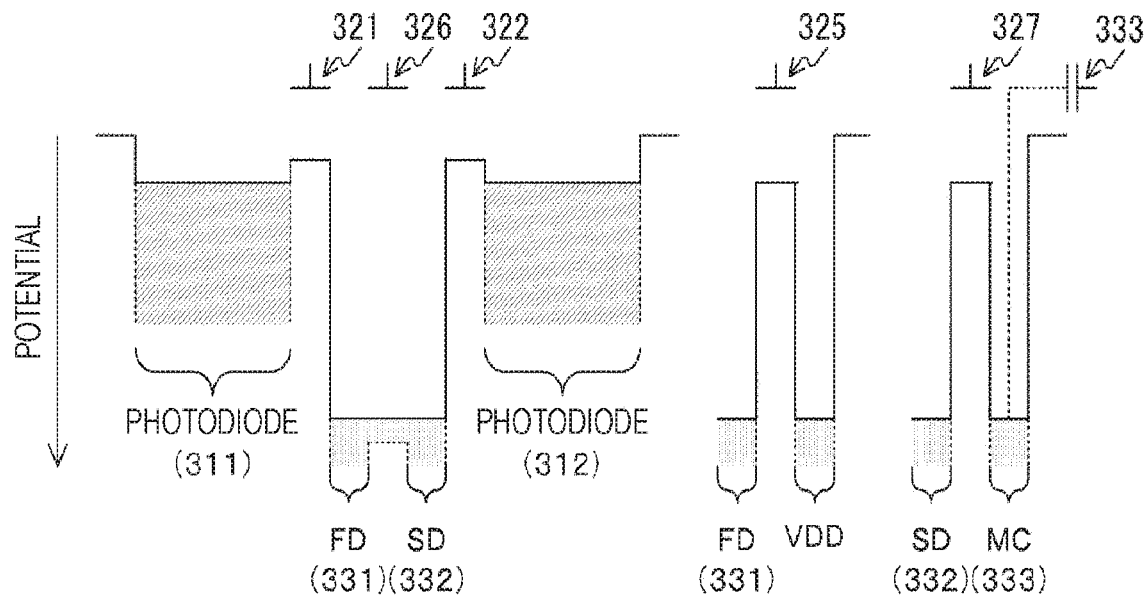

FIGS. 10A and 10B are examples of a potential diagram when reading out a P phase from the low-sensitivity photodiode 312 according to the first embodiment of the present technology. FIG. 10A is an example of a potential diagram at the timing T8 at which the charge storage unit 331 and the like are initialized, and FIG. 10B is an example of a potential diagram at the timing T9 at which the P phase readout is performed.

At the timing T8, the vertical driving circuit 210 isolates the charge storage unit 333 (MC) by switching off the conversion efficiency control transistor 327. With this arrangement, the conversion efficiency is switched to an intermediate value. Also, immediately after the timing T8, the vertical driving circuit 210 supplies the high-level reset gate pulse RG to the reset transistor 325, and resets the potential of the charge storage unit 331 (FD) back to the power supply voltage VDD. At this time, the reason for the intermediate conversion efficiency is that the capacitance of the conversion efficiency control transistor 326 is being added to the charge storage unit 331 (FD).

At the timing T9, the vertical driving circuit 210 returns the reset gate pulse RG to the reset transistor 325 to the low level. With this arrangement, the P phase voltage signal Vsig3p appears on the vertical signal line VSL.

Figure 11A:
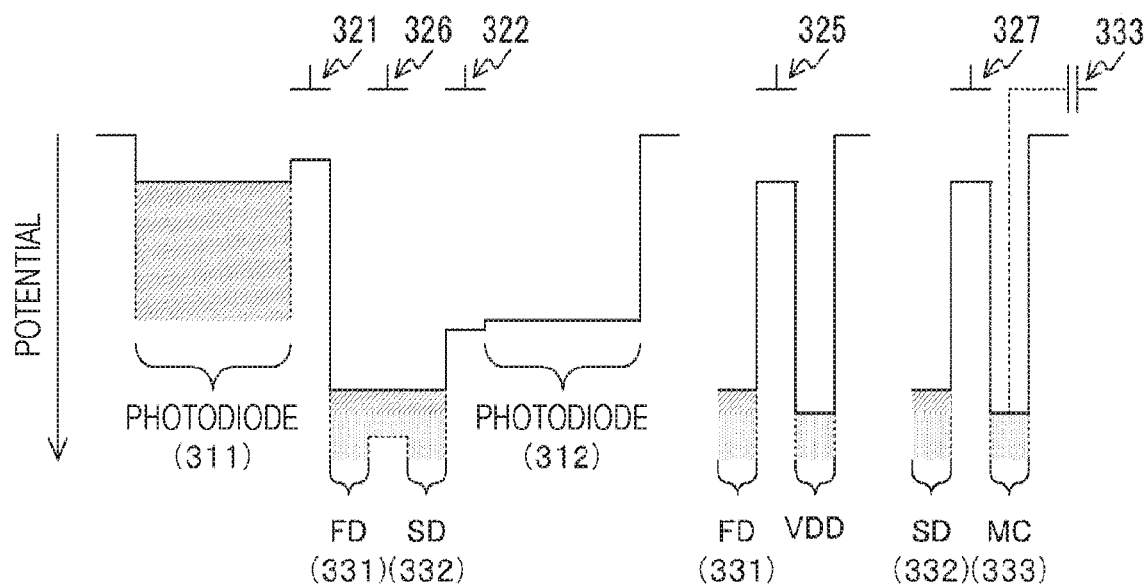
FIGS. 11A and 11B are examples of a potential diagram when reading out a D phase from the low-sensitivity photodiode according to the first embodiment of the present technology.
Figure 11B:
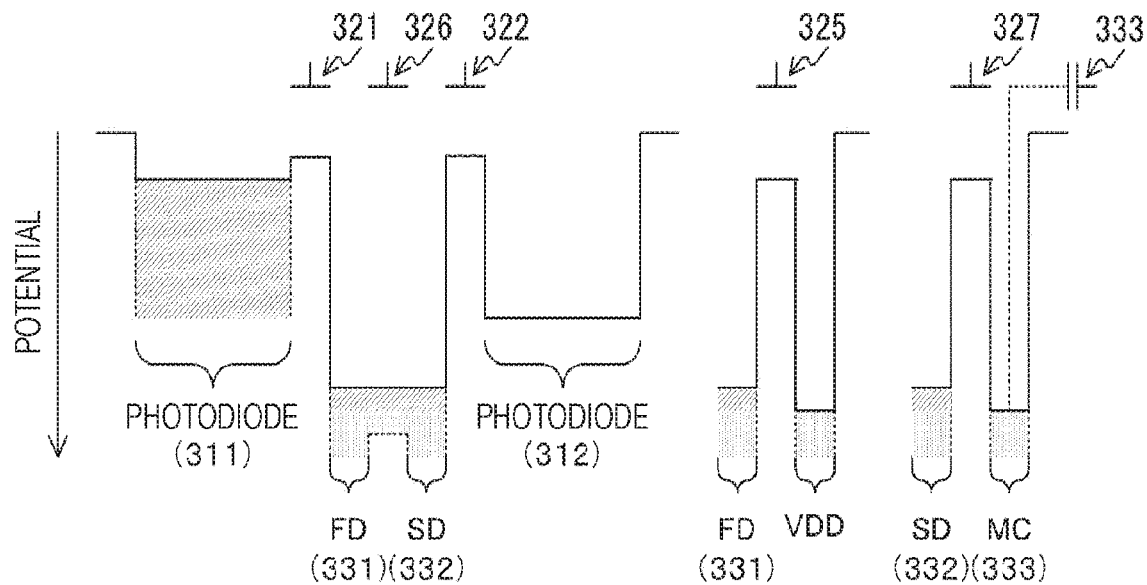

FIGS. 11A and 11B are examples of a potential diagram when reading out a D phase from the low-sensitivity photodiode 312 according to the first embodiment of the present technology. FIG. 11A is an example of a potential diagram at the timing T10, and FIG. 11 B is an example of a potential diagram at the timing T11 at which the D phase readout is performed.

At the timing T10, the vertical driving circuit 210 sets the readout pulse TG2 to the low-sensitivity-side transfer transistor 322 to the high level, and at the timing T11, returns the readout pulse TG2 to the low level. With this arrangement, the potential change of the charge storage unit 331 (FD) according to the signal charge stored in the low-sensitivity photodiode 312 is amplified by the amplification transistor 323, and appears on the vertical signal line VSL through the select transistor 324. This signal corresponds to the D phase voltage signal Vsig3d. At this point in time, because the D phase Vsig3d and the P phase Vsig3p of the voltage signal Vsig3 have been obtained, the column signal processing circuit 230 samples the two and computes the difference to acquire the voltage signal Vsig3 due to the overflowing charge.

Figure 12A:
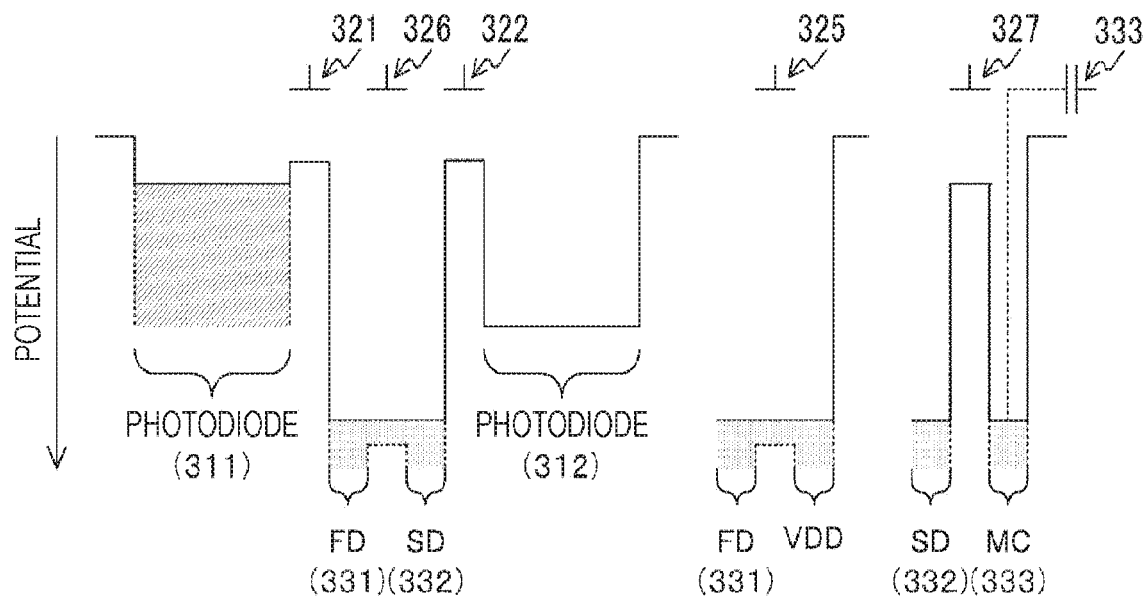
FIGS. 12A and 12B are examples of a potential diagram when reading out the P phase at medium conversion efficiency from the high-sensitivity photodiode according to the first embodiment of the present technology.
Figure 12B:
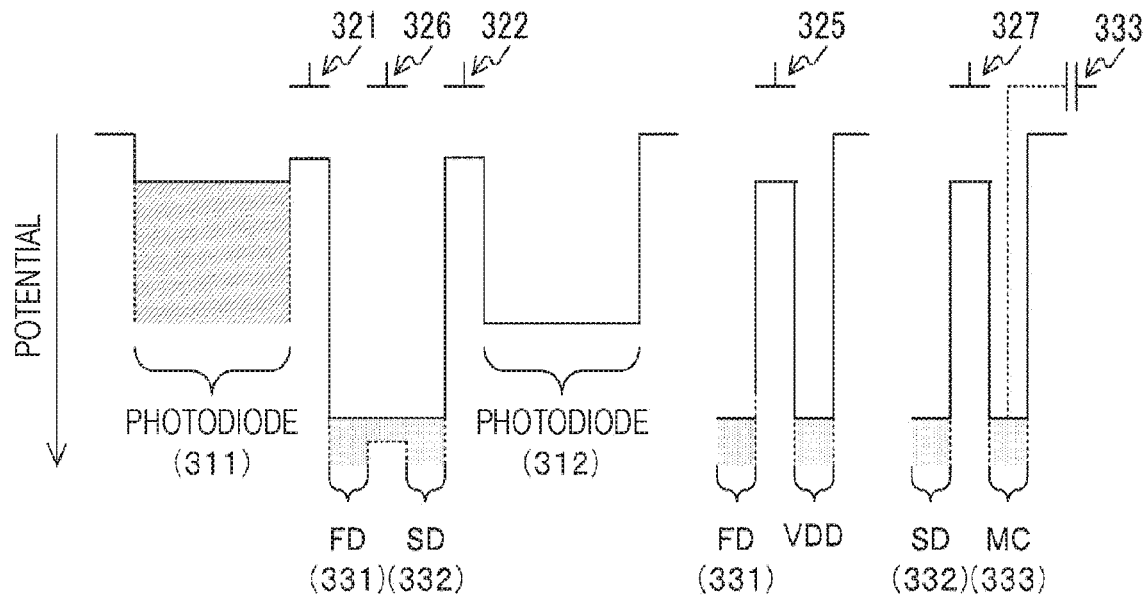

FIGS. 12A and 12B are examples of a potential diagram when reading out a P phase at medium conversion efficiency from the high-sensitivity photodiode 311 according to the first embodiment of the present technology. FIG. 12A is an example of a potential diagram at the timing T12 at which the charge storage unit 331 and the like are initialized, and FIG. 12B is an example of a potential diagram at the timing T13 at which the P phase readout is performed.

At the timing T12, the vertical driving circuit 210 sets the reset gate pulse RG to the reset transistor 325 to the high level for the duration of the pulse period. With this arrangement, the potential of the charge storage unit 331 (FD) is reset to the power supply voltage VDD.

At the timing T13, the vertical driving circuit 210 sets the reset gate pulse RG to the reset transistor 325 to a low level that is even lower than immediately before. With this arrangement, the P phase voltage signal Vsig2p appears on the vertical signal line VSL. At this time, because the conversion efficiency switching pulse CEG to the conversion efficiency control transistor 326 is at the high level, the conversion efficiency is an intermediate value.

Figure 13A:
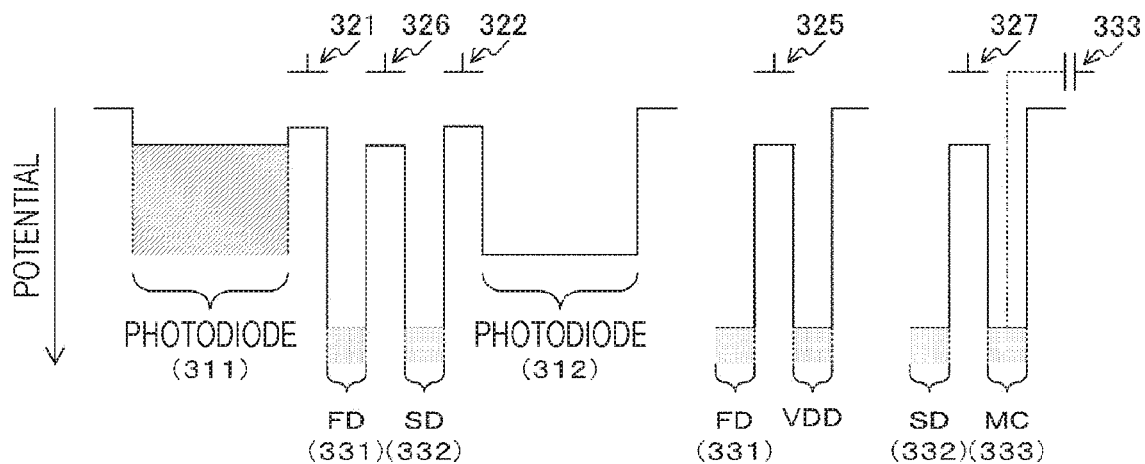
FIGS. 13A, 13B, and 13C are examples of a potential diagram when reading out the P phase and the D phase at high conversion efficiency from the high-sensitivity photodiode according to the first embodiment of the present technology.
Figure 13B:
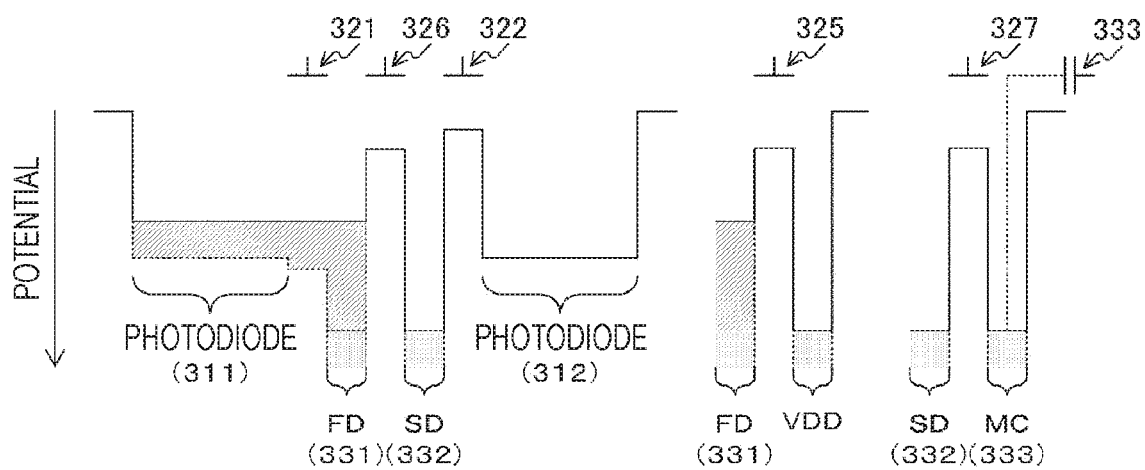
Figure 13C:
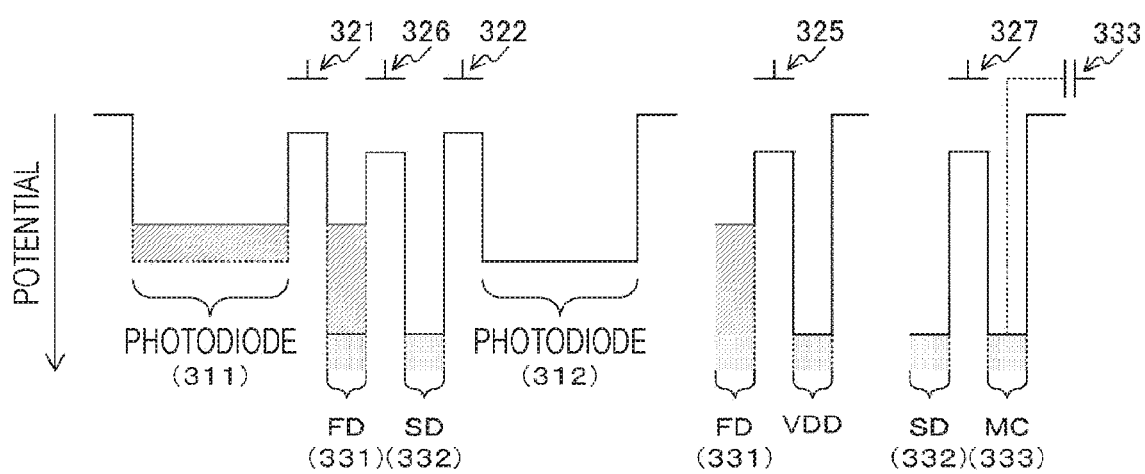

FIGS. 13A, 13B, and 13C are examples of a potential diagram when reading out the P phase and the D phase at high conversion efficiency from the high-sensitivity photodiode 311 according to the first embodiment of the present technology. FIG. 13A is an example of a potential diagram at the timing T14 at which the P phase readout is performed. FIG. 13B is an example of a potential diagram at the timing T15, and FIG. 13C is an example of a potential diagram at the timing T16 at which the D phase readout is performed.

At the timing T14, the vertical driving circuit 210 sets the conversion efficiency switching pulse CEG to the conversion efficiency control transistor 326 to the low level. With this arrangement, because the capacitance of the channel region of the conversion efficiency control transistor 326 is isolated from the capacitance of the charge storage unit 331 (FD), the conversion efficiency is at the maximum. At this time, the P phase voltage signal Vsig1p appears on the vertical signal line VSL.

At the timing T15, the vertical driving circuit 210 sets the readout pulse TG1 to the high level, and at the timing T16, returns the readout pulse TG1 to the low level. With this arrangement, the potential of the charge storage unit 331 (FD) changes according to the signal charge stored in the high-sensitivity photodiode 311, and the D phase voltage signal Vsig1d appears on the vertical signal line VSL. However, in the case where the signal charge of the high-sensitivity photodiode 311 exceeds the maximum value of the signal charge that the charge storage unit 331 (FD) is capable of accepting, a part of the signal charge remains in the high-sensitivity photodiode 311. In this case, because the signal charge cannot be used for the voltage signal Vsig1$d$, a signal is obtained when outputting the voltage signal Vsig2.

Figure 14A:
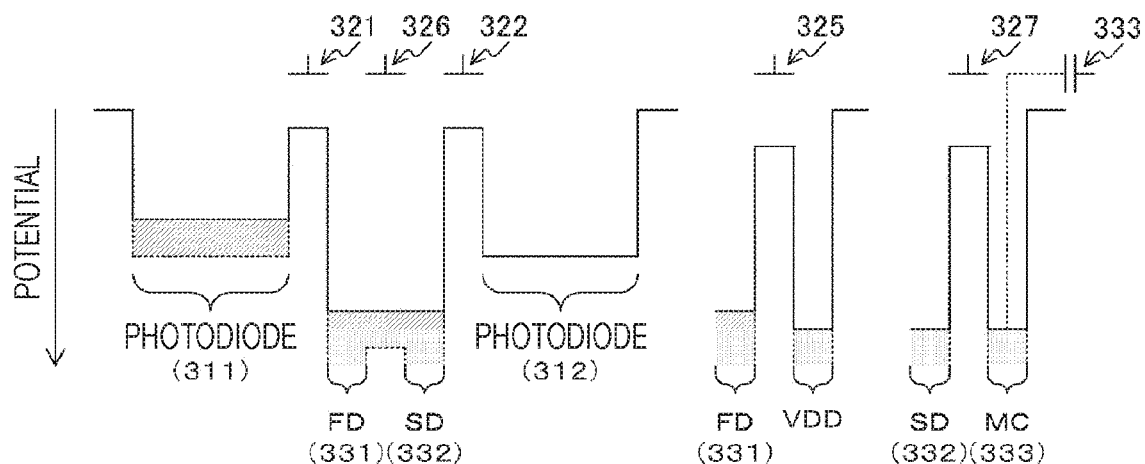
FIGS. 14A, 14B, and 14C are examples of a potential diagram when reading out the D phase at medium conversion efficiency from the high-sensitivity photodiode according to the first embodiment of the present technology.
Figure 14B:
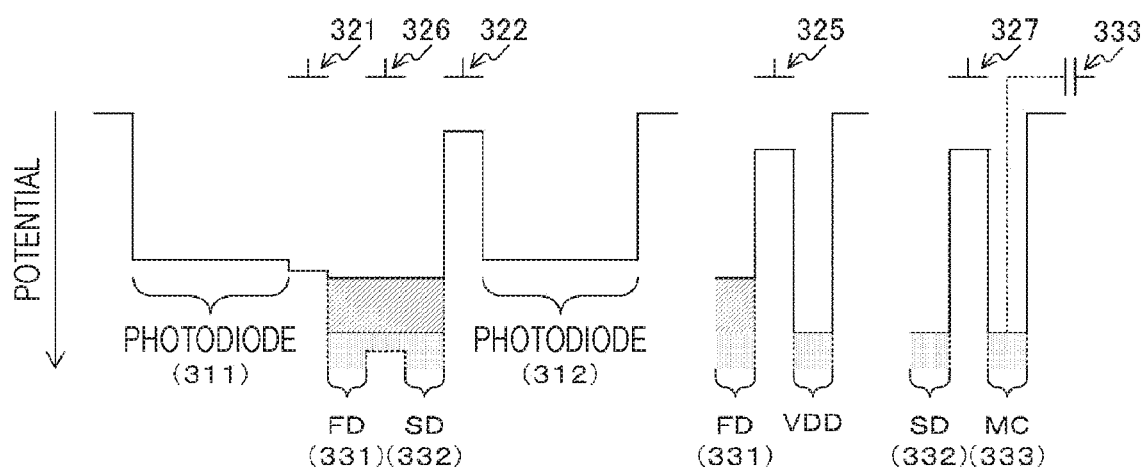
Figure 14C:
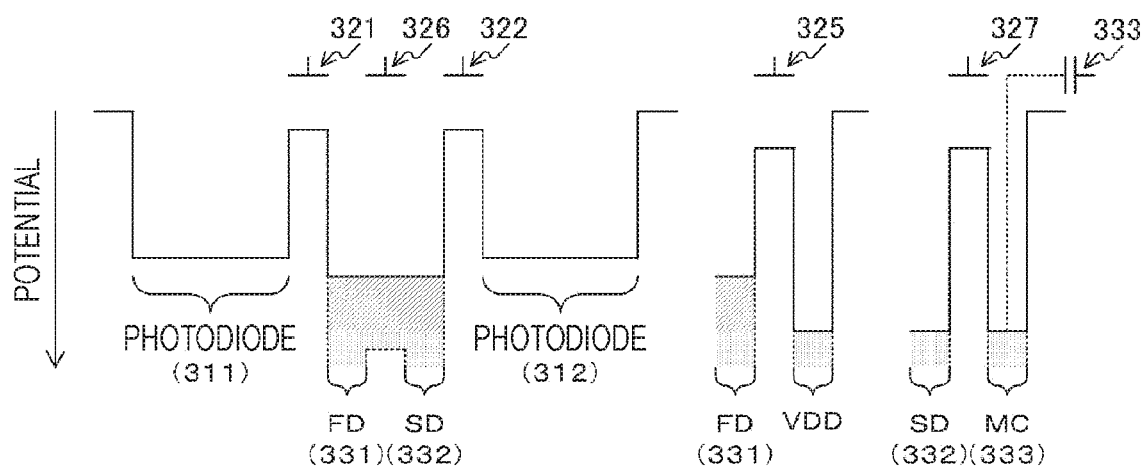

FIGS. 14A, 14B, and 14C are examples of a potential diagram when reading out the D phase at medium conversion efficiency from the high-sensitivity photodiode 311 according to the first embodiment of the present technology. FIG. 13A is an example of a potential diagram at the timing T17 at which the conversion efficiency is switched. FIG. 13B is an example of a potential diagram at the timing T18, and FIG. 13C is an example of a potential diagram at the timing T19 at which the D phase readout is performed.

At the timing T17, the vertical driving circuit 210 sets the conversion efficiency switching pulse CEG to the conversion efficiency control transistor 326 to the high level. With this arrangement, the conversion efficiency is switched to an intermediate value. Also, at the timing T17, the vertical driving circuit 210 returns the reset gate pulse RG to the level before the timing T11.

At the timing T18 immediately afterward, the vertical driving circuit 210 sets the readout pulse TG1 to the high level, and at the timing T19, returns the readout pulse TG1 to the low level. With this arrangement, the signal charge transferred from the high-sensitivity photodiode 311 is converted to the potential of the charge storage unit 331 (FD) at the intermediate conversion efficiency. This potential is amplified by the amplification transistor 323 and appears as the D phase voltage signal Vsig2$d$ on the vertical signal line VSL through the select transistor 324. The column signal processing circuit 230 acquires the net voltage signal Vsig1 by performing the CDS process on the P phase voltage signal Vsig1$p$ and the D phase voltage signal Vsig1$d$. Also, the column signal processing circuit 230 acquires the net voltage signal Vsig2 by performing the CDS process on the P phase voltage signal Vsig2$p$ and the D phase voltage signal Vsig2$d$.

FIG. 15 is a table illustrating an example of the relationship between the input and output signals of a correction processing unit 120 according to the first embodiment of the present technology. As described above, the solid-state imaging element 200 generates the voltage signals Vsig1 to Vsig4 for every pixel, and inputs the generated voltage signals Vsig1 to Vsig4 into the correction processing unit 120.

Thereafter, the correction processing unit 120 performs dark current correction, and outputs the voltage signals Vsig1, Vsig2, and Vsig3 directly as pixel signals S1, S2, and S3. On the other hand, the voltage signal Vsig4 is not treated as a pixel signal as-is, and is combined with the voltage signal Vsig3 according to the following formula.

$$S4 = V\text{sig}4 + V\text{sig}3 \, (CE_L/CE_M) \quad \text{Formula 1}$$

In the above formula, S4 is the pixel signal generated by combination, the units of which are microvolts (μV), for example. $CE_L$ indicates the lowest conversion efficiency, and $CE_M$ indicates the intermediate conversion efficiency. The units of these conversion efficiencies are microvolts per electron (μV/e), for example.

Figure 16:
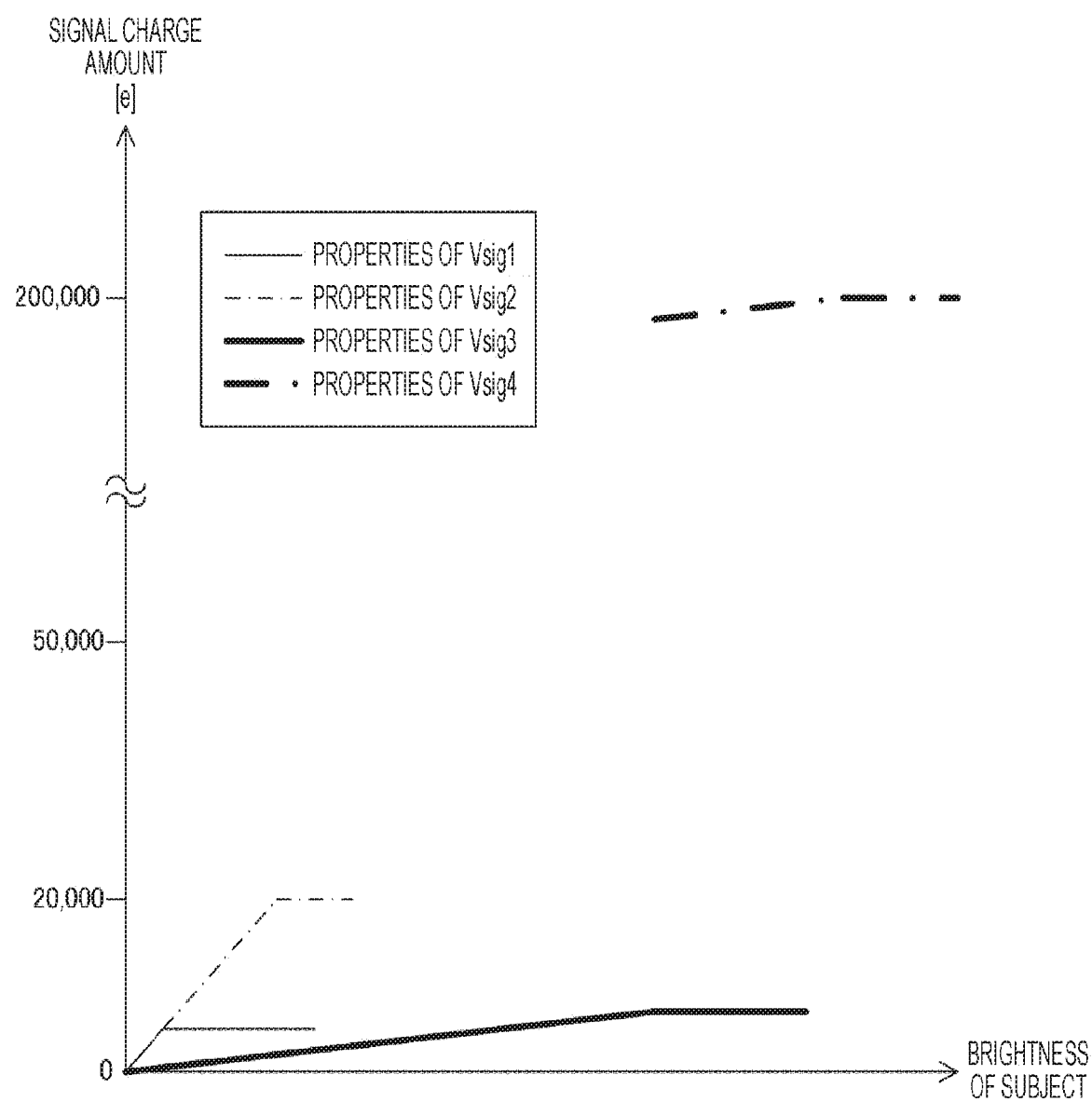
FIG. 16 is a graph illustrating an example of the relationship between the signal charge amount and the brightness according to the first embodiment of the present technology.

FIG. 16 is a graph illustrating an example of the relationship between the signal charge amount and the brightness according to the first embodiment of the present technology. In FIG. 16, the vertical axis represents the signal charge amount corresponding to each of the voltage signals Vsig1 to Vsig4, and the horizontal axis represents the brightness of the subject. Also, the thin solid line indicates the properties of the voltage signal Vsig1, and the thin chain line indicates the properties of the voltage signal Vsig2. The thick solid line indicates the properties of the voltage signal Vsig3, and the thick chain line indicates the properties of the voltage signal Vsig4.

The voltage signals Vsig1 to Vsig4 exhibit a higher level proportionally with respect to the brightness of the subject. Additionally, the level of the voltage signal Vsig1 saturates at a signal charge amount (for example, the number of electrons) of approximately 5,000, while the voltage signal Vsig2 saturates at approximately 20,000. Also, the level of the voltage signal Vsig3 saturates at approximately 7,000, while the voltage signal Vsig4 saturates at approximately 200,000.

In this way, because the voltage signals Vsig1 to Vsig4 saturate at different levels with respect to brightness, by combining these signals, the dynamic range can be expanded.

FIG. 17 is a table illustrating an example of the characteristics of each voltage signal according to the first embodiment of the present technology. The signal charge corresponding to the voltage signal Vsig1 is stored in the high-sensitivity photodiode 311. Also, each of the high-sensitivity photodiode 311 and the low-sensitivity photodiode 312 has a sensitivity ratio of "1". The conversion efficiency is the highest, and is 150 microvolts per electron (μV/e), for example. The signal charge amount is from 0 to 5,000, for example.

Also, the signal charge corresponding to the voltage signal Vsig2 is stored in the high-sensitivity photodiode 311. Also, the sensitivity ratio of the photodiode is "1". The conversion efficiency is an intermediate value, and is 30 microvolts per electron (μV/e), for example. The signal charge amount is from 5,000 to 20,000, for example.

Also, the signal charge corresponding to the voltage signal Vsig3 is stored in the low-sensitivity photodiode 312. Also, the sensitivity ratio of the photodiode is "0.1". The conversion efficiency is an intermediate value, and is 30 microvolts per electron (μV/e), for example. The signal charge amount is from 2000 to 7,000, for example.

Also, the signal charge corresponding to the voltage signal Vsig4 is stored in the charge storage unit 333 (MC), the conversion efficiency control transistor 327, and the low-sensitivity photodiode 312. Also, the sensitivity ratio of the photodiode is "0.1". The conversion efficiency is the lowest value, and is 5 microvolts per electron (μV/e), for example. The signal charge amount is from 7,000 to 20,000, for example.

If it is supposed that the charge storage units 332 and 333 are connected directly without disposing the conversion efficiency control transistor 327 between the charge storage units 332 and 333, the conversion efficiency when generating the voltage signal Vsig3 will be the lowest value. This is because the charge storage units 332 and 333 are connected to the charge storage unit 331.

However, in the pixel circuits 310, the conversion efficiency control transistor 327 is disposed between the charge storage units 332 and 333. For this reason, when generating the voltage signal Vsig3, the vertical driving circuit 210 can switch off the conversion efficiency control transistor 327 to thereby isolate the charge storage unit 333 and cause the conversion efficiency to be moderate. Consequently, the conversion efficiency when generating the voltage signal Vsig3 can be improved. By improving the conversion efficiency, dark random noise can be reduced, and a drop in the SNR when switching to the voltage signal Vsig3 can be lessened. Note that the conversion efficiency when generating the voltage signal Vsig3 can also be improved with a configuration not provided with the charge storage unit 333 itself, but such a configuration is undesirable because it is no longer possible to lower the conversion efficiency when generating the voltage signal Vsig4.

Also, in the solid-state imaging element 200, the source of the charge storage unit 333 is not set to a constant voltage, and the source bias pulse SB is supplied. By changing the source bias pulse SB to the low level during the exposure period, the electric field associated with the conversion efficiency control transistor 327 and the charge storage unit 333 (MC) in which charge is stored during the exposure period can be decreased, and the dark current produced thereby can be reduced.

Also, at the timing T13 of transferring charge from the high-sensitivity photodiode 311 to the charge storage unit 331 (FD), the vertical driving circuit 210 sets the voltage of the reset gate pulse RG to an even lower voltage than immediately before. With this arrangement, it is possible to gain storage capacitance in the charge storage unit 331 (FD), and increase the maximum signal level of the voltage signal Vsig2 with favorable SNR of the signal.

Also, immediately before the timing T5 of reading out the voltage signal Vsig4, the vertical driving circuit 210 sets the voltage of the readout pulse TG2 to a middle level slightly higher than the low level for the duration of the pulse period. With this arrangement, a small amount of the charge stored in the low-sensitivity photodiode 312 in the saturated state can be transferred to the charge storage unit 333 (MC). As a result, it is possible to suppress noise due to signal charge leaking from the low-sensitivity photodiode 312 to the charge storage unit 333 (MC) inside the periods of outputting the reference signal (P phase) of the voltage signals Vsig3 and Vsig4.

FIGS. 18A, 18B, and 18C are examples of a cross section and a top view of a charge storage unit 333 according to the first embodiment of the present technology. Hereinafter, the optical axis direction is designated the Z direction. Also, a predetermined direction orthogonal to the Z direction is designated the X direction, and the direction orthogonal to the X direction and the Z direction is designated the Y direction. FIG. 18A is a cross section of the charge storage unit 333 viewed from the Y direction, while FIG. 18B is a cross section of the charge storage unit 333 viewed from the X direction. FIG. 18C is a top view of the charge storage unit 333 viewed from the Z direction.

A predetermined silicon substrate includes a P region 414. Treating the direction toward the surface of the pixel array unit 300 as up in the Z direction, an N region 412 is formed above the P region 414. In the N region 412, a plurality of trenches extending in the Z direction is formed, and a trench gate 411 is buried in these trenches. Also, an N' diffusion region 413 is formed adjacent to the trench gate 411 in the N region 412. The trench gate 411 corresponds to the gate of the MOS transistor used as the charge storage unit 333. Also, the N' diffusion region 413 corresponds to the source of the MOS transistor. Additionally, a trench 415 is formed at the perimeter of the MOS transistor.

Additionally, an N region 417 is formed below the P region 414 in the cross section viewed from the X direction. A photodiode such as the low-sensitivity photodiode 312 is formed by the P region 414 and the N region 417. Near the photodiode, a transistor gate 416 is provided and an N'diffusion region 418 is formed adjacent to the gate.

In the top view viewed from the Z direction, a contact 420 for connecting to the charge storage unit 332 is provided on the trench gate 411. Also, a contact 421 for inputting the source bias pulse SB is disposed adjacent to the trench gate 411.

Here, the ratio of the lowest conversion efficiency to the highest conversion efficiency is small at 1/30, and a large value is demanded as the capacitance of the charge storage unit 333 (MC). In the case of a MOS capacitor formed on an ordinary silicon substrate plane, if a silicon oxide film ($SiO_2$) is used as the dielectric film set to a thickness of 5 nanometers (nm), the necessary area is approximately 1.9×1.9 square micrometers ($\mu m^2$). If a MOS capacitor with such a large area is disposed in the pixel circuit 310, the area of the photodiode is compressed, causing a decrease in the number of saturation electrons in the photodiode. For this reason, the intended performance for capturing HDR image data may not be achieved.

Accordingly, as described above, a MOS capacitor with a trench structure is used as the charge storage unit 333. For the trench gate 411, polysilicon or alternatively a silicide or salicide metal gate electrode is used. The trench gate 411 is connected to the charge storage unit 332 (SD), and the source bias pulse SB is input into the source ($N^+$ diffusion region 413).

The reason why the N region 412 doped with N-type impurities is formed at the perimeter of the trench gate 411 is that if the voltage of the charge storage unit 332 (SD) is low with respect to the voltage applied to the source, the area near the $SiO_2$ interface of the silicon substrate around the trench gate 411 will not be depleted. Also, if the perimeter of the trench gate 411 is doped with N-type impurities, the capacitor that is produced between the charge storage unit 332 (SD) and the source is dependent only on the $SiO_2$ film thickness, and a constant capacitance not dependent on the voltage of the charge storage unit 332 (SD) is obtained.

In the case of forming a MOS capacitor with such a trench structure adjacent to the photodiode inside a pixel, ordinarily a certain width is necessary to isolate elements from the photodiode, and the area of the photodiode may have to be narrowed correspondingly. Accordingly, as described above, it is effective to use deep trench isolation (DTI) provided by the trench 415 to isolate elements from the MOS capacitor with a trench structure and the transistors forming the photodiode and the pixel.

Generally, a method of ion implantation of P-type impurities at the perimeter of the N region 412 is used for element isolation, but by adopting DTI provided by the trench 415 instead of this method, the width of the element isolation can be decreased. With this arrangement, the area of the photodiode can be increased compared to the case of not using DTI.

[Exemplary Configuration of Column Signal Processing Circuit]

Figure 19:
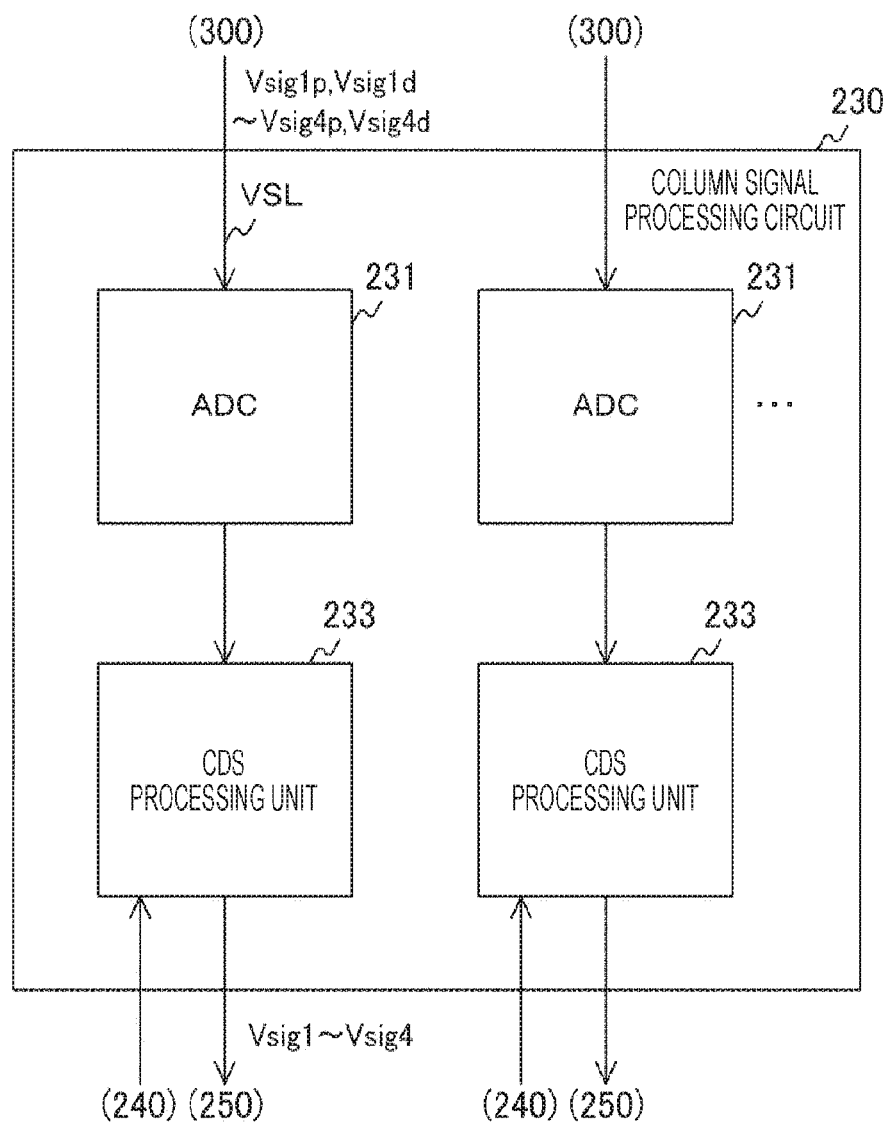
FIG. 19 is a block diagram illustrating an exemplary configuration of a column signal processing circuit according to the first embodiment of the present technology.

FIG. 19 is a block diagram illustrating an exemplary configuration of a column signal processing circuit 230 according to the first embodiment of the present technology. The column signal processing circuit 230 is provided with an analog-to-digital converter (ADC) 231 and a CDS processing unit 233 for every column.

The ADC 231 samples and AD-converts an analog voltage signal input through the vertical signal line VSL. As the voltage signal, Vsig1$p$, Vsig1$d$, Vsig2$p$, Vsig2$d$, Vsig3$p$, Vsig3$d$, Vsig4$p$, and Vsig4$d$ are input into every pixel. The ADC 231 supplies the AD-converted data to the CDS processing unit 233.

The CDS processing unit 233 performs the CDS process. The CDS processing unit 233 acquires the difference between the AD-converted voltage signals Vsig1$p$ and Vsig1d as the voltage signal Vsig1, and acquires the difference between the voltage signals Vsig2p and Vsig2d as the voltage signal Vsig2. Also, the CDS processing unit 233 acquires the difference between the AD-converted voltage signals Vsig3p and Vsig3d as the voltage signal Vsig3, and acquires the difference between the voltage signals Vsig4p and Vsig4d as the voltage signal Vsig4. The CDS processing unit 233 supplies these voltage signals to the output unit 250 under control by the horizontal driving circuit 240.

Here, the voltage signal Vsig4 is obtained mainly from the signal charge stored in the charge storage unit 333 (MC), but the signal charge is also stored in the channel region of the conversion efficiency control transistor 327 and the $N^+$ diffusion region of the charge storage unit 332 (SD). In these places, much dark current is produced, unlike the embedded high-sensitivity photodiode 311 and low-sensitivity photodiode 312. Because this leads to a lowered SNR in the voltage signal corresponding to the voltage signal Vsig4, the correction of the dark current fixed-pattern noise (FPN) is desirable. In the case of an ordinary camera, light is always incident on the imaging surface from the camera lens as long as the mechanical shutter is not closed, and therefore it is difficult to distinguish between the charge due to the dark current FPN and the charge due to photoelectric conversion, accurately remove only the dark current FPN. However, in the correction processing unit 120 of the solid-state imaging element 200, the voltage signals Vsig1 to Vsig4 can be utilized to extract just the dark current FPN with the required precision, and subtract the dark current FPN from the voltage signal Vsig4.

[Exemplary Configuration of Correction Processing Unit]

Figure 20:
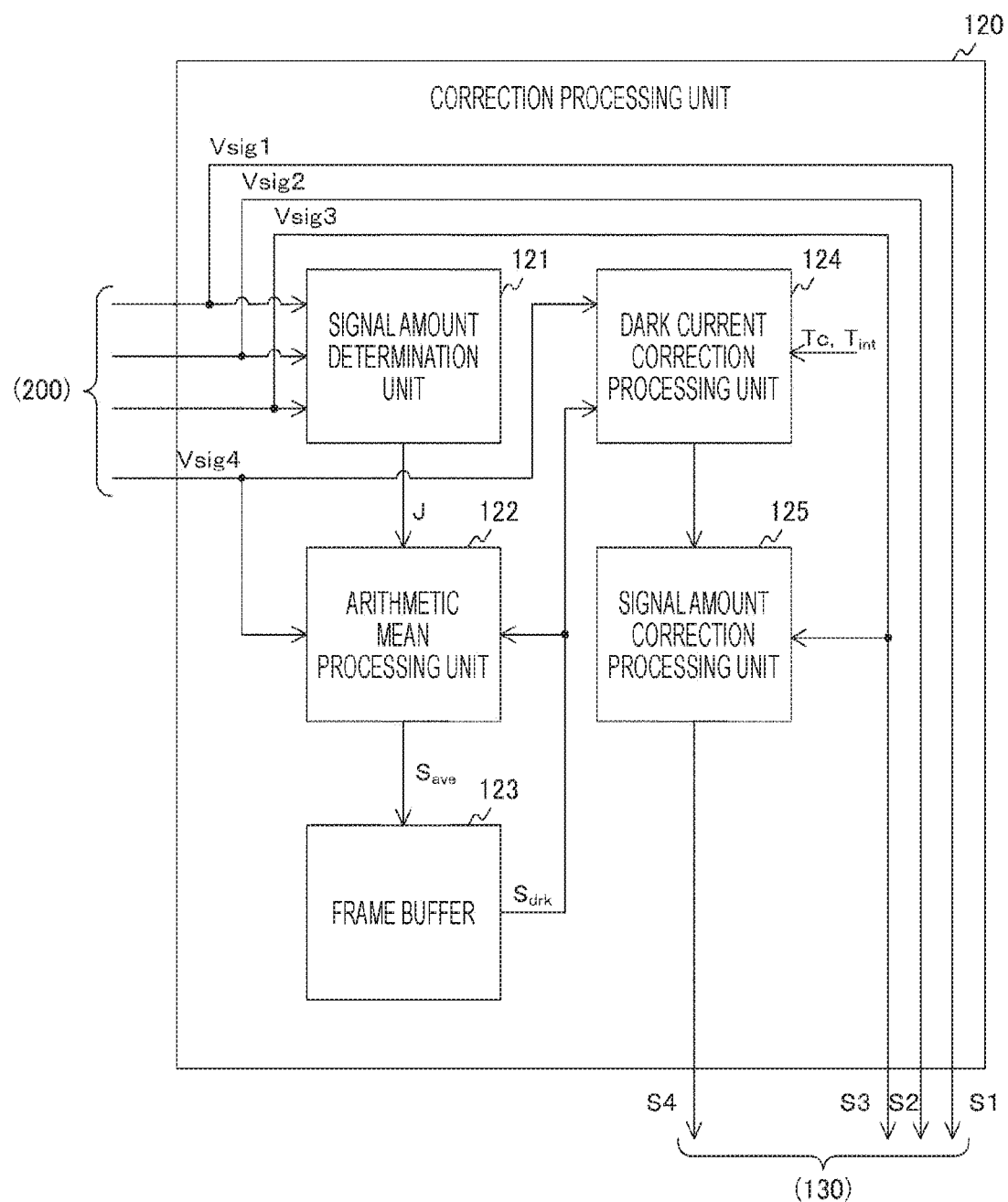
FIG. 20 is a block diagram illustrating an exemplary configuration of a correction processing unit according to the first embodiment of the present technology.

FIG. 20 is a block diagram illustrating an exemplary configuration of a correction processing unit 120 according to the first embodiment of the present technology. The correction processing unit 120 is provided with a signal amount determination unit 121, an arithmetic mean processing unit 122, a frame buffer 123, a dark current correction processing unit 124, and a signal amount correction processing unit 125.

The signal amount determination unit 121 determines whether or not the amount of light in each pixel is less than a predetermined value, on the basis of each of the voltage signals Vsig1, Vsig2, and Vsig3. Because the voltage signals Vsig1 and Vsig2 in particular are signals from the high-sensitivity photodiode 311, the sensitivity is set approximately 10 times higher than the voltage signal Vsig4. Consequently, these voltage signals Vsig1 and Vsig2 can be used to determine the amount of light. For example, the signal amount determination unit 121 computes the total or average of these voltage signals, and determines whether or not the amount of light is less than a predetermined value according to whether or not the computed value falls below a predetermined threshold value. The signal amount determination unit 121 supplies a determination result J to the arithmetic mean processing unit 122.

The arithmetic mean processing unit 122 computes the arithmetic mean of each voltage signal Vsig4 output when the amount of light is less than the predetermined value. When the amount of light is low, the state conceivably corresponds to darkness or near-darkness, and therefore the voltage signal Vsig4 may be considered to contain only the dark current FPN produced by the charge storage unit 332 (SD) and the conversion efficiency control transistor 327.

For each pixel, the arithmetic mean processing unit 122 acquires the voltage signal Vsig4 when the amount of light is less than the predetermined value, and reads out the arithmetic mean value $S_{drk}$ up to the last time for the corresponding pixel from the frame buffer 123. Thereafter, the arithmetic mean processing unit 122 increments N (where N is an integer), and computes the current arithmetic mean value $S_{ave}$ according to the following formula.

$$S_{ave} = Vsig4/N + S_{drk}$$

Thereafter, the arithmetic mean processing unit 122 updates the arithmetic mean value $S_{drk}$ of the corresponding pixel with the computed value of the arithmetic mean value $S_{ave}$.

In the case of a vehicle-mounted imaging element that captures various scenes, dark scenes are expected to come from any portion of the angle of view, and therefore a sufficient arithmetic mean process is performed on the entire frame in relatively short amount of time. With this arrangement, an image of only the dark current FPN with sufficient precision is held in the frame buffer 123.

The dark current correction processing unit 124 computes the dark current from the temperature Tc, the exposure time $T_{int}$, and the arithmetic mean value $S_{drk}$, and subtracts the dark current from the voltage signal Vsig4. The dark current correction processing unit 124 acquires the temperature Tc of the solid-state imaging element 200 and the exposure time $T_{int}$ from the solid-state imaging element 200.

Additionally, the dark current correction processing unit 124 treats the arithmetic mean value $S_{drk}$ as the dark current FPN, and subtracts the dark current FPN from the voltage signal Vsig4 for every pixel. However, the exposure time $T_{int}$ may also be changed while computing the arithmetic mean using the frame buffer 123. In this case, it is sufficient for the dark current correction processing unit 124 to multiply the arithmetic mean value $S_{drk}$ by the ratio of the current exposure time after the change to the past exposure time before the change, and subtract the multiplied value as the dark current FPN from the voltage signal Vsig4.

Also, because the dark current FPN is also dependent on the temperature Tc, when the temperature Tc changes, it is sufficient to multiply the arithmetic mean value $S_{drk}$ by the ratio of the current temperature to the past temperature, and subtract the multiplied value as the dark current FPN from the voltage signal Vsig4.

The dark current correction processing unit 124 supplies the net voltage signal Vsig4 minus the dark current FPN to the signal amount correction processing unit 125.

The signal amount correction processing unit 125 executes, on every pixel, a signal amount correction process that computes the pixel signal S4 according to Formula 1 on the basis of the voltage signals Vsig3 and Vsig4. The signal amount correction processing unit 125 supplies the pixel signal S4 to the camera signal processing unit 130.

Figure 21A:
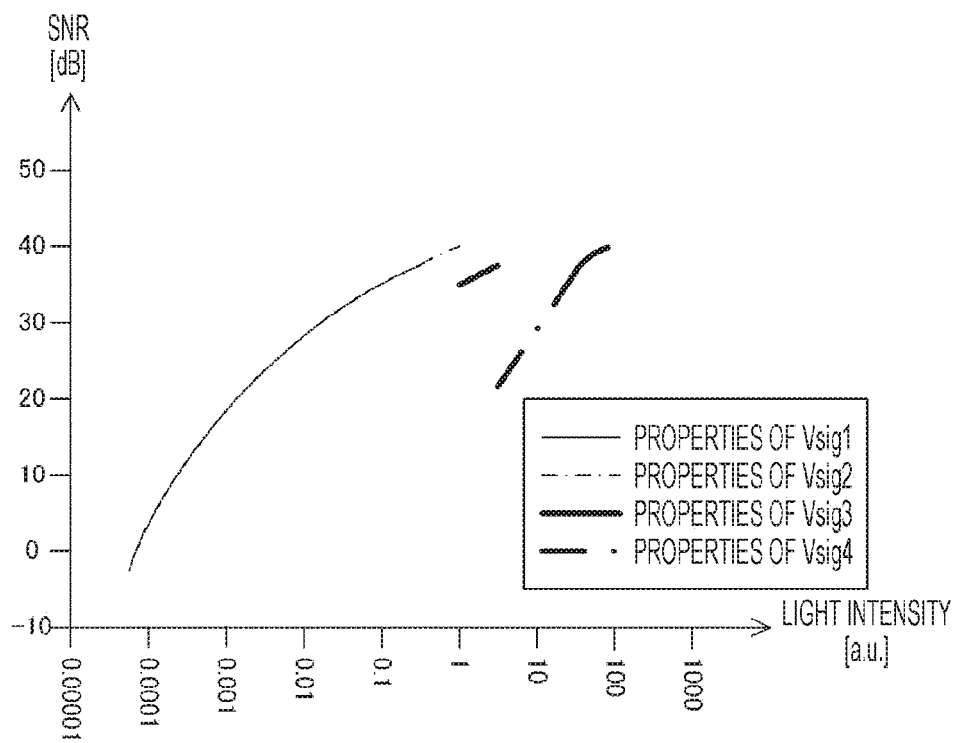
FIGS. 21A and 21B are graphs illustrating an example of the relationship between the signal-noise ratio (SNR) and the light intensity according to the first embodiment of the present technology.
Figure 21B:
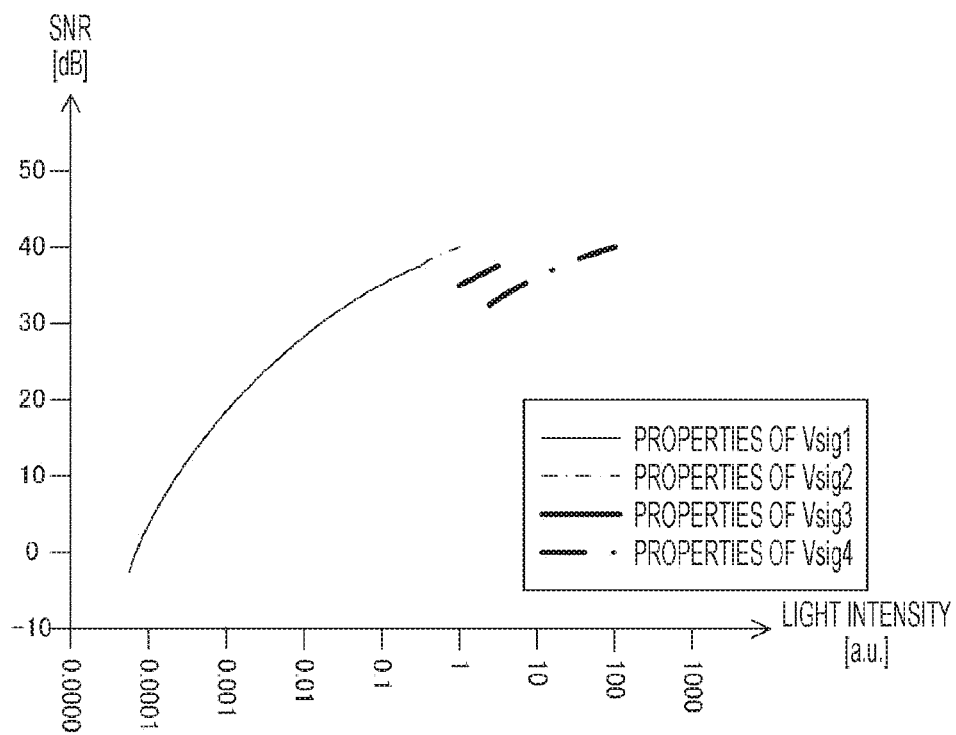

FIGS. 21A and 21B are graphs illustrating an example of the relationship between the SNR and the light intensity according to the first embodiment of the present technology. FIG. 21A illustrates the relationship between the SNR before the correction of the dark current FPN and the light intensity, and FIG. 21B illustrates the relationship between the corrected SNR and the light intensity. Also, in the diagram, the vertical axis represents the SNR, while the horizontal axis represents the light intensity. The thin solid line indicates the properties of the voltage signal Vsig1, and the thin chain line indicates the properties of the voltage signal Vsig2. The thick solid line indicates the properties of the voltage signal Vsig3, and the thick chain line indicates the properties of the voltage signal Vsig4.

As a precondition when computing the graph in FIG. 21A, the dark random noise is assumed to be 1.0 e in the case of high conversion efficiency. The photo response non-uniformity (PRNU) is 0.8% for the high-sensitivity photodiode 311 and 1.0% for the low-sensitivity photodiode 312. Also, the dark current non-uniformity (DCNU) at 60° C. is 5 electrons per second (e/s) for the high-sensitivity photodiode 311 and 2 electrons per seconds (e/s) for the low-sensitivity photodiode 312. Also, the conversion efficiency control transistor 327 and the charge storage unit 332 (SD) are 5,000 electrons per second (e/s). For a fixed exposure period under these conditions, for an SNR of 0 decibels (dB) or higher, the response range of incident light is 120 decibels (dB) or higher.

As a precondition when computing the graph of FIG. 21A, it is assumed that a dark current FPN suppression error of 10% occurs. In a bright scene (where the light intensity is 0.01 units or more), the correction does not cause the SNR to fall below 30 decibels (dB) throughout the entire range, and therefore unnatural noise steps proceeding from the bright portions to the dark portions of the image are greatly reduced.

[Exemplary Operations of Solid-State Imaging Element]

Figure 22:
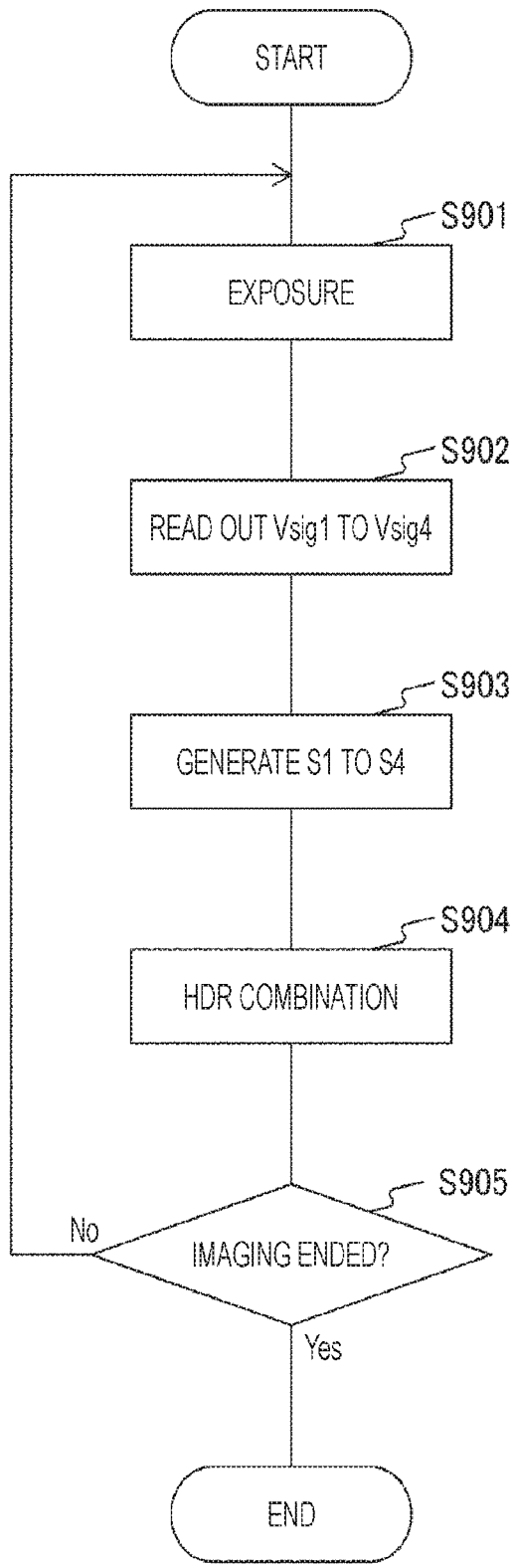
FIG. 22 is a flowchart illustrating an example of operations by an imaging device according to the first embodiment of the present technology.

FIG. 22 is a flowchart illustrating an example of operations by an imaging device 100 according to the first embodiment of the present technology. These operations are started when an application for capturing image data is executed, for example.

The solid-state imaging element 200 performs exposure for each row (step S901), and reads out the voltage signals Vsig1 to Vsig4 for each pixel (step S902). Thereafter, the solid-state imaging element 200 generates the pixel signals S1 to S4 from the voltage signals Vsig1 to Vsig4 for each pixel (step S903). The solid-state imaging element 200 combines the pixel signals S1 to S4 for each pixel and generates HDR image data (step S904).

The solid-state imaging element 200 determines whether or not imaging has ended in the application (step S905). In the case where imaging has not ended (step S905: No), the solid-state imaging element 200 repeats the process from step S901. On the other hand, in the case where imaging has ended (step S905: Yes), the solid-state imaging element 200 ends the operations.

In this way, according to the first embodiment of the present technology, because the conversion efficiency control transistor 327 opens and closes the pathway between the charge storage units 332 and 333, it is possible to open the pathway and improve the conversion efficiency when generating the voltage signal Vsig3.

[Modification]

In the first embodiment described above, the four voltage signals Vsig1 to Vsig4 are successively read out for each pixel, but the time until AD conversion ends becomes longer compared to the case of reading out a single signal for each pixel. A modification of the first embodiment differs from the first embodiment in that two ADCs are disposed for each column, and two rows are read out at the same time.

Figure 23:
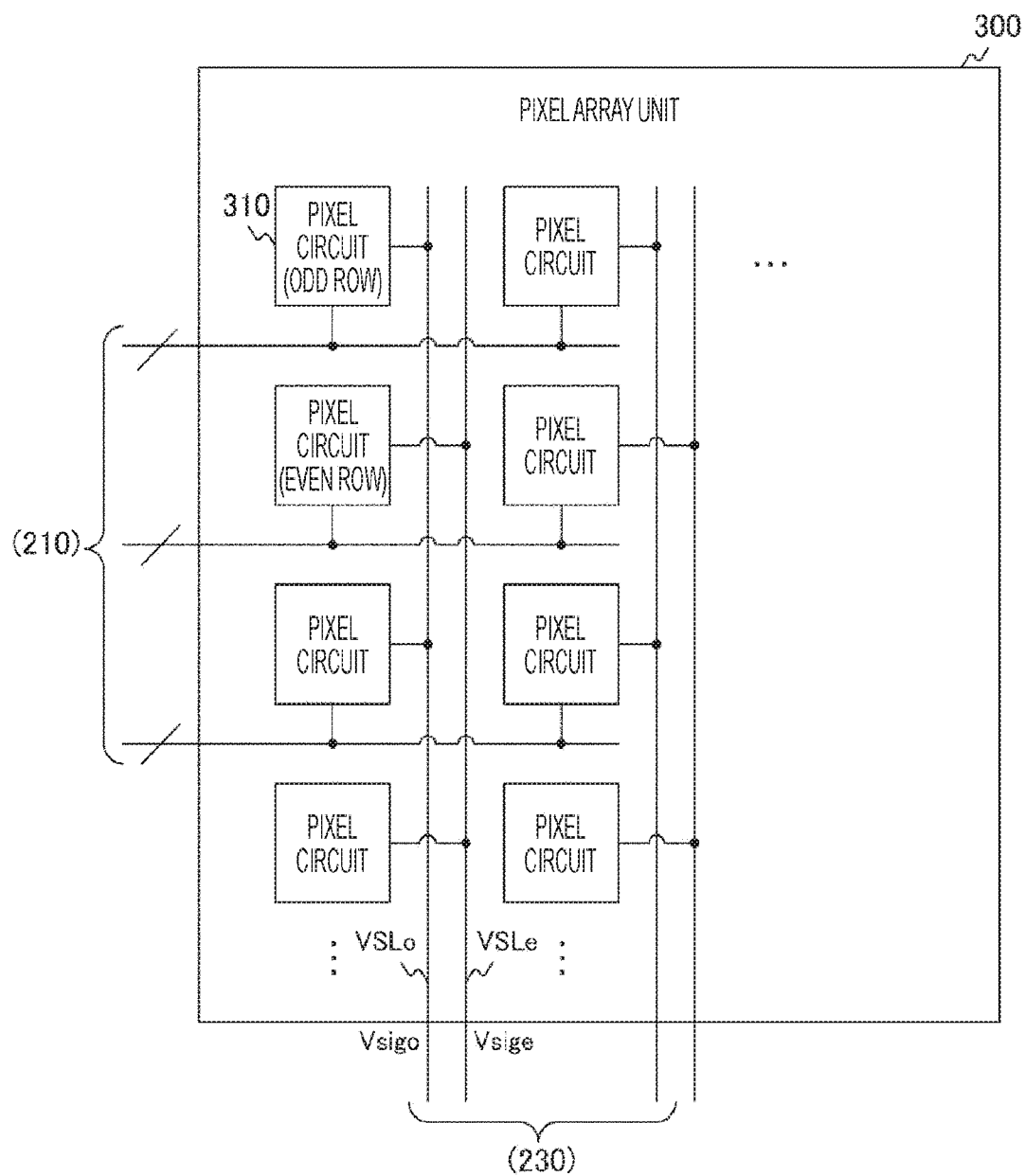
FIG. 23 is an example of a plan view of a pixel array unit according to a modification of the first embodiment of the present technology.

FIG. 23 is an example of a plan view of the pixel array unit 300 according to the modification of the first embodiment of the present technology. In the pixel array unit 300 according to the modification of the first embodiment, two vertical signal lines VSLo and VSLe are disposed for each column. The pixel circuits 310 on odd rows are each connected to the vertical signal line VSLo, while the pixel circuits 310 on even rows are each connected to the vertical signal line VSLe.

Figure 24:
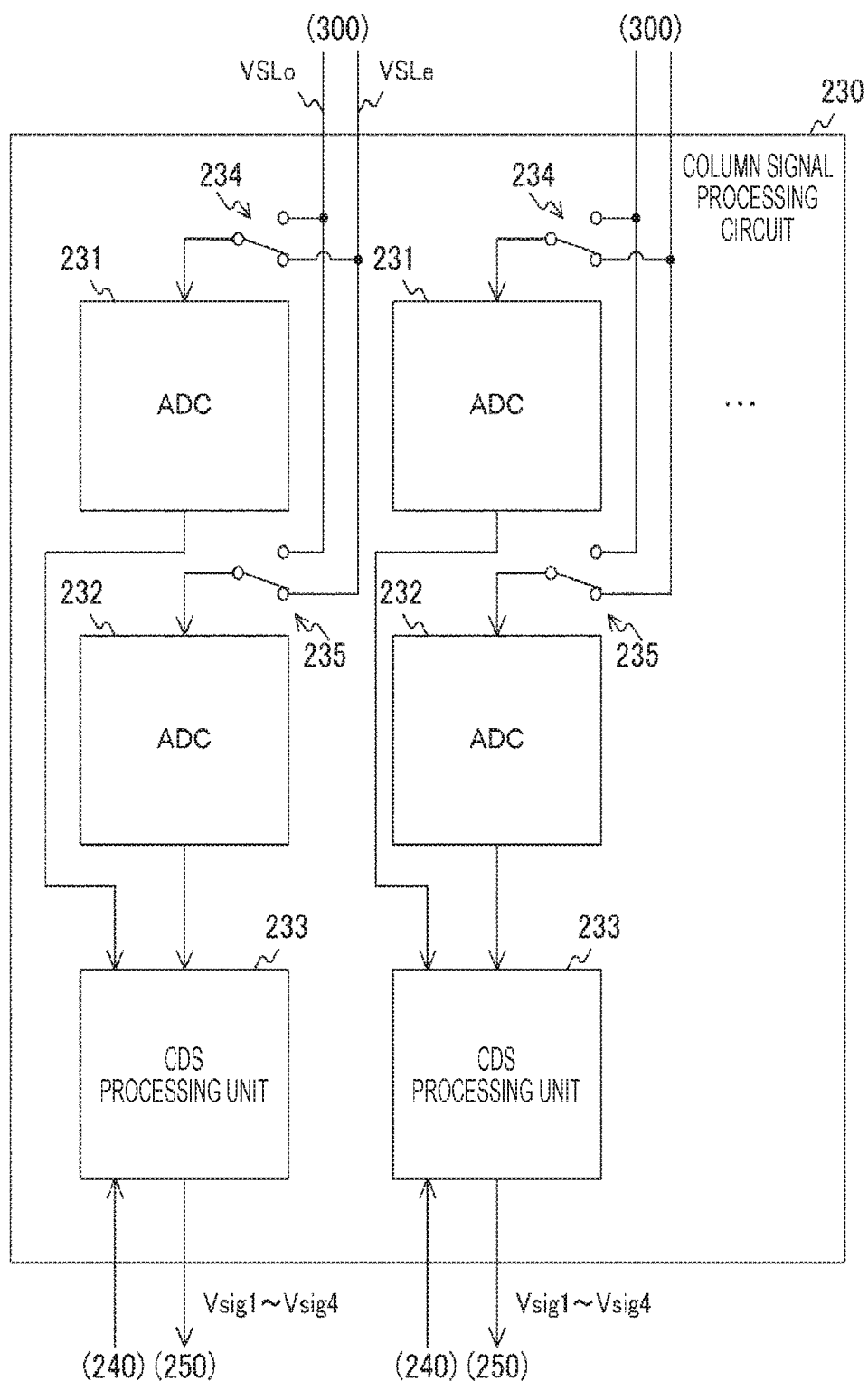
FIG. 24 is a block diagram illustrating an exemplary configuration of a column signal processing circuit according to a modification of the first embodiment of the present technology.

FIG. 24 is a block diagram illustrating an exemplary configuration of a column signal processing circuit 230 according to a modification of the first embodiment of the present technology. In the column signal processing circuit 230 according to the modification of the first embodiment, switches 234 and 235, ADCs 231 and 232, and the CDS processing unit 233 are disposed for each column.

The switch 234 connects one of the vertical signal lines VSLo and VSLe to the input terminal of the ADC 231 under control by the control circuit 220. The switch 235 connects one of the vertical signal lines VSLo and VSLe to the input terminal of the ADC 232 under control by the control circuit 220. Note that the switch 234 is one example of a first switch described in the claims, while the switch 235 is one example of a second switch described in the claims.

The ADC 231 AD-converts an analog voltage signal from the switch 234. The ADC 232 AD-converts an analog voltage signal from the switch 235. The ADCs 231 and 232 supply the AD-converted data to the CDS processing unit 233.

The CDS processing unit 233 performs the CDS process separately on the data from each of the ADC 231 and the ADC 232.

The vertical driving circuit 210 causes the voltage signal Vsig4 on an odd row and an even row to be output at the same time. At this time, the control circuit 220 controls the switches 234 and 235 to connect one of the ADCs 231 and 232 to the odd row and connect the other to the even row. These ADCs 231 and 232 read out and AD-convert the voltage signal Vsig4 of two rows at the same time. Because the voltage signal Vsig4 contains the P phase and the D phase, the AD conversion of the voltage signal Vsig4 requires 2 cycles. Because two rows are read out at the same time, the number of cycles per row is 1 cycle. Similarly, the voltage signals Vsig3 and Vsig2 of two rows are read out at the same time.

The vertical driving circuit 210 causes an odd row to output the voltage signal Vsig1, and causes the next even row to output the voltage signal Vsig1. At this time, the control circuit 220 connects one of the ADCs 231 and 232 to the odd row and connects the other to the even row. These ADCs 231 and 232 AD-convert the even row after AD-converting the odd row. Because the voltage signal Vsig1 contains the P phase and the D phase, the AD conversion requires 2 cycles. Because one row is read out at a time, the number of cycles per row is 2 cycles. The reason why the voltage signal Vsig1 of two rows cannot be read out at the same time is that the P phase and the D phase of the voltage signal Vsig1 cannot be read out consecutively, and it is necessary to read out the voltage signal Vsig2 in between.

As described above, because the voltage signals Vsig2 to Vsig4 on two rows are read out at the same time, the AD conversion requires 1 cycle per row. On the other hand, because the voltage signal Vsig1 is read out one row at a time, the AD conversion requires 2 cycles per row. Consequently, the number of cycles required for AD conversion of the voltage signals Vsig1 to Vsig4 is decreased from 8 cycles to 5 cycles per row.

Here, in the case of using a single-slope ADC in the solid-state imaging element 200, in the voltage signal Vsig1 output, it is necessary to replace the pixel signal with the same number of digital signals as the ADCs set to at least a plurality of different conversion efficiencies. Ordinarily, with an ADC having a resolution from 10 to 12 bits to be used, there is non-negligible quantization noise when performing AD conversion over the entire signal voltage range of the voltage signal Vsig1. Consequently, in the case in which the ADCs 231 and 232 are used for each column as described above, it is desirable to raise the AD conversion efficiency of the ADC in places where signal voltage is small, and set the AD conversion efficiency of the ADC to a minimum in places where the signal voltage is large. With this arrangement, the quantization noise can be lowered to or below the level of other dark random noise and light shot noise throughout the entire signal voltage range.

In this way, according to the modification of the first embodiment of the present technology, the ADCs 231 and 232 are disposed for each column and AD conversion is performed by reading out two rows at the same time, thereby making it possible to shorten the time taken by the AD conversion compared to the case of reading out one row at a time.

2. Second Embodiment

In the first embodiment described above, the drain diffusion region between the conversion efficiency control transistors 326 and 327 is used as the charge storage unit 332. However, with this configuration, because charge is stored in the drain region, it is necessary to widen the region to some degree, and the area of the high-sensitivity photodiode 311 and the low-sensitivity photodiode 312 may have to be narrowed correspondingly. The solid-state imaging element 200 according to a second embodiment differs from the first embodiment in that the conversion efficiency control transistors 326 and 327 are connected in series between the charge storage units 331 and 332, and the drain diffusion region is narrowed.

Figure 25:
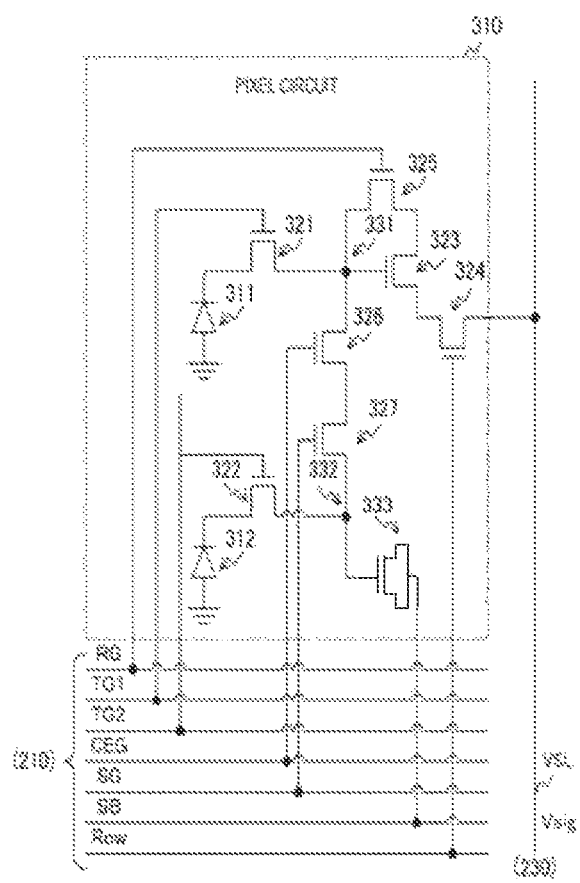
FIG. 25 is a circuit diagram illustrating an exemplary configuration of a pixel circuit according to the second embodiment of the present technology.

FIG. 25 is a circuit diagram illustrating an exemplary configuration of a pixel circuit 310 according to the second embodiment of the present technology. The pixel circuit 310 according to the second embodiment differs from the first embodiment in that the conversion efficiency control transistors 326 and 327 are connected in series between the charge storage units 331 and 332. Also, the charge storage unit 332 is connected directly to the charge storage unit 333.

Figure 26A:
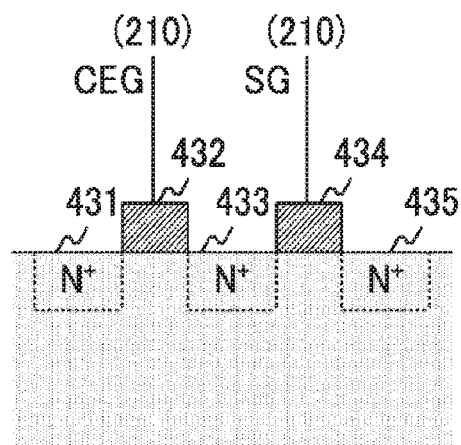
FIGS. 26A and 26B are examples of a cross section of a conversion efficiency control transistor according to the second embodiment of the present technology.
Figure 26B:
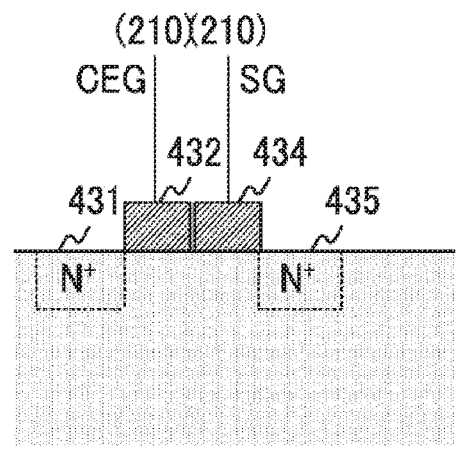

FIGS. 26A and 26B are examples of a cross section of a conversion efficiency control transistors 326 and 327 according to the second embodiment of the present technology. FIG. 26A is an example of a cross section in the case of disposing a drain diffusion region between the conversion efficiency control transistors 326 and 327, while FIG. 26B is an example of a cross section in the case of not disposing a drain diffusion region.

On a silicon substrate, an N'diffusion region 433 is formed between gates 432 and 434. Also, an N$^+$ diffusion region 431 is formed adjacent to the gate 432, and an N$^+$ diffusion region 435 is formed adjacent to the gate 434. The gate 432 is the gate of the conversion efficiency control transistor 326, while the gate 434 is the gate of the conversion efficiency control transistor 327. The N$^+$ diffusion region 433 corresponds to the drain diffusion region of the conversion efficiency control transistor 326.

As described earlier, because the drain diffusion region (N+diffusion region 433) is not used as a charge storage unit, the drain diffusion region can be narrowed compared to the first embodiment. As illustrated by the example in FIG. 26B, the gate 434 can also be disposed close to the gate 432 without a drain region in between. By narrowing the drain diffusion region compared to the first embodiment, the photodiode area can be expanded correspondingly.

Figure 27:
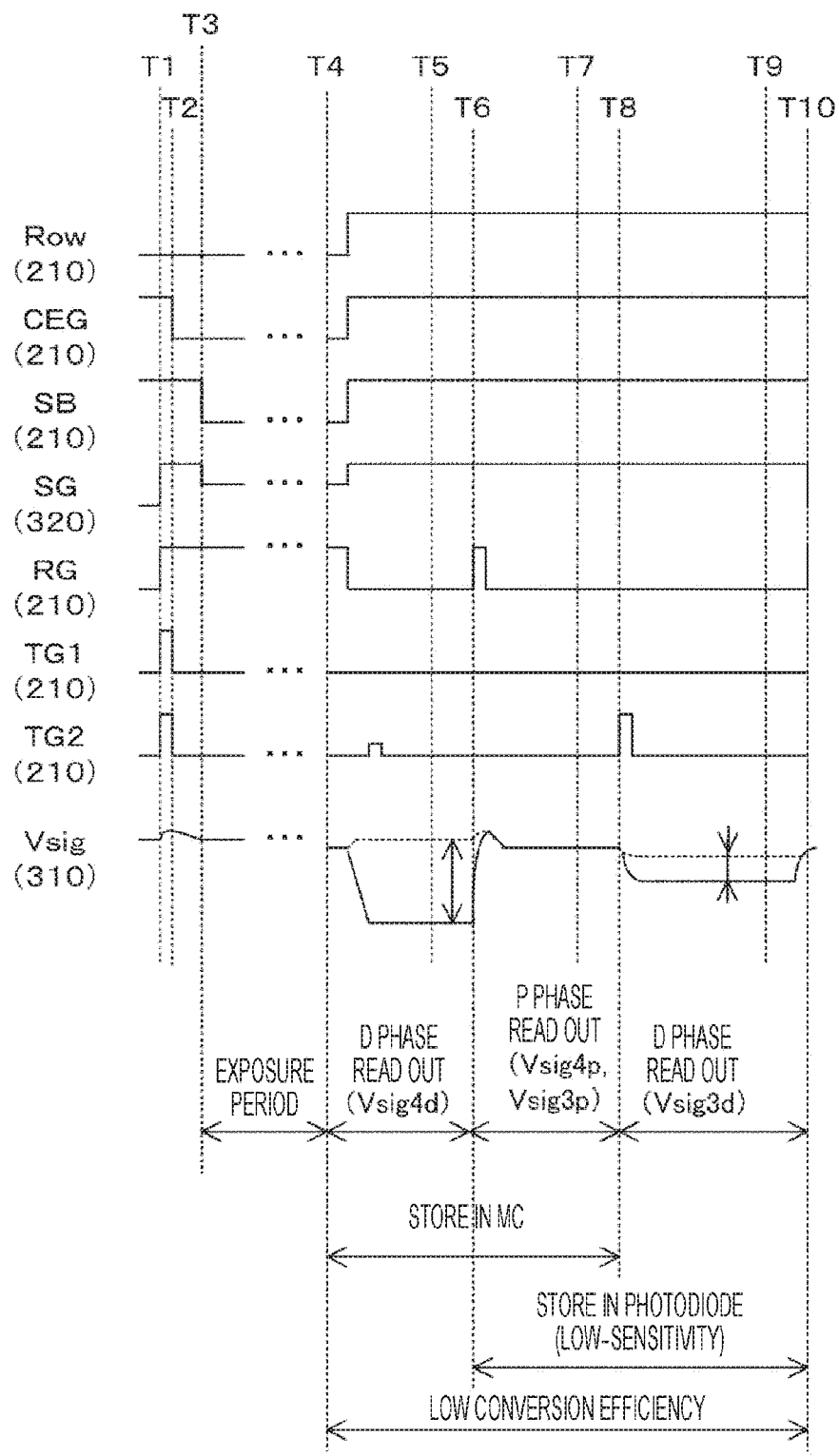
FIG. 27 is an example of a timing chart illustrating an operation of reading out a signal from a low-sensitivity photodiode according to the second embodiment of the present technology.

FIG. 27 is an example of a timing chart illustrating an operation of reading out a signal from a low-sensitivity photodiode 312 according to the second embodiment of the present technology. In the second embodiment, the control from the timing T1 to the timing T7 is similar to the first embodiment. However, from the timing T6 to the timing T8, the voltage signal that is read out is used as the P phase of both the voltage signals Vsig3 and Vsig4. In other words, the voltage signals Vsig3$p$ and Vsig4$p$ are read out at the same time.

At the timing T8, the vertical driving circuit 210 supplies the readout pulse TG2 for the duration of the pulse period. From the timing T8 to the timing T10, the solid-state imaging element 200 reads out a voltage signal sVsig as the D phase voltage signal Vsig3$d$.

Figure 28:
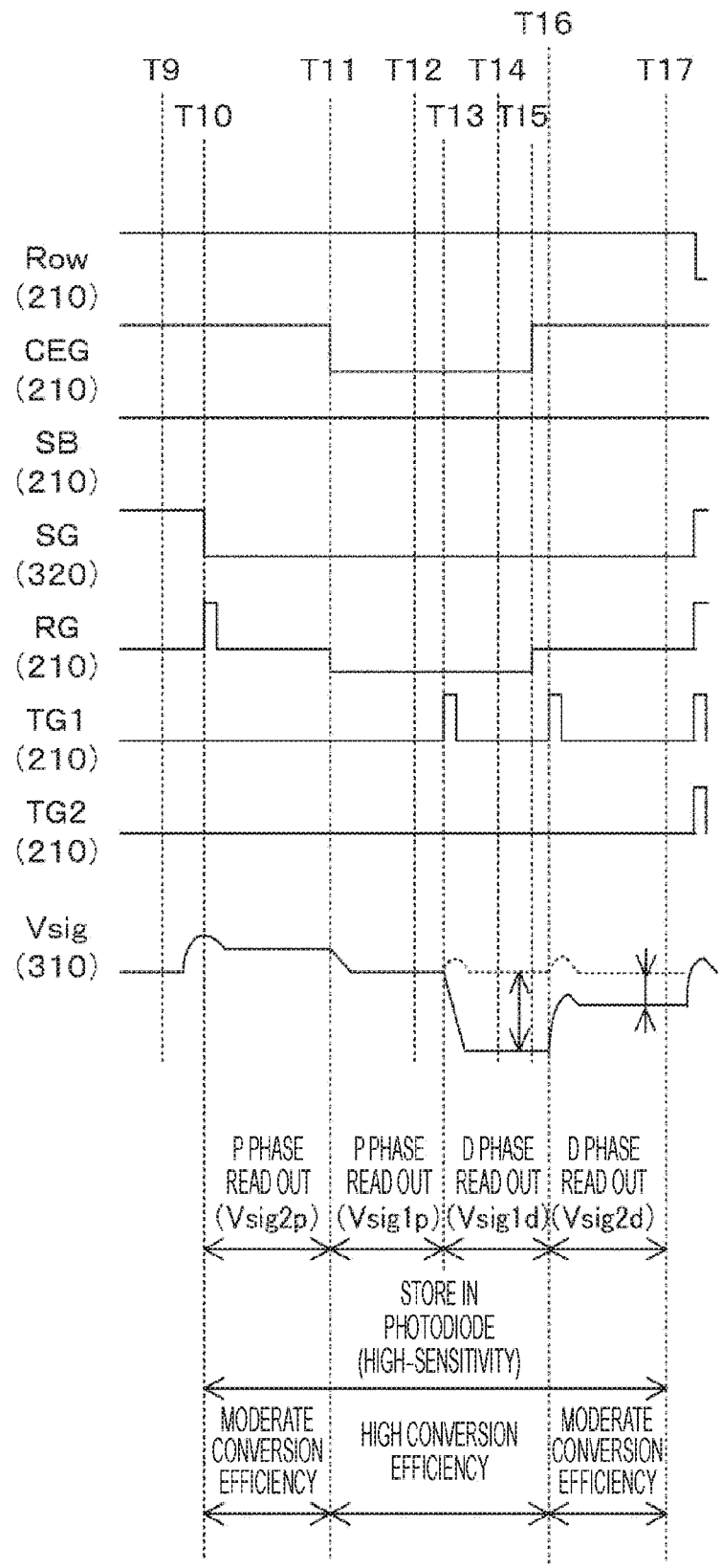
FIG. 28 is an example of a timing chart illustrating an operation of reading out a signal from a high-sensitivity photodiode according to the second embodiment of the present technology.

FIG. 28 is an example of a timing chart illustrating an operation of reading out a signal from a high-sensitivity photodiode 311 according to the second embodiment of the present technology.

At the timing T10, the vertical driving circuit 210 supplies the high-level reset gate pulse RG for the duration of the pulse period. From the timing T10 to a timing T17, charge is stored in the high-sensitivity photodiode 311. Further, charge is converted to voltage at the moderate conversion efficiency from the timing T10 to a timing T11. Then, from the timing T10 to the timing T11, the solid-state imaging element 200 reads out the voltage signal Vsig as the P phase voltage signal Vsig2$p$.

Next, at the timing T11, the vertical driving circuit 210 sets the conversion efficiency switching pulse CEG to the low level, and sets the reset gate pulse RG to a low level that is lower than immediately before. From the timing T11 to a timing T16, charge is converted to voltage at the highest conversion efficiency. Also, from the timing T11 to a timing T13, the solid-state imaging element 200 reads out the voltage signal Vsig as the P phase voltage signal Vsig1$p$.

At the timing T13, the vertical driving circuit 210 supplies the high-level readout pulse TG1 for the duration of the pulse period. From the timing T13 to the timing T16, the solid-state imaging element 200 reads out a voltage signal Vsig as the D phase voltage signal Vsig1$d$.

At a timing T15, the vertical driving circuit 210 sets the conversion efficiency switching pulse CEG to the high level, and supplies the high-level readout pulse TG1 for the duration of the pulse period from the immediate following timing T16. Also, at the timing T15, the vertical driving circuit 210 returns the reset gate pulse RG to the level before the timing T11. Also, from the timing T16 to a timing T17, charge is converted to voltage at the moderate conversion efficiency. Also, at this time, the solid-state imaging element 200 reads out the voltage signal Vsig as the D phase voltage signal Vsig2$d$.

Figure 29A:
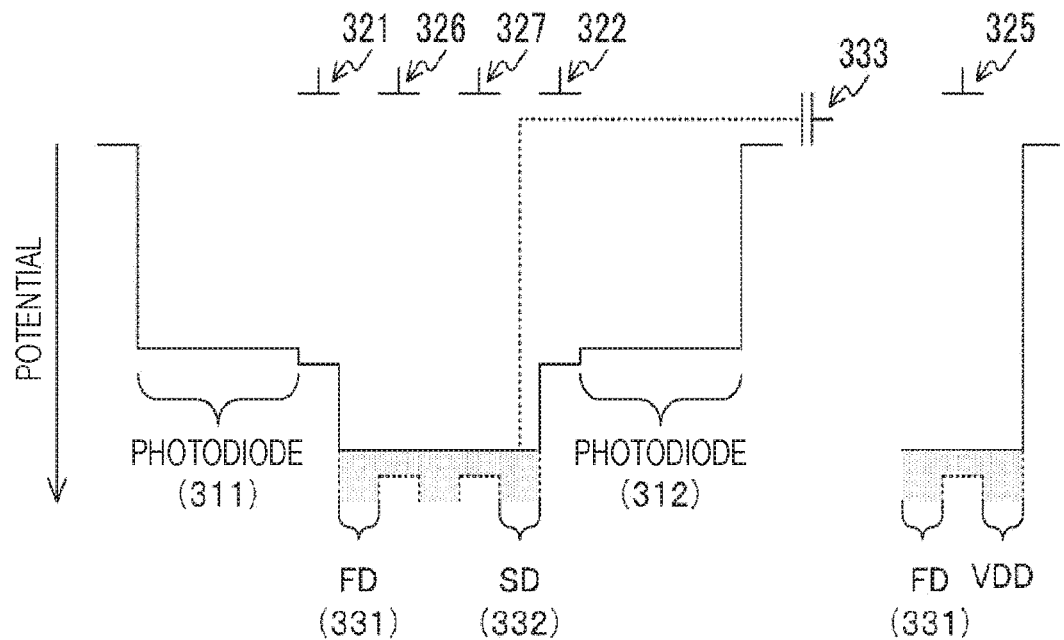
FIGS. 29A and 29B are examples of a potential diagram during initialization according to the second embodiment of the present technology.
Figure 29B:
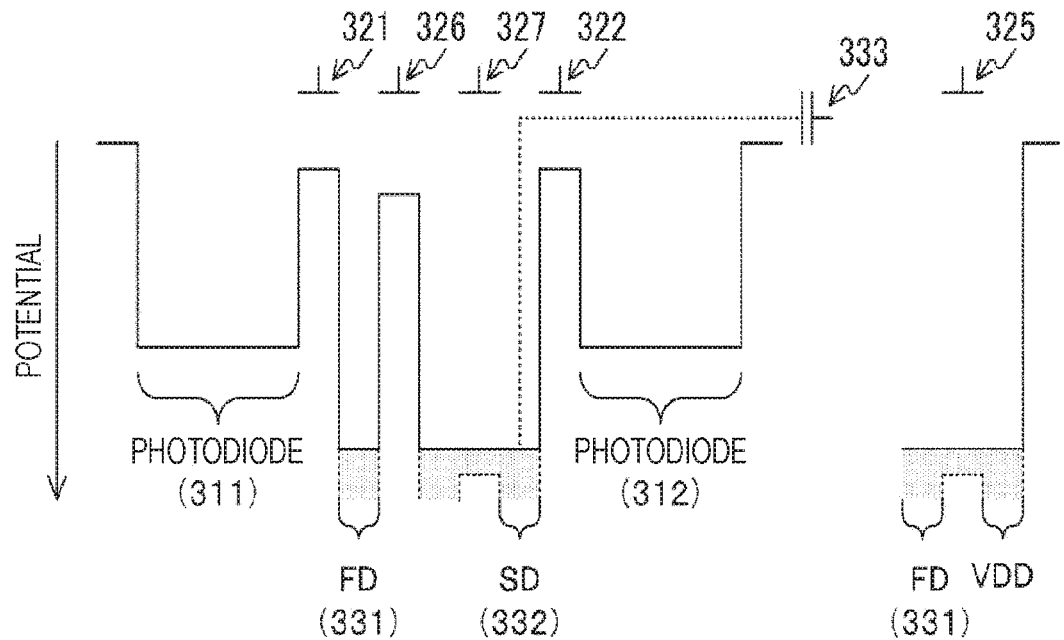

FIGS. 29A and 29B are examples of a potential diagram during initialization according to the second embodiment of the present technology. In the diagram, the potentials of each of the charge storage unit 331 such as an FD and the charge storage unit 332 such as an SD are denoted. Additionally, the potentials of each of the high-sensitivity photodiode 311 and the low-sensitivity photodiode 312 are also denoted. Also, the potential between the high-sensitivity photodiode 311 and the charge storage unit 331 is the gate potential of the high-sensitivity-side transfer transistor 321, while the potential between the charge storage units 331 and 332 is the gate potential of each of the conversion efficiency control transistors 326 and 327. The potential between the low-sensitivity photodiode 312 and the charge storage unit 332 is the gate potential of the low-sensitivity-side transfer transistor 322, while the potential between the charge storage unit 331 and a power supply voltage VDD is the gate potential of the reset transistor 325.

At the timing T1, each of the charge storage units 331 to 333 is initialized to the same potential as the power supply voltage VDD. Additionally, at the timing T2, the vertical driving circuit 210 supplies the readout pulses TG1 and TG2 at the low level to the high-sensitivity-side transfer transistor 321 and the low-sensitivity-side transfer transistor 322. Also, the vertical driving circuit 210 supplies the conversion efficiency switching pulse CEG at the low-level to the conversion efficiency control transistor 326.

Figure 30A:
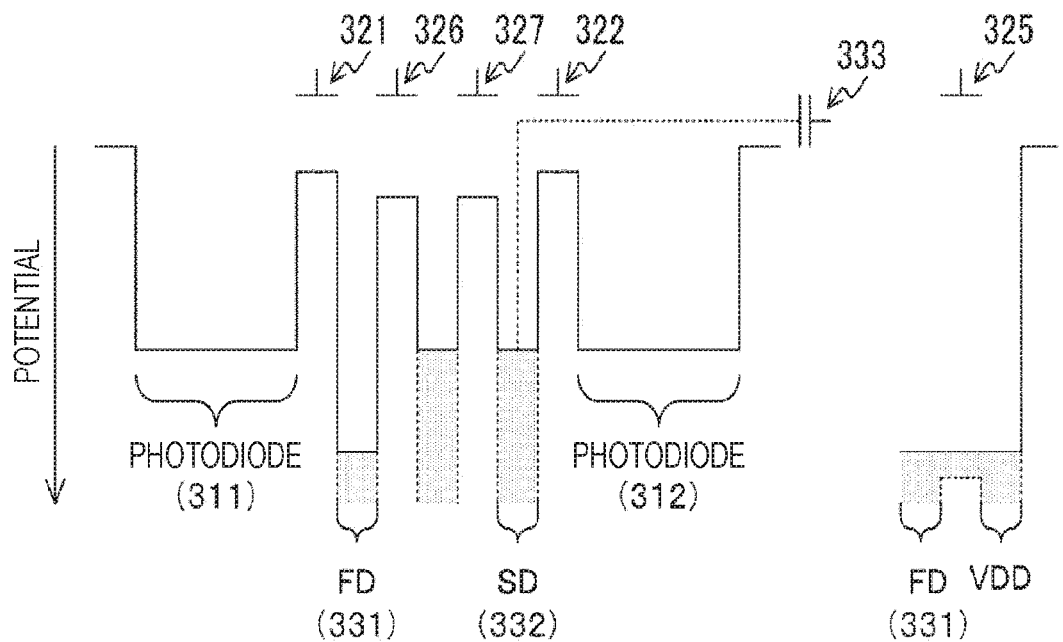
FIGS. 30A and 30B are examples of a potential diagram at the start of exposure and the end of exposure according to the second embodiment of the present technology.
Figure 30B:
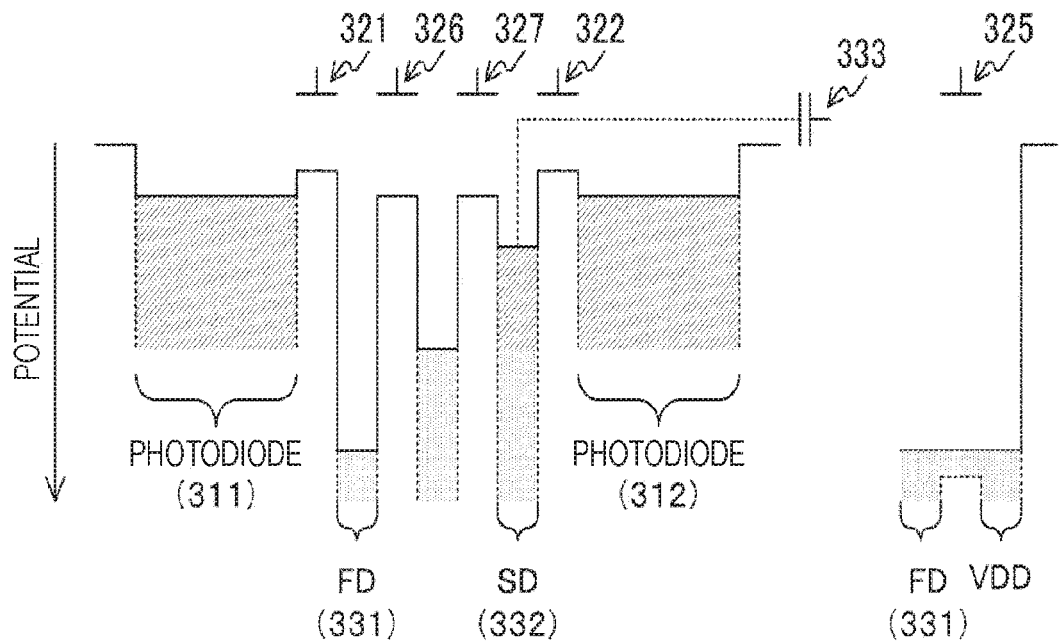

FIGS. 30A and 30B are examples of a potential diagram at the start of exposure and the end of exposure according to the second embodiment of the present technology. FIG. 8A is a potential diagram at the exposure start timing T3, while FIG. 8B is a potential diagram at the exposure end timing T4.

At the timing T3, the vertical driving circuit 210 sets the source bias pulse SB to the charge storage unit 333 (MC) to the low level. Note that at the timing T3, the vertical driving circuit 210 can also control the conversion efficiency switching pulse CEG to a middle level to further relax the high electric field in the channel part of the conversion efficiency control transistor 327.

At the timing T4, signal charge is stored in the high-sensitivity photodiode 311 and the low-sensitivity photodiode 312. Also, in accordance with the intensity of the incident light, signal charge overflowing from the low-sensitivity photodiode 312 is stored in the charge storage units 332 (SD) and 333 (MC).

Figure 31A:
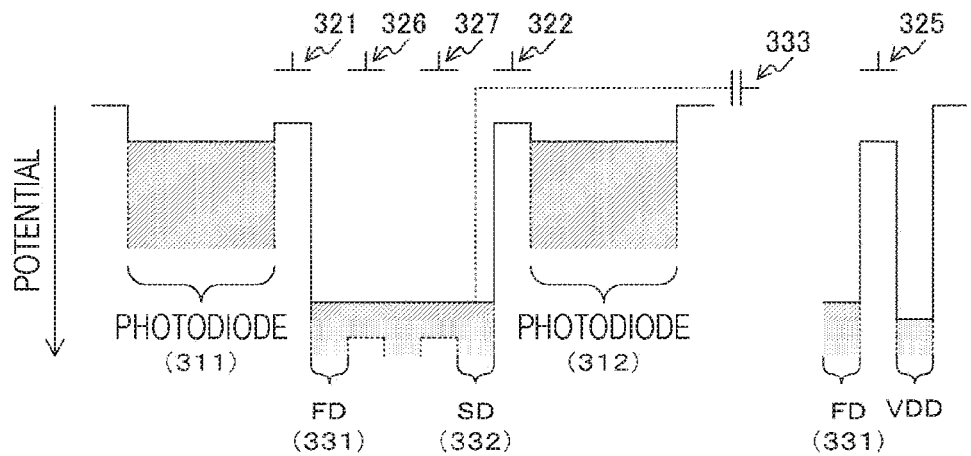
FIGS. 31A, 31 B, and 31C are examples of a potential diagram when reading out a P phase and a D phase from the low-sensitivity photodiode according to the second embodiment of the present technology.
Figure 31B:
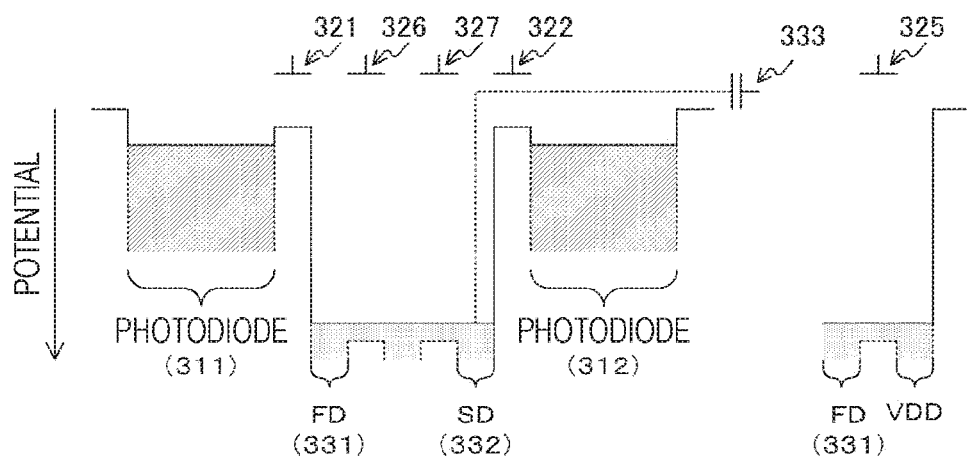
Figure 31C:
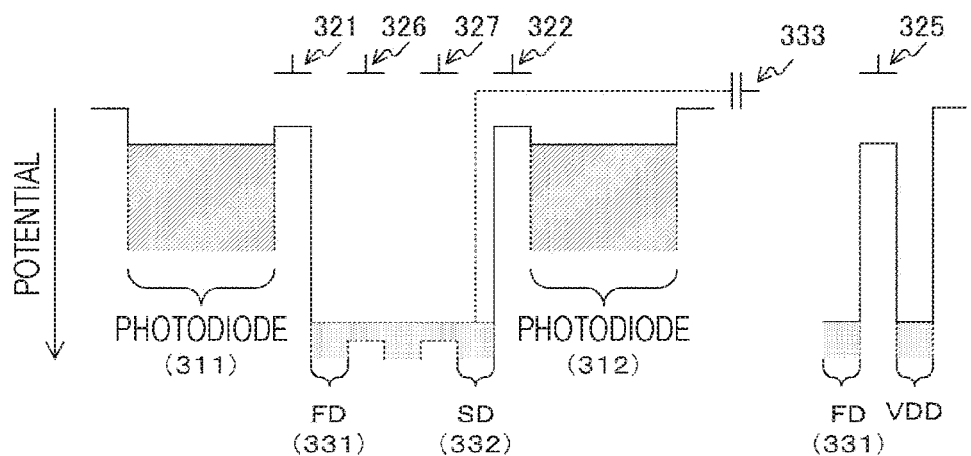

FIGS. 31A, 31B, and 31C are examples of a potential diagram when reading out the P phase and the D phase from the low-sensitivity photodiode 312 according to the second embodiment of the present technology. FIG. 9A is an example of a potential diagram at the timing T5 at which the D phase readout is performed. FIG. 9B is an example of a potential diagram at the timing T6 at which the charge storage units 331 to 333 are initialized, and FIG. 9C is an example of a potential diagram at the timing T7 at which the P phase readout is performed.

At the timing T5, the vertical driving circuit 210 sets the source bias pulse SB to the charge storage unit 333 to the high level, switches off the reset transistor 325, and switches on the conversion efficiency control transistors 326 and 327. With this arrangement, overflowing charge is transferred to the charge storage unit 331 and the like. Then, the potential change of the charge storage unit 331 according to the signal charge overflowing from the low-sensitivity photodiode 312 is amplified by the charge storage unit 333, and appears as a change in the voltage on the vertical signal line VSL through the select transistor 324 that is switched on. The signal from the vertical signal line VSL at this time is read out as the D phase voltage signal Vsig4$d$. The conversion efficiency is the lowest at this time because the conversion efficiency control transistors 326 and 327 and the charge storage unit 333 (MC) having a particularly large capacitor are connected to the charge storage unit 331 (FD).

Next, at the timing T6, when the vertical driving circuit 210 sets the reset gate pulse RG to the reset transistor 325 to the high level, the overflowing signal charge is discharged by the power supply voltage VDD, and the potential of the charge storage unit 331 (FD) becomes a reference potential.

Additionally, at the timing T7, the vertical driving circuit 210 returns the reset gate pulse RG to the reset transistor 325 to the low level. With this arrangement, the P phase voltage signal Vsig4$p$ appears on the vertical signal line VSL while the charge storage unit 331 (FD) is at the reference potential. This signal is also used as the P phase voltage signal Vsig3$p$. At this point in time, because the D phase Vsig4$d$ and the P phase Vsig4$p$ of the voltage signal Vsig4 have been obtained, the column signal processing circuit 230 samples the two and computes the difference to acquire the voltage signal Vsig4 due to the overflowing charge.

Figure 32A:
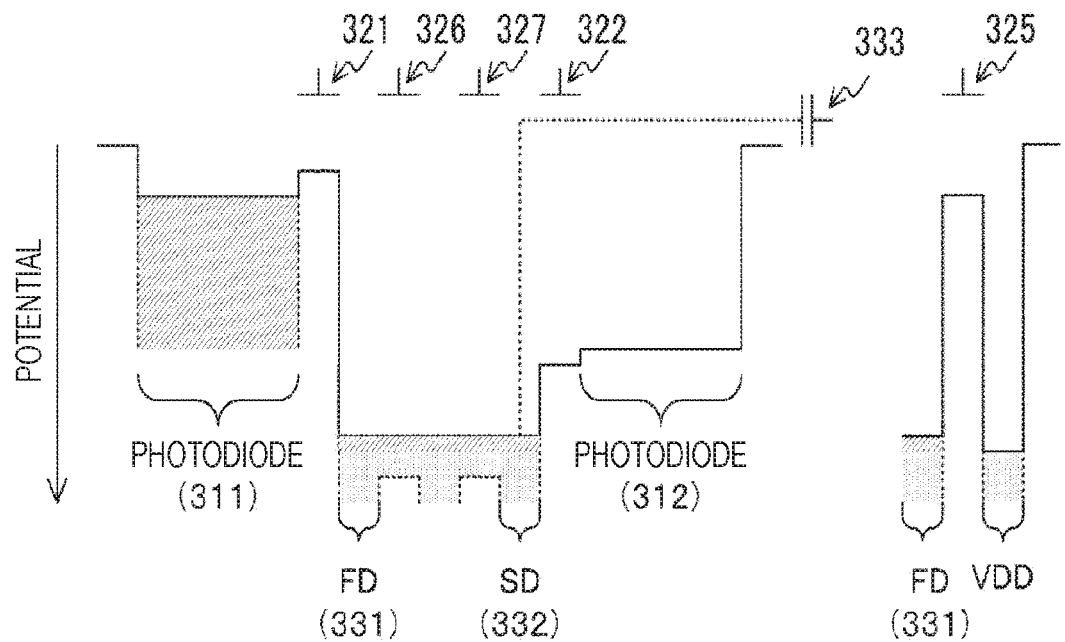
FIGS. 32A and 32B are examples of a potential diagram when reading out a D phase from the low-sensitivity photodiode according to the second embodiment of the present technology.
Figure 32B:
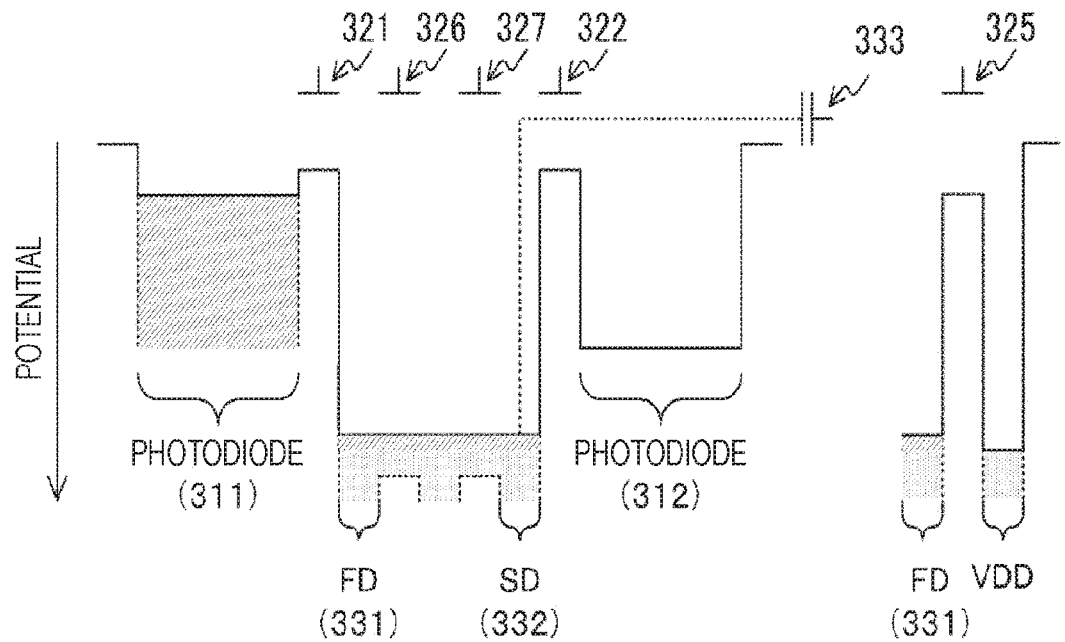

FIGS. 32A and 32B are examples of a potential diagram when reading out a D phase from the low-sensitivity photodiode 312 according to the second embodiment of the present technology. FIG. 32A is an example of a potential diagram at the timing T8, and FIG. 32B is an example of a potential diagram at the timing T9 at which the D phase readout is performed.

At the timing T8, the vertical driving circuit 210 sets the readout pulse TG2 to the low-sensitivity-side transfer transistor 322 to the high level, and at the timing T9, returns the readout pulse TG2 to the low level. With this arrangement, the potential change of the charge storage unit 331 (FD) according to the signal charge stored in the low-sensitivity photodiode 312 is amplified by the amplification transistor 323, and appears on the vertical signal line VSL through the select transistor 324. This signal corresponds to the D phase voltage signal Vsig3$d$. At this point in time, because the D phase Vsig3$d$ and the P phase Vsig3$p$ of the voltage signal Vsig3 have been obtained, the column signal processing circuit 230 samples the two and computes the difference to acquire the voltage signal Vsig3 due to the overflowing charge.

Figure 33A:
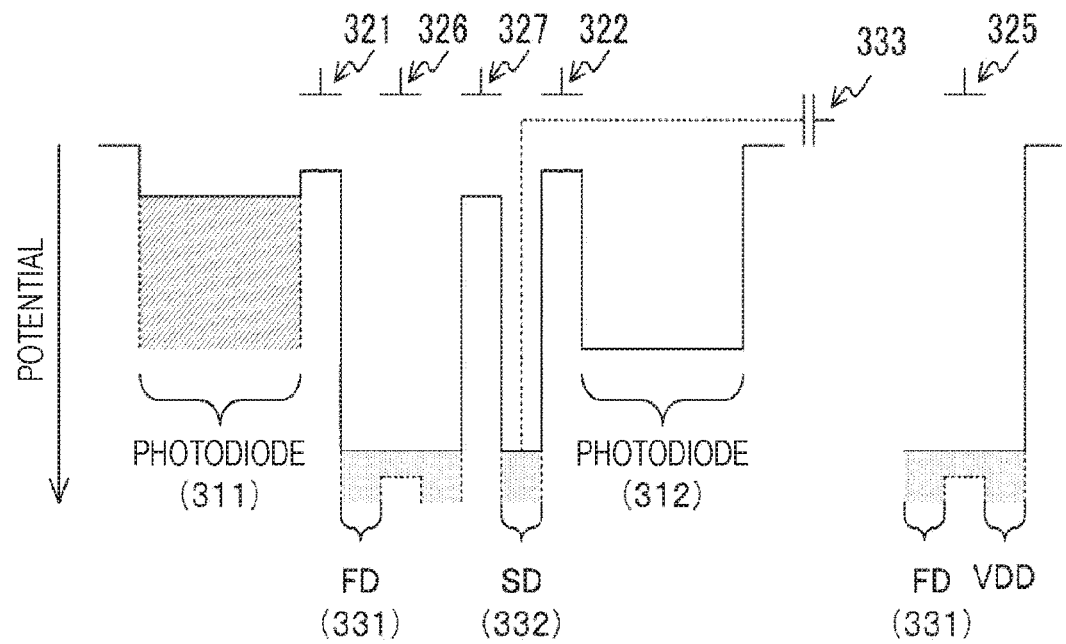
FIGS. 33A and 33B are examples of a potential diagram when reading out the P phase at medium conversion efficiency from the high-sensitivity photodiode according to the second embodiment of the present technology.
Figure 33B:
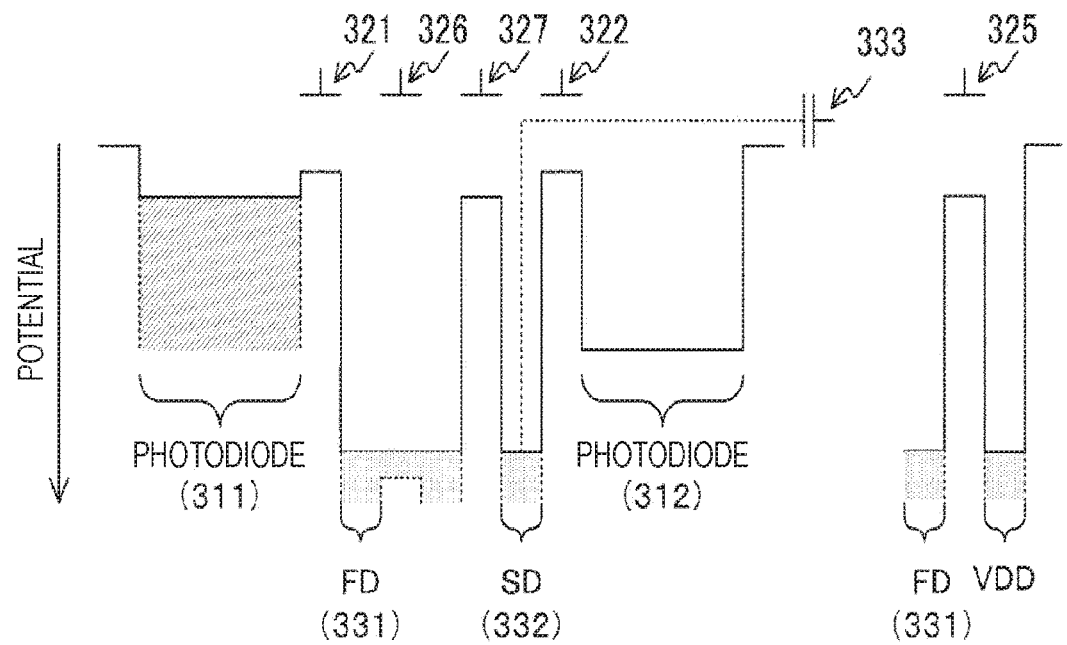

FIGS. 33A and 33B are examples of a potential diagram when reading out a P phase at medium conversion efficiency from the high-sensitivity photodiode 311 according to the second embodiment of the present technology. FIG. 33A is an example of a potential diagram at the timing T10 at which the charge storage unit 331 and the like are initialized, and FIG. 33B is an example of a potential diagram at the timing T11 at which the P phase readout is performed.

At the timing T10, the vertical driving circuit 210 sets the reset gate pulse RG to the reset transistor 325 to the high level. With this arrangement, the potential of the charge storage unit 331 (FD) is reset to the power supply voltage VDD.

At the timing T11, the vertical driving circuit 210 returns the reset gate pulse RG to the reset transistor 325 to a low level. With this arrangement, the P phase voltage signal Vsig2$p$ appears on the vertical signal line VSL. At this time, because the conversion efficiency switching pulse CEG to the conversion efficiency control transistor 326 is at the high level, the conversion efficiency is an intermediate value.

Figure 34A:
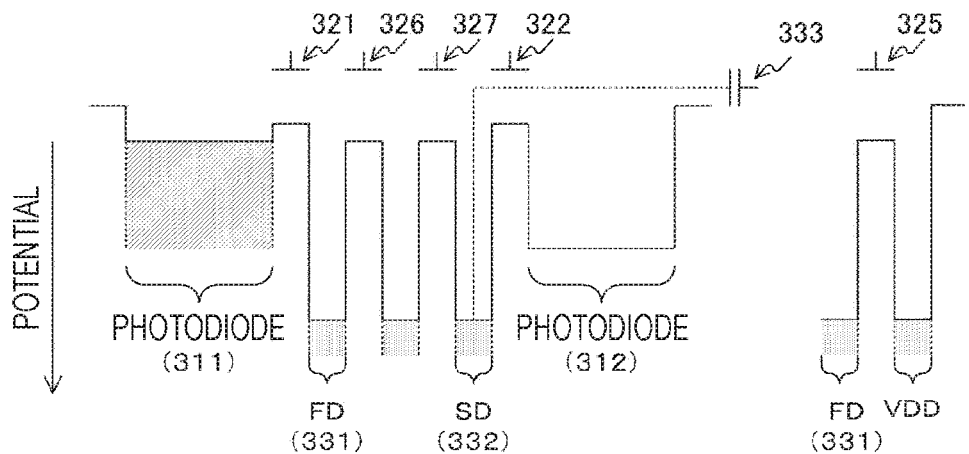
FIGS. 34A, 34B, and 34C are examples of a potential diagram when reading out the P phase and the D phase at high conversion efficiency from the high-sensitivity photodiode according to the second embodiment of the present technology.
Figure 34B:
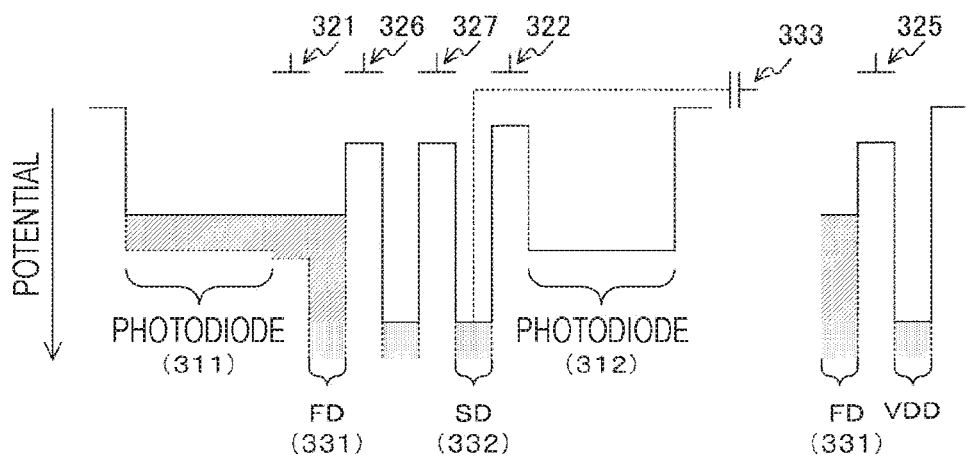
Figure 34C:
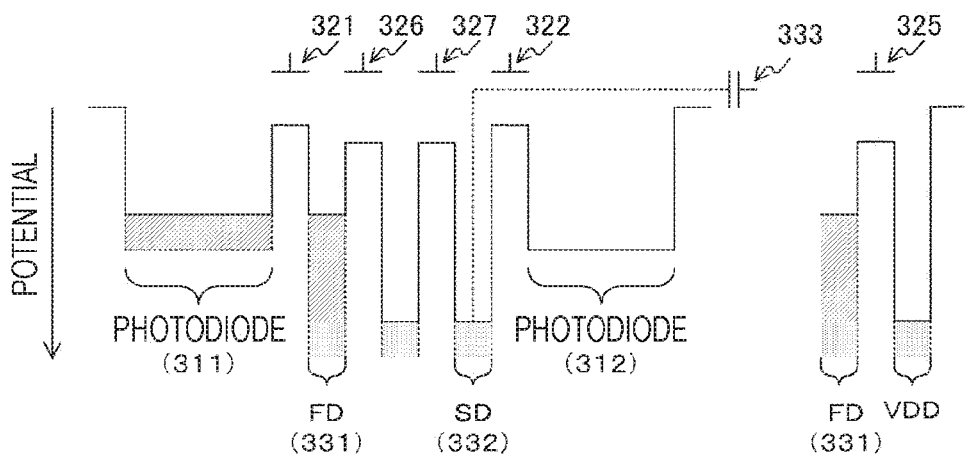

FIGS. 34A, 34B, and 34C are examples of a potential diagram when reading out the P phase and the D phase at high conversion efficiency from the high-sensitivity photodiode 311 according to the second embodiment of the present technology. FIG. 34A is an example of a potential diagram at the timing T12 at which the P phase readout is performed. FIG. 34B is an example of a potential diagram at the timing T13, and FIG. 34C is an example of a potential diagram at the timing T14 at which the D phase readout is performed.

At the timing T12, the vertical driving circuit 210 sets the conversion efficiency switching pulse CEG to the conversion efficiency control transistor 326 to the low level. With this arrangement, because the capacitance of the channel region of the conversion efficiency control transistor 326 is isolated from the capacitance of the charge storage unit 331 (FD), the conversion efficiency is at the maximum. At this time, the P phase voltage signal Vsig1$p$ appears on the vertical signal line VSL.

At the timing T13, the vertical driving circuit 210 sets the readout pulse TG1 to the high level, and at the timing T14, returns the readout pulse TG1 to the low level. With this arrangement, the potential of the charge storage unit 331 (FD) changes according to the signal charge stored in the high-sensitivity photodiode 311, and the D phase voltage signal Vsig1*d* appears on the vertical signal line VSL. However, in the case where the signal charge of the high-sensitivity photodiode 311 exceeds the maximum value of the signal charge that the charge storage unit 331 (FD) is capable of accepting, a part of the signal charge remains in the high-sensitivity photodiode 311. In this case, because the signal charge cannot be used for the voltage signal Vsig1*d*, a signal is obtained when outputting the voltage signal Vsig2.

Figure 35A:
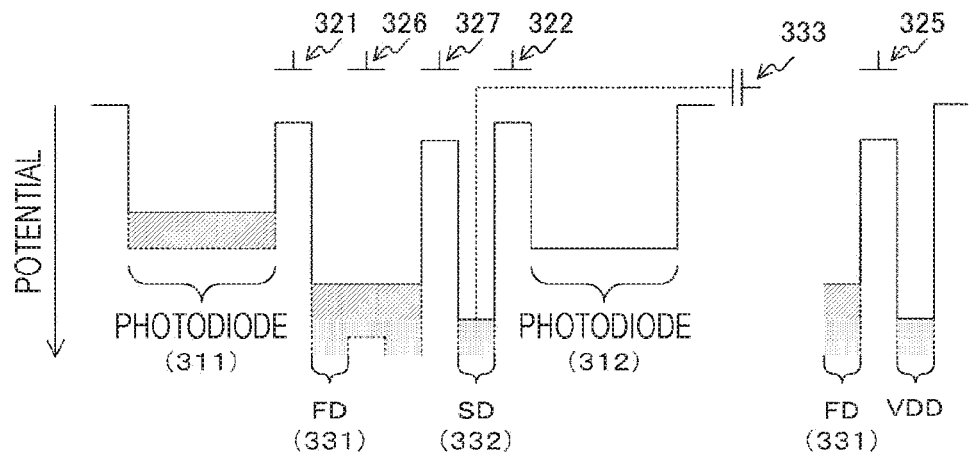
FIGS. 35A, 35B, and 35C are examples of a potential diagram when reading out the D phase at medium conversion efficiency from the high-sensitivity photodiode according to the second embodiment of the present technology.
Figure 35B:
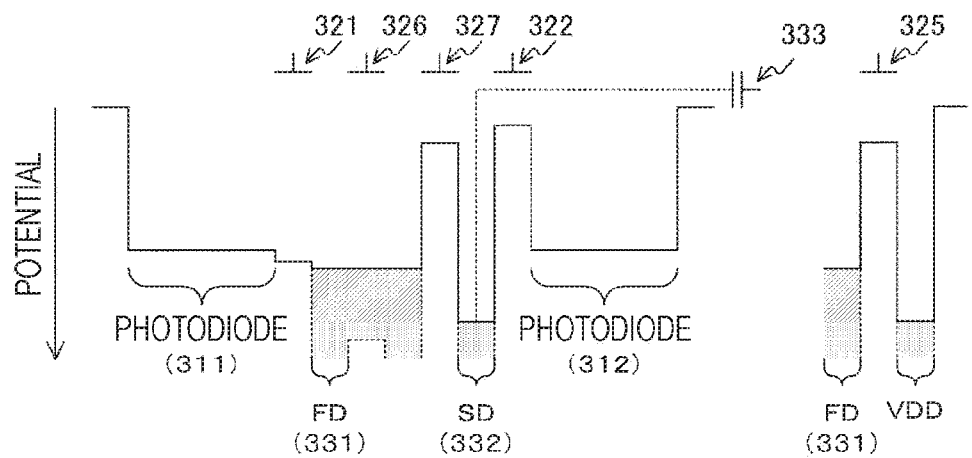
Figure 35C:
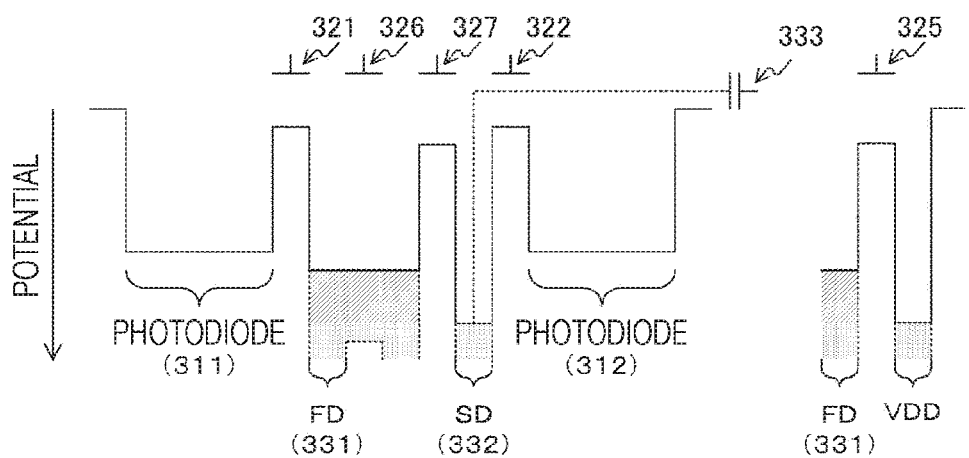

FIGS. 35A, 35B, and 35C are examples of a potential diagram when reading out the D phase at medium conversion efficiency from the high-sensitivity photodiode 311 according to the second embodiment of the present technology. FIG. 35A is an example of a potential diagram at the timing T15 at which the conversion efficiency is switched. FIG. 35B is an example of a potential diagram at the timing T16, and FIG. 35C is an example of a potential diagram at the timing T17 at which the D phase readout is performed.

At the timing T15, the vertical driving circuit 210 sets the conversion efficiency switching pulse CEG to the conversion efficiency control transistor 326 to the high level. With this arrangement, the conversion efficiency is switched to an intermediate value.

At the timing T16 immediately afterward, the vertical driving circuit 210 sets the readout pulse TG1 to the high level, and at the timing T17, returns the readout pulse TG1 to the low level. With this arrangement, the signal charge transferred from the high-sensitivity photodiode 311 is converted to the potential of the charge storage unit 331 (FD) at the intermediate conversion efficiency. This potential is amplified by the amplification transistor 323 and appears as the D phase voltage signal Vsig2*d* on the vertical signal line VSL through the select transistor 324. The column signal processing circuit 230 acquires the net voltage signal Vsig1 by performing the CDS process on the P phase voltage signal Vsig1*p* and the D phase voltage signal Vsig1*d*. Also, the column signal processing circuit 230 acquires the net voltage signal Vsig2 by performing the CDS process on the P phase voltage signal Vsig2*p* and the D phase voltage signal Vsig2*d*.

FIG. 36 is a table illustrating an example of the relationship between the input and output signals of a correction processing unit 120 according to the second embodiment of the present technology. The correction processing unit 120 according to the second embodiment differs from the first embodiment by computing the pixel signal S4 using the following formula instead of Formula 1.

$S4 = Vsig4 + Vsig3$

FIG. 37 is a table illustrating an example of the characteristics of each voltage signal according to the second embodiment of the present technology. In the second embodiment, the conversion efficiency when outputting the voltage signal Vsig3 is different from the first embodiment. The conversion efficiency at this time is the lowest, and is 5 microvolts per electron (μV/e), for example.

Also, unlike the first embodiment, the signal charge corresponding to the voltage signal Vsig4 is stored in the charge storage unit 333 (MC) and the low-sensitivity photodiode 312.

As described above, because the charge storage unit 333 (MC) is directly connected to the low-sensitivity-side transfer transistor 322, the signal charge of the low-sensitivity photodiode 312 is converted at the lowest conversion efficiency and output as the voltage signal Vsig3. For this reason, dark random noise increases compared to the first embodiment, and the SNR step between the voltage signals Vsig2 and Vsig3 increases slightly. However, because the dark current that is produced mainly in the gate region of the conversion efficiency control transistor 327 during the exposure period in the first embodiment does not exist in the second embodiment, SNR degradation due to the dark current can be reduced in the voltage signal Vsig4.

Also, like the first embodiment, the vertical driving circuit 210 changes the source bias pulse SB to the low level during the exposure period. With this arrangement, the electric field associated with the low-sensitivity-side transfer transistor 322 and the charge storage unit 333 (MC) where charge is stored during the exposure period can be decreased, and the dark current produced thereby can be reduced.

Also, because the voltage signals Vsig3 and Vsig4 are both signals obtained at the lowest conversion efficiency, and because driving timings that output both signals consecutively are used, the reference signal (P phase) at the timing T7 can be used in common for the voltage signals Vsig3 and Vsig4. With this arrangement, the number of cycles of AD conversion can be decreased by 1 compared to the first embodiment, and the speed of operation can be increased.

Also, like the first embodiment, at the timing T13 of transferring charge from the high-sensitivity photodiode 311 to the charge storage unit 331 (FD), the vertical driving circuit 210 sets the voltage of the reset gate pulse RG to an even lower voltage than immediately before. With this arrangement, it is possible to gain storage capacitance in the charge storage unit 331 (FD), and increase the maximum signal level of the voltage signal Vsig2 with favorable SNR of the signal.

Also, like the first embodiment, immediately before the timing T5 of reading out the voltage signal Vsig4, the vertical driving circuit 210 sets the voltage of the readout pulse TG2 to a level slightly higher for the duration of the pulse period. With this arrangement, it is possible to suppress noise due to signal charge leaking from the low-sensitivity photodiode 312 to the charge storage unit 333 (MC).

Note that in the second embodiment, the four voltage signals Vsig1 to Vsig4 are successively read out for each pixel similarly to the first embodiment, but like the modification of the first embodiment, two ADCs may also be disposed for each column to read out two rows at the same time. With this arrangement, the number of cycles per row can be reduced from 7 cycles to 4.5 cycles.

In this way, in the second embodiment of the present technology, because the conversion efficiency control transistors 326 and 327 are connected in series between the charge storage units 331 and 333, it is not necessary to store charge in the drain diffusion region between the conversion efficiency control transistors 326 and 327. With this arrangement, the drain diffusion region can be narrowed and the photodiode area can be expanded correspondingly compared to the first embodiment that uses the drain diffusion region as a charge storage unit.

3. Application Example to Mobile Object

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 38:
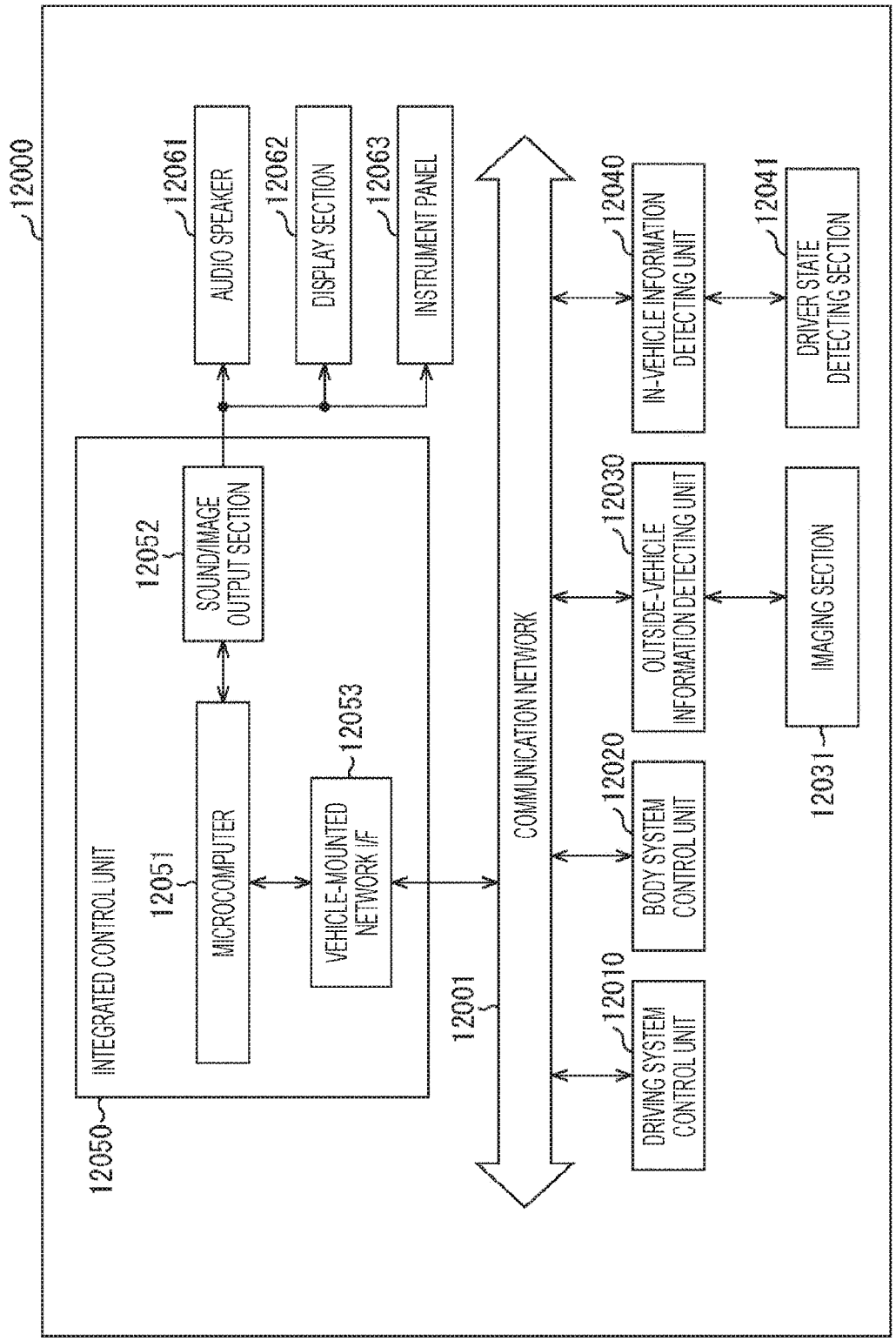
FIG. 38 is a block diagram illustrating a schematic configuration example of a vehicle control system.

FIG. 38 is a block diagram illustrating a schematic configuration example of a vehicle control system which is an example of a mobile object control system to which a technology according to an embodiment of the present disclosure is applicable.

The vehicle control system 12000 includes a plurality of electronic control units connected to each other via a communication network 12001. In the example depicted in FIG. 38, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electrical signal corresponding to a received light amount of the light. The imaging section 12031 can output the electrical signal as an image, or can output the electrical signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing or not.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 38, an audio speaker 12061, a display section 12062, and an instrument panel 12063 are exemplified as the output device. The display section 12062 may, for example, include at least one of an on-board display or a head-up display.

Figure 39:
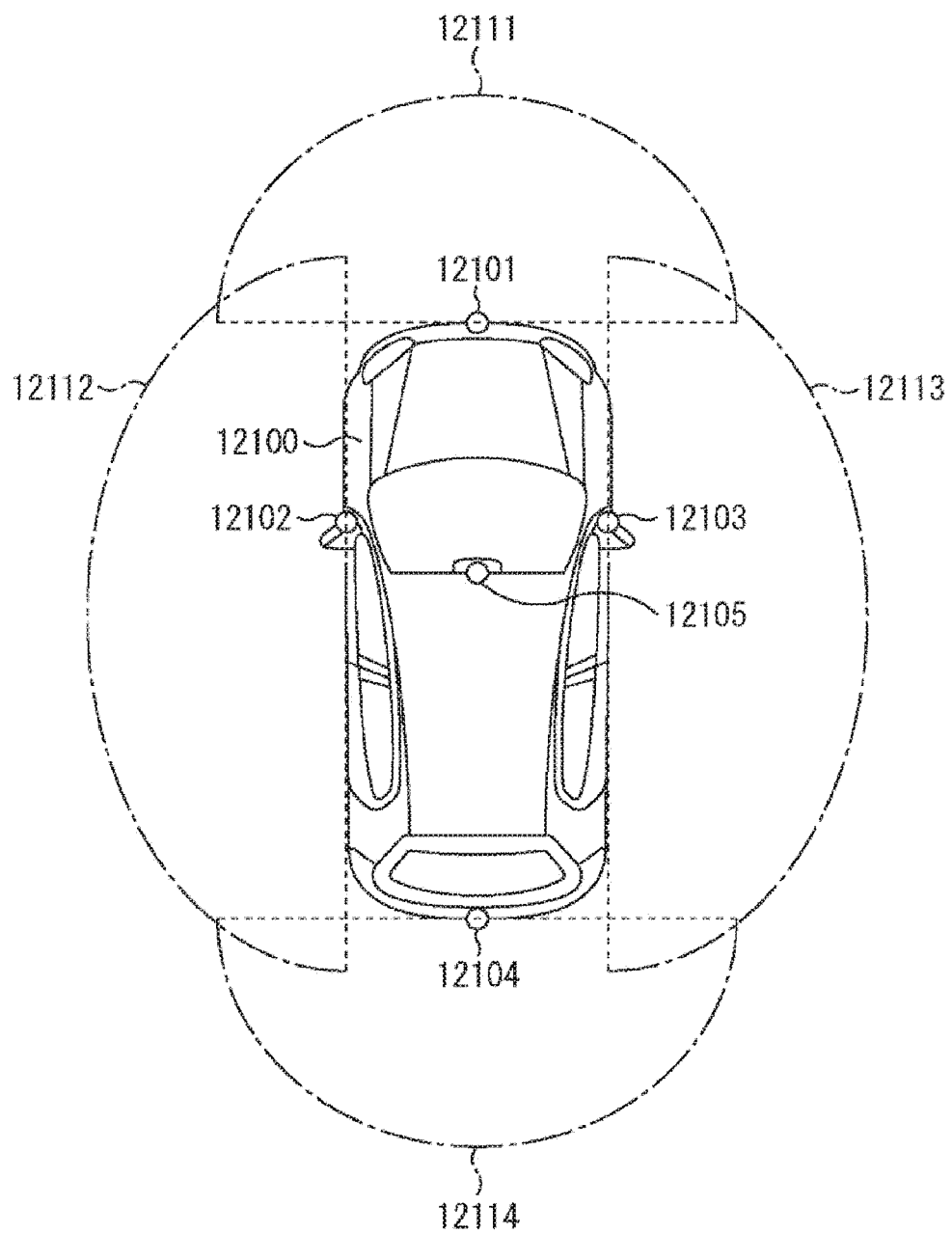
FIG. 39 is a diagram illustrating an example of an installation position of the imaging section.

FIG. 39 is a diagram illustrating an example of an installation position of the imaging section 12031.

In FIG. 39, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, side view mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the side view mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Additionally, FIG. 39 illustrates an example of the imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole, etc. on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. Further, the sound/image output section 12052 may also control the display section 12062 so that an icon or the like representing the pedestrian is displayed at a desired position.

In the above, an example of the vehicle control system to which the technology related to the present technology can be applied is described. The technology according to the present disclosure can be applied to the imaging section 12031 within the above-described configuration. Specifically, the imaging device 100 in FIG. 1 can be applied to the imaging section 12031. By applying the technology according to the present disclosure to the imaging section 12031, a dark current can be suppressed and an easily-viewable captured image can be obtained. Fatigue in a driver can be thereby reduced.

Note that, the embodiments described above each describe an example for embodying the present technology, and matters in the embodiments and matters specifying the invention in the claims have correspondence relationships. Similarly, the matters specifying the invention in the claims and the matters in the embodiments of the present technology denoted by the same names have correspondence relationships. However, the present technology is not limited to the embodiments, and can be embodied by subjecting the embodiments to various modifications without departing from the gist thereof.

Note that, the advantageous effects described in the specification are merely examples, and the advantageous effects of the present technology are not limited to them and may include other effects.

Note that, the present technology can also be configured as described below.

(1) A solid-state imaging element including:

a high-sensitivity-side transfer transistor configured to transfer a charge from a high-sensitivity photodiode having a sensitivity higher than a predetermined sensitivity to a first charge storage unit;

a low-sensitivity-side transfer transistor configured to transfer a charge from a low-sensitivity photodiode having a sensitivity lower than the predetermined sensitivity to a second charge storage unit;

an amplification transistor configured to amplify a voltage of the first charge storage unit;

a first conversion efficiency control transistor configured to control a conversion efficiency of converting the charge to the voltage by opening and closing a pathway between the first and second charge storage units; and a second conversion efficiency control transistor configured to control the conversion efficiency by opening and closing a pathway between the second charge storage unit and a third charge storage unit.

(2) The solid-state imaging element according to (1), further including:
a select transistor configured to output a signal of the amplified voltage; and
a driving circuit configured to drive each of the high-sensitivity-side transfer transistor, the low-sensitivity-side transfer transistor, the first and second conversion efficiency control transistors, and the select transistor.

(3) The solid-state imaging element according to (2), in which the driving circuit causes the high-sensitivity-side transfer transistor to transfer the charge inside a period in which both the first and second conversion efficiency control transistors are switched off and also causes the select transistor to output a signal of the voltage as a first voltage signal.

(4) The solid-state imaging element according to (2) or (3), in which the driving circuit causes the high-sensitivity-side transfer transistor to transfer the charge inside a period in which the first conversion efficiency control transistor is switched on and the second conversion efficiency control transistor is switched off and also causes the select transistor to output a signal of the voltage as a second voltage signal.

(5) The solid-state imaging element according to any one of (2) to (4), in which the driving circuit causes the low-sensitivity-side transfer transistor to transfer the charge inside a period in which the first conversion efficiency control transistor is switched on and the second conversion efficiency control transistor is switched off and also causes the select transistor to output a signal of the voltage as a third voltage signal.

(6) The solid-state imaging element according to (5), in which the driving circuit causes the select transistor to output a signal of the voltage according to a charge overflowing from the high-sensitivity photodiode inside a period in which both the first and second conversion efficiency control transistors are switched on as a fourth voltage signal.

(7) The solid-state imaging element according to (6), in which
the driving circuit causes the fourth voltage signal to be output before causing the third voltage signal to be output.

(8) The solid-state imaging element according to (6) or (7), in which
the driving circuit supplies, to the low-sensitivity-side transfer transistor, a readout pulse of middle potential between a predetermined potential and a high potential higher than the predetermined potential before causing the third and fourth voltage signals to be output.

(9) The solid-state imaging element according to any one of (6) to (8), further including: a signal amount correction processing unit configured to execute a process of combining the third voltage signal and the fourth voltage signal as a signal amount correction process.

(10) The solid-state imaging element according to (9), further including:
a determination unit configured to determine whether or not an amount of light is less than a predetermined value on the basis of the first, second, and third voltage signals;
an arithmetic mean processing unit configured to compute an arithmetic mean value of each of the fourth voltage signals output when the amount of light is less than the predetermined value; and
a dark current correction processing unit configured to subtract a dark current according to the arithmetic mean value from the fourth voltage signal, and supply the subtracted result to the signal amount correction processing unit.

(11) The solid-state imaging element according to any one of (1) to (10), in which
the third charge storage unit is a capacitance of a metal-oxide-semiconductor (MOS) transistor having a gate connected to the second conversion efficiency control transistor and a source into which a predetermined source bias pulse is input, and
the driving circuit supplies the source bias pulse higher than a predetermined potential outside a predetermined exposure period, and supplies the source bias pulse lower than the predetermined potential outside the predetermined exposure period.

(12) The solid-state imaging element according to (11), in which
the gate of the MOS transistor is embedded in a first trench formed in a predetermined substrate.

(13) The solid-state imaging element according to (12), in which
in the predetermined substrate, the MOS transistor and at least one of the high-sensitivity photodiode or the low-sensitivity photodiode are isolated from each other by a second trench.

(14) The solid-state imaging element according to any one of (1) to (13), in which
the high-sensitivity-side transfer transistor, the low-sensitivity-side transfer transistor, and the first and second conversion efficiency control transistors are each respectively disposed in each of a plurality of pixel circuits arrayed in a two-dimensional matrix, and
one of a pair of pixel circuits adjacent in a predetermined direction among the plurality of pixel circuits is connected to a first signal line, while the other of the pair is connected to a second signal line.

(15) The solid-state imaging element according to (14), further including:
a first analog-to-digital converter configured to convert a first analog signal to a digital signal;
a second analog-to-digital converter configured to convert a second analog signal to a digital signal;
a first switch configured to treat a signal from one of the first and second signal lines as the first analog signal and output the first analog signal to the first analog-to-digital converter; and
a second switch configured to treat a signal from the other of the first and second signal lines as the second analog signal and output the second analog signal to the second analog-to-digital converter.

(16) An imaging device including:
a high-sensitivity-side transfer transistor configured to transfer a charge from a high-sensitivity photodiode having a sensitivity higher than a predetermined sensitivity to a first charge storage unit;
a low-sensitivity-side transfer transistor configured to transfer a charge from a low-sensitivity photodiode having a sensitivity lower than the predetermined sensitivity to a second charge storage unit;
an amplification transistor configured to amplify a voltage of the first charge storage unit;
a first conversion efficiency control transistor configured to control a conversion efficiency of converting the charge to the voltage by opening and closing a pathway between the first and second charge storage units;
a second conversion efficiency control transistor configured to control the conversion efficiency by opening and closing a pathway between the second charge storage unit and a third charge storage unit; and a signal processing unit configured to perform predetermined signal processing on a signal of the amplified voltage.

(17) A solid-state imaging element including:

a high-sensitivity-side transfer transistor that transfers a charge from a high-sensitivity photodiode having a sensitivity higher than a predetermined sensitivity to a first charge storage unit, a low-sensitivity-side transfer transistor that transfers a charge from a low-sensitivity photodiode having a sensitivity lower than the predetermined sensitivity to a second charge storage unit, an amplification transistor that amplifies the voltage of the first charge storage unit, and first and second conversion efficiency control transistors connected in series between the first charge storage unit and the second charge storage unit.

(18) The solid-state imaging element according to (17), further including:

a select transistor configured to output a signal of the amplified voltage; and a driving circuit configured to drive each of the high-sensitivity-side transfer transistor, the low-sensitivity-side transfer transistor, the first and second conversion efficiency control transistors, and the select transistor.

(19) The solid-state imaging element according to (18), in which the driving circuit causes the high-sensitivity-side transfer transistor to transfer the charge inside a period in which both the first and second conversion efficiency control transistors are switched off and also causes the select transistor to output a signal of the voltage as a first voltage signal.

(20) The solid-state imaging element according to (18) or (19), in which the driving circuit causes the high-sensitivity-side transfer transistor to transfer the charge inside a period in which the first conversion efficiency control transistor is switched on and the second conversion efficiency control transistor is switched off and also causes the select transistor to output a signal of the voltage as a second voltage signal.

(21) The solid-state imaging element according to any one of (18) to (20), in which the driving circuit causes the low-sensitivity-side transfer transistor to transfer the charge inside a period in which the first conversion efficiency control transistor is switched on and the second conversion efficiency control transistor is switched off and also causes the select transistor to output a signal of the voltage as a third voltage signal.

(22) The solid-state imaging element according to (21), in which the driving circuit causes the select transistor to output a signal of the voltage according to a charge overflowing from the high-sensitivity photodiode inside a period in which both the first and second conversion efficiency control transistors are switched on as a fourth voltage signal.

(23) The solid-state imaging element according to claim (22), in which the driving circuit causes the fourth voltage signal to be output before causing the third voltage signal to be output.

(24) The solid-state imaging element according to (22) or (23), in which the driving circuit supplies, to the low-sensitivity-side transfer transistor, a readout pulse of middle potential between a predetermined potential and a high potential higher than the predetermined potential before causing the third and fourth voltage signals to be output.

(25) The solid-state imaging element according to any one of (22) to (24), further including: a signal amount correction processing unit configured to execute a process of combining the third voltage signal and the fourth voltage signal as a signal amount correction process.

(26) The solid-state imaging element according to (25), further including:

a determination unit configured to determine whether or not an amount of light is less than a predetermined value on the basis of the first, second, and third voltage signals;

an arithmetic mean processing unit configured to compute an arithmetic mean value of each of the fourth voltage signals output when the amount of light is less than the predetermined value; and a dark current correction processing unit configured to subtract a dark current according to the arithmetic mean value from the fourth voltage signal, and supply the subtracted result to the signal amount correction processing unit.

(27) The solid-state imaging element according to any one of (17) to (26), in which the gate of the first conversion efficiency control transistor is formed in proximity to the gate of the second conversion efficiency control transistor, without a drain diffusion region interposed in between.

(28) The solid-state imaging element according to any one of (17) to (27), in which the third charge storage unit is a capacitance of a metal-oxide-semiconductor (MOS) transistor having a gate connected to the second charge storage unit and a source into which a predetermined source bias pulse is input, and the driving circuit supplies the source bias pulse higher than a predetermined potential outside a predetermined exposure period, and supplies the source bias pulse lower than the predetermined potential outside the predetermined exposure period.

(29) The solid-state imaging element according to (28), in which the gate of the MOS transistor is embedded in a first trench formed in a predetermined substrate.

(30) The solid-state imaging element according to (29), in which in the predetermined substrate, the MOS transistor and at least one of the high-sensitivity photodiode or the low-sensitivity photodiode are isolated from each other by a second trench.

(31) The solid-state imaging element according to any one of (17) to (29), in which the high-sensitivity-side transfer transistor, the low-sensitivity-side transfer transistor, and the first and second conversion efficiency control transistors are each respectively disposed in each of a plurality of pixel circuits arrayed in a two-dimensional matrix, and one of a pair of pixel circuits adjacent in a predetermined direction among the plurality of pixel circuits is connected to a first signal line, while the other of the pair is connected to a second signal line.

(32) The solid-state imaging element according to (31), further including:

a first analog-to-digital converter configured to convert a first analog signal to a digital signal;

a second analog-to-digital converter configured to convert a second analog signal to a digital signal;

a first switch configured to treat a signal from one of the first and second signal lines as the first analog signal and output the first analog signal to the first analog-to-digital converter; and a second switch configured to treat a signal from the other of the first and second signal lines as the second analog signal and output the second analog signal to the second analog-to-digital converter.

(33) An imaging device
including:
a high-sensitivity-side transfer transistor that transfers a charge from a high-sensitivity photodiode having a sensitivity higher than a predetermined sensitivity to a first charge storage unit,
a low-sensitivity-side transfer transistor that transfers a charge from a low-sensitivity photodiode having a sensitivity lower than the predetermined sensitivity to a second charge storage unit,
an amplification transistor that amplifies the voltage of the first charge storage unit, first and second conversion efficiency control transistors connected in series between the first charge storage unit and the second charge storage unit, and
a signal processing unit that performs predetermined signal processing on a signal of the amplified voltage.

REFERENCE SIGNS LIST

100 Imaging device
110 Camera lens
120 Correction processing unit
121 Signal amount determination unit
122 Arithmetic mean processing unit
123 Frame buffer
124 Dark current correction processing unit
125 Signal amount correction processing unit
130 Camera signal processing unit
200 Solid-state imaging element
210 Vertical driving circuit
220 Control circuit
230 Column signal processing circuit
231, 232 ADC
233 CDS processing unit
234, 235 Switch
240 Horizontal driving circuit
250 Output unit
300 Pixel array unit
310 Pixel circuit
311 High-sensitivity photodiode
312 Low-sensitivity photodiode
321 High-sensitivity-side transfer transistor
322 Low-sensitivity-side transfer transistor
323 Amplification transistor
324 Select transistor
325 Reset transistor
326, 327 Conversion efficiency control transistor
331, 332, 333 Charge storage unit
411 Trench gate
412, 417 N region
413, 418, 431, 433, 435N+diffusion region
414 P region
415 Trench
416, 432, 434 Gate
420, 421 Contact
12031 Imaging section

The invention claimed is:
1. A solid-state imaging element, comprising:
a high-sensitivity photodiode that has a first sensitivity higher than a specific sensitivity;
a first charge storage unit;
a high-sensitivity-side transfer transistor configured to transfer a first charge from the high-sensitivity photodiode to the first charge storage unit;
a low-sensitivity photodiode that has a second sensitivity lower than the specific sensitivity;
a second charge storage unit;
a low-sensitivity-side transfer transistor configured to transfer a second charge from the low-sensitivity photodiode to the second charge storage unit;
an amplification transistor configured to amplify a voltage of the first charge storage unit;
a first conversion efficiency control transistor configured to open and close a first pathway between the first charge storage unit and the second charge storage unit to control a conversion efficiency of the solid-state imaging element,
wherein the conversion efficiency corresponds to conversion of at least one the first charge or the second charge to the voltage;
a third charge storage unit;
a second conversion efficiency control transistor configured to open and close a second pathway between the second charge storage unit and the third charge storage unit to control the conversion efficiency;
a select transistor; and
a driving circuit configured to:
drive each of the high-sensitivity-side transfer transistor, the low-sensitivity-side transfer transistor, the first conversion efficiency control transistor, the second conversion efficiency control transistor, and the select transistor;
control the high-sensitivity-side transfer transistor to transfer the first charge in a first period in which the first conversion efficiency control transistor is switched on and the second conversion efficiency control transistor is switched off; and
control, based on the transfer of the first charge in the first period, the select transistor to output a first signal of the amplified voltage as a first voltage signal.

2. The solid-state imaging element according to claim 1, wherein the driving circuit is further configured to:
control the high-sensitivity-side transfer transistor to transfer the first charge in a second period in which both the first conversion efficiency control transistor and the second conversion efficiency control transistor is switched off; and
control, based on the transfer of the first charge in the second period, the select transistor to output a second signal of the amplified voltage as a second voltage signal.

3. The solid-state imaging element according to claim 2, wherein the driving circuit is further configured to:
control the low-sensitivity-side transfer transistor to transfer the second charge in a third period in which the first conversion efficiency control transistor is switched on and the second conversion efficiency control transistor is switched off; and
control, based on the transfer of the second charge in the third period, the select transistor to output a third signal of the amplified voltage as a third voltage signal.

4. The solid-state imaging element according to claim 3, wherein
the driving circuit is further configured to control the select transistor to output a fourth signal of the amplified voltage as a fourth voltage signal, the output of the fourth voltage signal is based on a third charge that overflows from the low-sensitivity photodiode, and the select transistor is controlled to output the fourth voltage signal in a fourth period in which both the first conversion efficiency control transistor and the second conversion efficiency control transistor are switched on.

5. The solid-state imaging element according to claim 4, wherein the driving circuit is further configured to control the select transistor to output the fourth voltage signal before the output of the third voltage signal.

6. The solid-state imaging element according to claim 4, wherein the driving circuit is further configured to supply, to the low-sensitivity-side transfer transistor, a readout pulse of a middle potential, the middle potential is between a determined potential and a high potential;

the high potential is higher than the determined potential, and the readout pulse of the middle potential is supplied before the output of each of the third voltage signal and the fourth voltage signal.

7. The solid-state imaging element according to claim 4, further comprising a correction processing circuit configured to execute a signal amount correction process to combine the third voltage signal and the fourth voltage signal.

8. The solid-state imaging element according to claim 7, wherein the correction processing circuit is further configured to:

determine whether an amount of light is less than a specific value based on the first voltage signal, the second voltage signal, and the third voltage signal;

compute an arithmetic mean value of a plurality of fourth voltage signals including the fourth voltage signal, wherein the plurality of fourth voltage signals is output in a case where the amount of light is less than the specific value;

determine a dark current value based on the computed arithmetic mean value;

subtract the dark current value from the fourth voltage signal to obtain a subtracted result; and output the subtracted result.

9. The solid-state imaging element according to claim 1, wherein the third charge storage unit is a capacitance of a metal-oxide-semiconductor (MOS) transistor, wherein the MOS transistor includes:

a gate connected to the second conversion efficiency control transistor; and a source configured to receive source bias pulse, and the driving circuit is further configured to:

supply, to the source of the MOS transistor, a first source bias pulse higher than a determined potential outside a determined exposure period; and supply, to the source of the MOS transistor, a second source bias pulse lower than the determined potential inside the determined exposure period.

10. The solid-state imaging element according to claim 9, further comprising a substrate that includes a first trench, wherein the gate of the MOS transistor is in the first trench of the substrate.

11. The solid-state imaging element according to claim 10, wherein the substrate further includes a second trench, the MOS transistor, or at least one of the high-sensitivity photodiode or the low-sensitivity photodiode, and the MOS transistor is isolated from the at least one of the high-sensitivity photodiode or the low-sensitivity photodiode by the second trench.

12. The solid-state imaging element according to claim 1, further comprising a plurality of pixel circuits in a two-dimensional matrix, wherein each pixel circuit of the plurality of pixel circuits includes the high-sensitivity-side transfer transistor, the low-sensitivity-side transfer transistor, the first conversion efficiency control transistor, and the second conversion efficiency control transistor, and the plurality of pixel circuits includes a first pair of adjacent pixel circuits and a second pair of adjacent pixel circuits, the first pair of adjacent pixel circuits is connected to a first signal line, and the second pair of adjacent pixel circuits is connected to a second signal line.

13. The solid-state imaging element according to claim 12, further comprising:

a first analog-to-digital converter;

a second analog-to-digital converter;

a first switch configured to:

receive a first analog signal from one of the first signal line or the second signal line; and output the first analog signal to the first analog-to-digital converter, wherein the first analog-to-digital converter is configured to convert the first analog signal, output from the first switch, to a first digital signal; and a second switch configured to:

receive a second analog signal from other of the one of the first signal line or the second signal line; and output the second analog signal to the second analog-to-digital converter; wherein the second analog-to-digital converter configured to convert the second analog signal to a second digital signal.

14. An imaging device, comprising:

a high-sensitivity photodiode that has a first sensitivity higher than a specific sensitivity;

a first charge storage unit;

a high-sensitivity-side transfer transistor configured to transfer a first charge from the high-sensitivity photodiode to the first charge storage unit;

a low-sensitivity photodiode that has a second sensitivity lower than the specific sensitivity;

a second charge storage unit;

a low-sensitivity-side transfer transistor configured to transfer a second charge from the low-sensitivity photodiode to the second charge storage unit;

an amplification transistor configured to amplify a voltage of the first charge storage unit;

a first conversion efficiency control transistor configured to open and close a first pathway between the first charge storage unit and the second charge storage unit to control a conversion efficiency of the imaging device, wherein the conversion efficiency corresponds to conversion of at least one the first charge or the second charge to the voltage;

a third charge storage unit;

a second conversion efficiency control transistor configured to open and close a second pathway between the second charge storage unit and the third charge storage unit to control the conversion efficiency;
a select transistor;
a driving circuit configured to:
  drive each of the high-sensitivity-side transfer transistor, the low-sensitivity-side transfer transistor, the first conversion efficiency control transistor, the second conversion efficiency control transistor, and the select transistor;
  control the high-sensitivity-side transfer transistor to transfer the first charge in a first period in which the first conversion efficiency control transistor is switched on and the second conversion efficiency control transistor is switched off; and
  control, based on the transfer the first charge in the first period, the select transistor to output a signal of the amplified voltage as a voltage signal; and
a signal processing unit configured to execute a signal process on the voltage signal.

15. A solid-state imaging element, comprising:
a high-sensitivity photodiode that has a first sensitivity higher than a specific sensitivity;
a first charge storage unit;
a high-sensitivity-side transfer transistor configured to transfer a first charge from the high-sensitivity photodiode to the first charge storage unit;
a low-sensitivity photodiode that has a second sensitivity lower than the specific sensitivity;
a second charge storage unit;
a low-sensitivity-side transfer transistor configured to transfer a second charge from the low-sensitivity photodiode to the second charge storage unit;
an amplification transistor configured to amplify a voltage of the first charge storage unit;
a first conversion efficiency control transistor configured to open and close a first pathway between the first charge storage unit and the second charge storage unit to control a conversion efficiency of the solid-state imaging element,
  wherein the conversion efficiency corresponds to conversion of at least one the first charge or the second charge to the voltage;
a third charge storage unit;
a second conversion efficiency control transistor configured to open and close a second pathway between the second charge storage unit and the third charge storage unit to control the conversion efficiency;
a select transistor; and
a driving circuit configured to:
  drive each of the high-sensitivity-side transfer transistor, the low-sensitivity-side transfer transistor, the first conversion efficiency control transistor, the second conversion efficiency control transistor, and the select transistor;
  control the low-sensitivity-side transfer transistor to transfer the second charge in a first period in which the first conversion efficiency control transistor is switched on and the second conversion efficiency control transistor is switched off; and
  control the select transistor to:
    output a first signal of the amplified voltage as a first voltage signal based on the transfer of the second charge in the first period; and
    output a second signal of the amplified voltage as a second voltage signal, based on a third charge that overflows from the low-sensitivity photodiode, wherein
      the second voltage signal is output in a second period in which both the first conversion efficiency control transistor and the second conversion efficiency control transistor are switched on.

* * * * *